(12) United States Patent
Choo et al.

(10) Patent No.: US 10,475,817 B2
(45) Date of Patent: Nov. 12, 2019

(54) TFT ARRAY SUBSTRATE, DISPLAY DEVICE INCLUDING THE SAME, AND METHOD OF MANUFACTURING THE SAME

(71) Applicant: SAMSUNG DISPLAY CO., LTD., Yongin-si, Gyeonggi-Do (KR)

(72) Inventors: Byoung Kwon Choo, Hwaseong-si (KR); Joon Hwa Bae, Suwon-si (KR); Hyun Jin Cho, Seoul (KR); Jun Hyuk Cheon, Seoul (KR); Zi Yeon Yoon, Hwaseong-si (KR); Woo Jin Cho, Yongin-si (KR); Sung Hwan Choi, Seoul (KR); Jeong Hye Choi, Hwaseong-si (KR)

(73) Assignee: SAMSUNG DISPLAY CO., LTD., Yongin-si, Gyeonggi-Do (KR)

(*) Notice: Subject to any disclaimer, the term of this patent is extended or adjusted under 35 U.S.C. 154(b) by 0 days.

(21) Appl. No.: 15/971,435

(22) Filed: May 4, 2018

(65) Prior Publication Data

US 2018/0358386 A1 Dec. 13, 2018

(30) Foreign Application Priority Data

Jun. 13, 2017 (KR) .................. 10-2017-0073904

(51) Int. Cl.
*H01L 21/00* (2006.01)
*H01L 27/00* (2006.01)
(Continued)

(52) U.S. Cl.
CPC ........ *H01L 27/1222* (2013.01); *G02F 1/1368* (2013.01); *G02F 1/136213* (2013.01);
(Continued)

(58) Field of Classification Search
CPC ... H01L 21/3212; H01L 21/324; H01L 21/77; H01L 21/768; H01L 27/1222;
(Continued)

(56) References Cited

U.S. PATENT DOCUMENTS 5,563,082 A 10/1996 Mukai
9,012,913 B2 * 4/2015 Noda ................ H01L 29/78693
257/347

(Continued)

FOREIGN PATENT DOCUMENTS

KR 1019980080588 11/1998
KR 102002001645 1/2002
(Continued)

OTHER PUBLICATIONS

Huaxiang Yin, et al., "Advanced Poly-Si TFT With Fin-Like Channels by Ela", IEEE Electron Device Letters, vol. 27, No. 5, May 2006, pp. 357-359.

(Continued)

*Primary Examiner* — Nikolay K Yushin
(74) *Attorney, Agent, or Firm* — F. Chau & Associates, LLC

(57) ABSTRACT

A thin-film transistor (TFT) array substrate is provided. The TFT array substrate includes a base substrate, a semiconductor layer disposed on the base substrate, an insulating layer disposed on the semiconductor layer, and a gate electrode disposed on the insulating layer. A top surface of a portion of the insulating layer overlapping the semiconductor layer in a plan view of the base substrate and a top surface of the gate electrode are placed on the same level.

23 Claims, 58 Drawing Sheets

(51) Int. Cl.
  *H01L 29/00* (2006.01)
  *G02F 1/1368* (2006.01)
  *H01L 27/12* (2006.01)
  *H01L 21/321* (2006.01)
  *G02F 1/1362* (2006.01)
  *H01L 27/32* (2006.01)
  *H01L 29/66* (2006.01)
  *H01L 29/78* (2006.01)

(52) U.S. Cl.
  CPC .... *G02F 1/136286* (2013.01); *H01L 21/3212* (2013.01); *H01L 27/124* (2013.01); *H01L 27/1214* (2013.01); *H01L 27/1259* (2013.01); *H01L 27/3262* (2013.01); *H01L 29/66795* (2013.01); *H01L 29/7855* (2013.01)

(58) Field of Classification Search
  CPC .............. H01L 27/124; H01L 27/1259; H01L 27/1214; H01L 27/3262; H01L 29/66795; H01L 29/7855; H01L 29/41733; H01L 29/4908; G02F 1/1368; G02F 1/136213; G02F 1/136286
  See application file for complete search history.

(56) References Cited

U.S. PATENT DOCUMENTS

| | | | |
|---|---|---|---|
| 10,192,995 B2* | 1/2019 | Tezuka | .............. H01L 29/7869 |
| 2006/0211181 A1 | 9/2006 | Chung | |
| 2008/0182392 A1 | 7/2008 | Yeh et al. | |
| 2009/0108316 A1 | 4/2009 | Xiong et al. | |
| 2013/0175530 A1 | 7/2013 | Noda et al. | |
| 2016/0322503 A1* | 11/2016 | Tezuka | .............. H01L 27/1255 |

FOREIGN PATENT DOCUMENTS

| | | |
|---|---|---|
| KR | 1020030078646 | 10/2003 |
| KR | 1020080000253 | 1/2008 |
| KR | 1020140108026 | 9/2014 |
| KR | 1020160062831 | 6/2016 |
| WO | 2016174546 | 11/2016 |

OTHER PUBLICATIONS

European Search Report dated Oct. 26, 2018 in corresponding European Patent Application No. 18177139.5 ((8 pages).

* cited by examiner

TFT ARRAY SUBSTRATE, DISPLAY DEVICE INCLUDING THE SAME, AND METHOD OF MANUFACTURING THE SAME

CROSS-REFERENCE TO RELATED APPLICATION

This application claims priority under 35 U.S.C. § 119 to Korean Patent Application No. 10-2017-0073904 filed on Jun. 13, 2017 in the Korean Intellectual Property Office, the disclosure of which is incorporated by reference herein in its entirety.

TECHNICAL FIELD

The present disclosure relates to a thin-film transistor (TFT) array substrate, a display device including the same, and a method of manufacturing the same.

DISCUSSION OF RELATED ART

A display device such as a liquid crystal display (LCD) device or an organic light-emitting diode (OLED) display device may include fine patterns of thin-film transistors (TFTs), capacitors, and various wirings fabricated on a substrate, and the display device may operate in accordance with the connections between the TFTs, the capacitors, and the wirings.

In recent years, the increased demand for a high-resolution display device has led to an increased demand for an efficient spatial arrangement and connection structure for the above described TFTs, capacitors, and wirings. Therefore, to realize the high-resolution display device, it is necessary to reduce the sizes and/or increase the numbers of TFTs, capacitors, and wirings included in the display device.

For an LCD display device, the LCD device may include a pixel electrode, a common electrode arranged to face the pixel electrode, a liquid crystal layer including a plurality of liquid crystal molecules interposed between the pixel electrode and the common electrode, and a backlight unit providing light to the liquid crystal layer. The LCD device may display an image by changing the alignment of the liquid crystal molecules of the liquid crystal layer with an electric field generated between the pixel electrode and the common electrode, and thus controlling the transmissivity of light provided by the backlight unit with the changed alignment of the liquid crystal molecules.

For an OLED display device, the OLED device may include an organic light-emitting element, which includes a hole injection electrode, an electron injection electrode, and an organic light-emitting layer formed between the hole injection electrode and the electron injection electrode. Holes injected from the hole injection electrode and electrons injected from the electron injection electrode are combined together in the organic light-emitting layer, thereby generating excitons. In response to the excitons falling from an excited state to a ground state, light is generated, and as a result, an image is displayed.

There is a limit in forming TFTs, capacitors, and wirings on a plane through patterning using exposure equipment. The closer to the resolution limit of the exposure equipment, which is the maximum resolution at which the exposure equipment can form patterns, the more difficult it is to uniformly form patterns of TFTs, capacitors, and wirings. In particular, as the TFTs of a display device become smaller, the width of channels formed in the respective TFTs become more irregular, i.e., the variation of the channel widths increases. As a result, electrical characteristics may undesirably differ from one TFT to another TFT. Thus, there is a limit in minimizing the size of TFTs.

SUMMARY

Exemplary embodiments of the present disclosure provide a thin-film transistor (TFT) array substrate with an enhanced distribution of channel widths.

Exemplary embodiments of the present disclosure also provide a display device including a TFT array substrate with an enhanced distribution of channel widths.

Exemplary embodiments of the present disclosure also provide a method of manufacturing a TFT array substrate with an enhanced distribution of channel widths.

According to an exemplary embodiment of the present disclosure, there is provided a TFT array substrate. The TFT array substrate includes: a base substrate; a semiconductor layer disposed on the substrate; an insulating layer disposed on the semiconductor layer; and a gate electrode disposed on the insulating layer, in which a top surface of a portion of the insulating layer overlapping the semiconductor layer in a plan view of the base substrate and a top surface of the gate electrode are placed on the same level.

According to an exemplary embodiment of the present disclosure, there is provided a display device. The display device includes a substrate and a plurality of pixels arranged in an array on the substrate and including at least one TFT, in which the TFT includes a semiconductor layer disposed on the substrate, an insulating layer disposed on the semiconductor layer, and a gate electrode disposed on the insulating layer, and a top surface of a portion of the insulating layer overlapping the semiconductor layer and a top surface of the gate electrode are placed on the same level.

According to an exemplary embodiment of the present disclosure, there is provided a method of manufacturing a TFT array substrate. The method includes: forming a semiconductor layer on a base substrate; forming an insulating layer on the semiconductor layer; forming a gate electrode on the insulating layer; and forming a source electrode and a drain electrode on the insulating layer, in which the forming of the gate electrode includes depositing a gate electrode material layer on the insulating layer, forming a gate electrode pattern layer by patterning the gate electrode material layer, and polishing the gate electrode pattern layer through chemical mechanical polishing (CMP).

According to an exemplary embodiment of the present disclosure, there is provided a TFT array substrate. The TFT array substrate includes: a base substrate; a semiconductor layer disposed on the base substrate; an insulating layer disposed on the semiconductor layer; and a gate electrode disposed on the insulating layer, in which the gate electrode and the semiconductor layer are disposed not to overlap each other in a plan view of the base substrate, and the gate electrode is disposed adjacent to the semiconductor layer and overlaps the semiconductor layer in a direction parallel to a top surface of the base substrate.

BRIEF DESCRIPTION OF THE DRAWINGS

The above and other features of the present disclosure will become more apparent by describing in detail exemplary embodiments thereof with reference to the accompanying drawings, in which.

Figure 1:
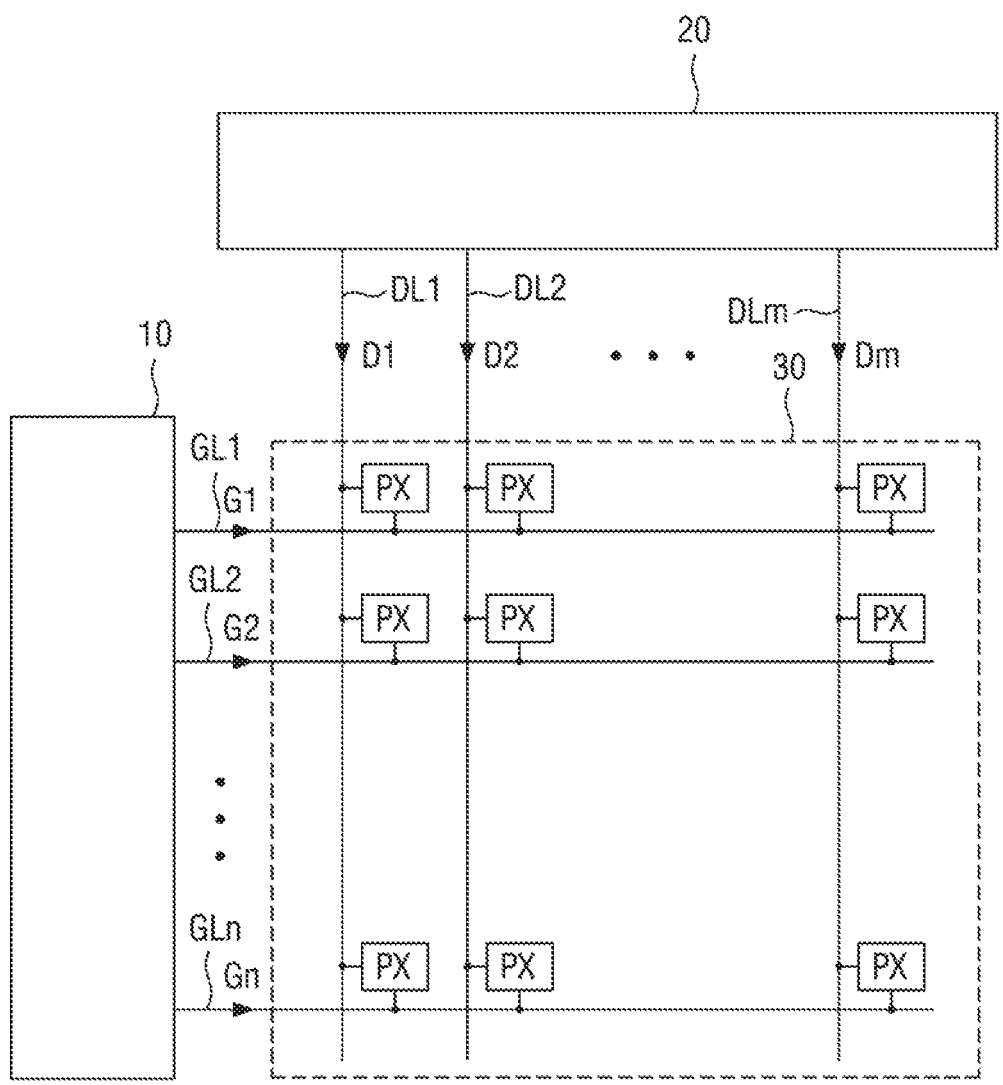
FIG. 1 is a block diagram of a display device according to an exemplary embodiment of the present disclosure.
Figure 58:
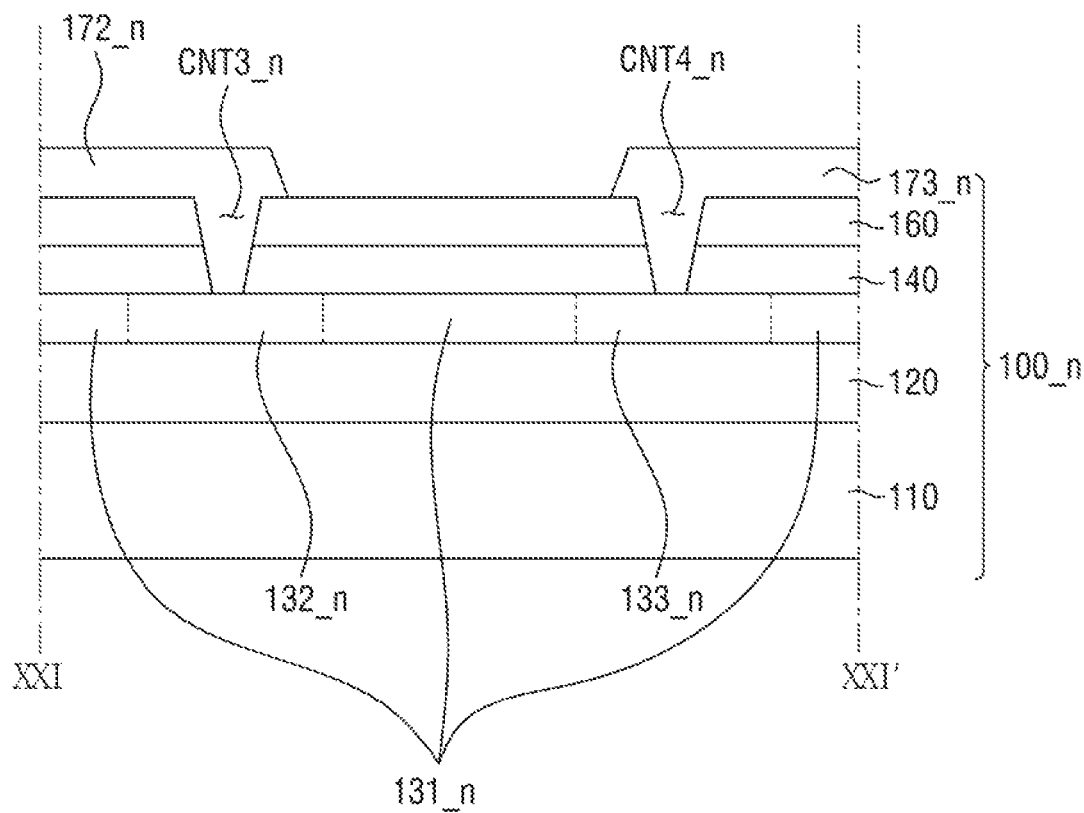
FIG. 58 is a cross-sectional view taken along line XXI-XXI' of FIG. 51.

Since the drawings in FIGS. 1-58 are intended for illustrative purposes, the elements in the drawings are not necessarily drawn to scale. For example, some of the elements may be enlarged or exaggerated for clarity purpose.

DETAILED DESCRIPTION OF THE EMBODIMENTS

The present disclosure will now be described more fully hereinafter with reference to the accompanying drawings, in which preferred embodiments of the present disclosure are shown. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. The same reference numbers indicate the same components throughout the specification.

It will be understood that, although the terms first, second, third, etc., may be used herein to describe various elements, these elements should not be limited by these terms. These terms are only used to distinguish one element from another element. Thus, a first element discussed below could be termed a second element without departing from the teachings of the present disclosure.

The terminology used herein is for the purpose of describing particular embodiments only and is not intended to be limiting. As used herein, the singular forms "a", "an" and "the" are intended to include the plural forms, including "at least one", unless the content clearly indicates otherwise. "Or" means "and/or". As used herein, the term "and/or" includes any and all combinations of one or more of the associated listed items. It will be further understood that the terms "comprises" and/or "comprising", or "includes" and/or "including" when used in this specification, specify the presence of stated features, regions, integers, steps, operations, elements, components and/or groups, but do not preclude the presence or addition of one or more other features, regions, integers, steps, operations, elements, components, and/or groups thereof.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Hereinafter, embodiments of the present disclosure will be described with reference to the accompanying drawings.

FIG. 1 is a block diagram of a display device according to an exemplary embodiment of the present disclosure.

Referring to FIG. 1, the display device includes a gate driving unit 10, a data driving unit 20, and a display unit 30.

The gate driving unit 10 receives a scan control signal from a timing control unit. The scan control signal may include a vertical start signal for controlling the operation of the gate driving unit 10 and at least one clock signal for determining the output timing of signals. The gate driving unit 10 generates gate signals G1 through Gn and sequentially outputs the gate signals G1 through Gn to gate lines GL1 to GLn, respectively.

The data driving unit 20 receives a data control signal and image data from the timing control unit. The data control signal may include a horizontal start signal for controlling the operation of the data driving unit 20, a load signal for instructing to apply data voltage to data lines D1 to Dm, and an inversion signal for inverting the polarity of the data voltage with respect to common voltage. The data driving unit 20 converts the image data into the data signals D1 through Dm and outputs the data signals D1 through Dm to data lines DL1 through DLm, respectively, which are insulated from the gate lines GL1 through GLn. The data signals D1 through Dm may be grayscale analog voltages corresponding to the gray levels of the image data.

The display unit 30 includes the gate lines GL1 through GLn, the data lines DL1 through DLm, and a plurality of pixels PX. The data lines DL1 through DLm and the gate lines GL1 through GLn may be arranged to intersect each other substantially perpendicularly. That is, the data lines DL1 through DLm are extending in a direction perpendicular to the extending direction of the gate lines GL1 through GLn. Each of the pixels PX may be connected to at least one of the gate lines GL1 through GLn and at least one of the data line DL1 through DLm, and may thus receive one of the gate signals G1 through Gn and one of the data signals D1 through Dm.

The structure of the display device according to the exemplary embodiment of FIG. 1 may vary depending on whether the display device according to the exemplary embodiment of FIG. 1 is an organic light-emitting diode (OLED) display device or a liquid crystal display (LCD) device. The structures of the pixels PX for an OLED display device and for an LCD device according to the exemplary embodiment of FIG. 1 will be hereinafter described.

Figure 2:
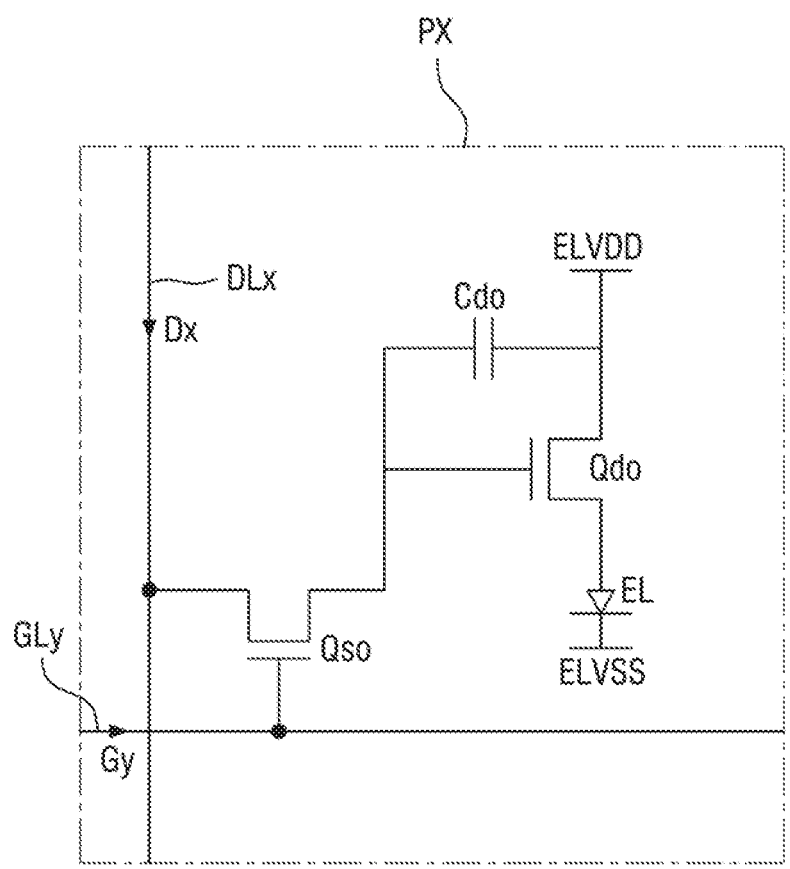
FIG. 2 is an equivalent circuit diagram of a pixel according to an exemplary embodiment of the present disclosure.

FIG. 2 is an equivalent circuit diagram of a pixel according to an exemplary embodiment of the present disclosure.

FIG. 2 shows the structure of a pixel PX of an OLED display device according to the exemplary embodiment of FIG. 1.

Referring to FIG. 2, the pixel PX of the OLED display device includes a switching transistor Qso, a driving transistor Qdo, and a driving capacitor Cdo.

The switching transistor Qso includes a control electrode connected to a gate line GLy, an input electrode connected to a data line DLx, and an output electrode. The switching transistor Qso outputs a data signal Dx applied to the data line DLx in response to a gate signal Gy applied to the gate line GLy and the control electrode of the switching transistor Qso.

The driving capacitor Cdo includes a first electrode connected to the switching transistor Qso and a second electrode receiving a first power supply voltage ELVDD. The driving capacitor Cdo is charged with a voltage corresponding to the data signal Dx received from the switching transistor Qso.

The driving transistor Qdo includes a control electrode connected to the output electrode of the switching transistor Qso and the first electrode of the driving capacitor, an input electrode receiving the first power supply voltage ELVDD, and an output electrode. The output electrode of the driving transistor Qdo is connected to an organic light-emitting element EL. The driving transistor Qdo controls a current that flows in the organic light-emitting element EL in accordance with the voltage stored therein.

The organic light-emitting element EL includes an anode electrode, a hole injection electrode, connected to the output electrode of the driving transistor Qdo and receiving the first power supply voltage ELVDD, and a cathode electrode, an electron injection electrode, receiving a second power supply voltage ELVSS. The organic light-emitting element EL further includes a light-emitting layer disposed between the anode electrode and the cathode electrode. Holes and electrons are combined in the organic light-emitting layer to generate excitons, and the excitons fall from an excited state to a ground state to emit light. The organic light-emitting element EL emits light only during a "turned-on" period of the driving transistor Qdo.

The structure of the equivalent circuit of the pixel PX is not particularly limited, and may vary. For example, the pixel PX may include a plurality of transistors for compensating the threshold voltage of the driving transistor Qdo.

Figure 3:
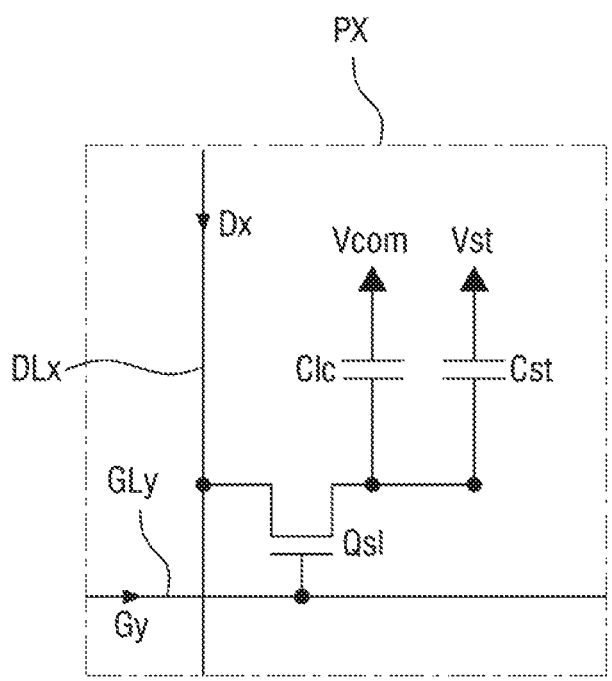
FIG. 3 is an equivalent circuit diagram of a pixel according to an exemplary embodiment of the present disclosure.

FIG. 3 is an equivalent circuit diagram of a pixel according to an exemplary embodiment of the present disclosure.

FIG. 3 shows the structure of a pixel PX of an LCD device according to the exemplary embodiment of FIG. 1.

Referring to FIG. 3, the pixel PX of the LCD device includes a switching transistor Qsl, a liquid crystal capacitor Clc, and a storage capacitor Cst.

The switching transistor Qsl includes a control electrode connected to a gate line GLy, an input electrode connected to a data line DLx, and an output electrode. The switching transistor Qsl outputs a data signal Dx applied to the data line DLx in response to a gate signal Gy applied to the gate line GLy and the control electrode of the switching transistor Qsl.

The liquid crystal capacitor Clc includes a first electrode connected to the switching transistor Qsl and a second electrode receiving a common voltage Vcom. The liquid crystal capacitor Clc is charged with a voltage corresponding to the data signal Dx received from the switching transistor Qsl. The first electrode of the liquid crystal capacitor Clc may correspond to a pixel electrode, and the second electrode of the liquid crystal capacitor Clc may correspond to a common electrode.

The storage capacitor Cst includes a first electrode connected to the switching transistor Qsl and a second electrode receiving a storage voltage Vst. The storage capacitor Cst is charged with a voltage corresponding to the data signal Dx received from the switching transistor Qsl. Ever since the switching transistor Qsl is switched from a turned-on state to a turned-off state, the storage capacitor Cst continues to maintain the voltage of the first electrode thereof until the switching transistor Qsl is switched back to the turned-on state. The first electrode of the storage capacitor Cst may correspond to the pixel electrode.

In a case where the display device according to the exemplary embodiment of FIG. 1 is an OLED display device, the OLED display device includes a display unit 30 in which a plurality of pixels PX having the structure illustrated in FIG. 2 are arranged in an array. On the other hand, in a case where the display device according to the exemplary embodiment of FIG. 1 is an LCD device, the LCD device includes a display unit 30 in which a plurality of pixels PX having the structure illustrated in FIG. 3 are arranged in an array.

Figure 4:
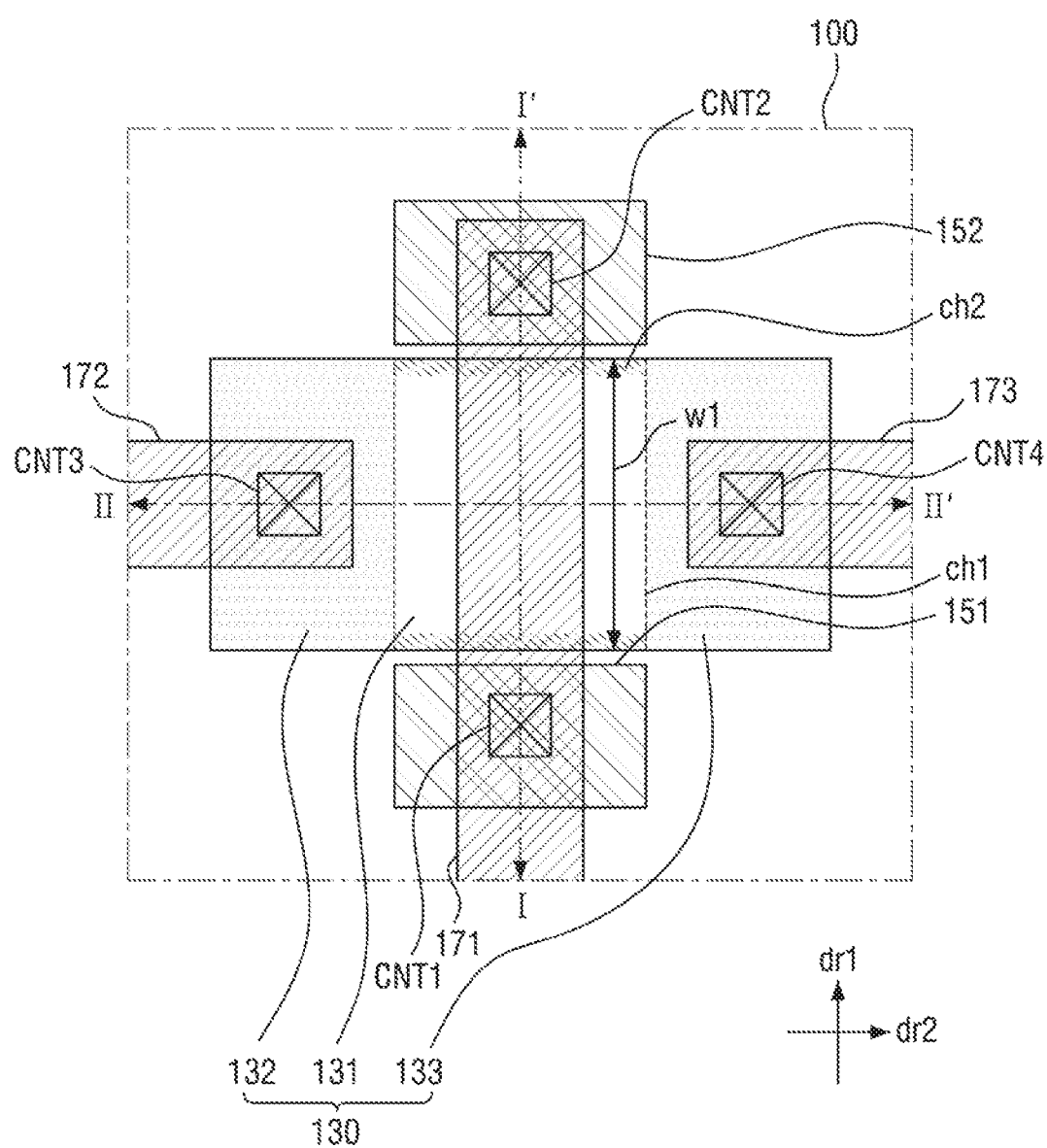
FIG. 4 is a layout view of a thin-film transistor (TFT) array substrate according to an exemplary embodiment of the present disclosure.
Figure 5:
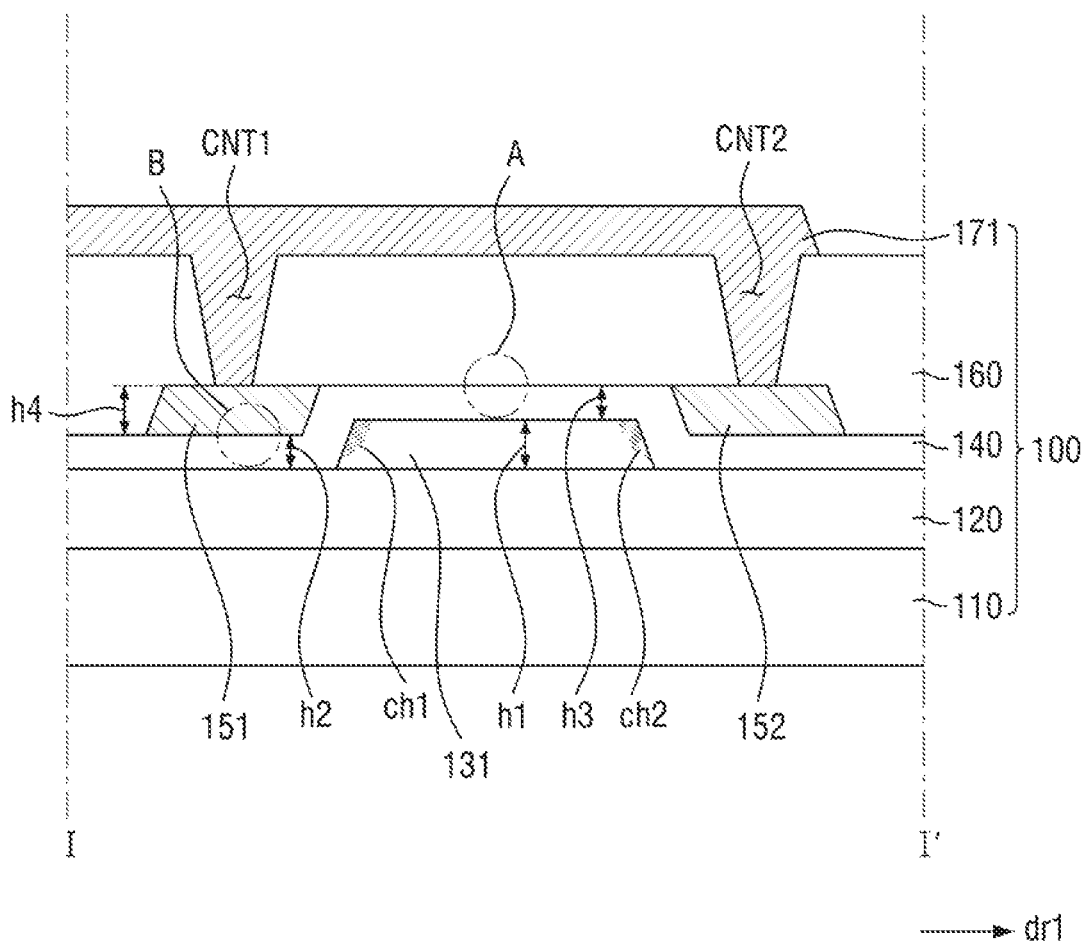
FIG. 5 is a cross-sectional view taken along line I-I' of FIG. 4.
Figure 6:
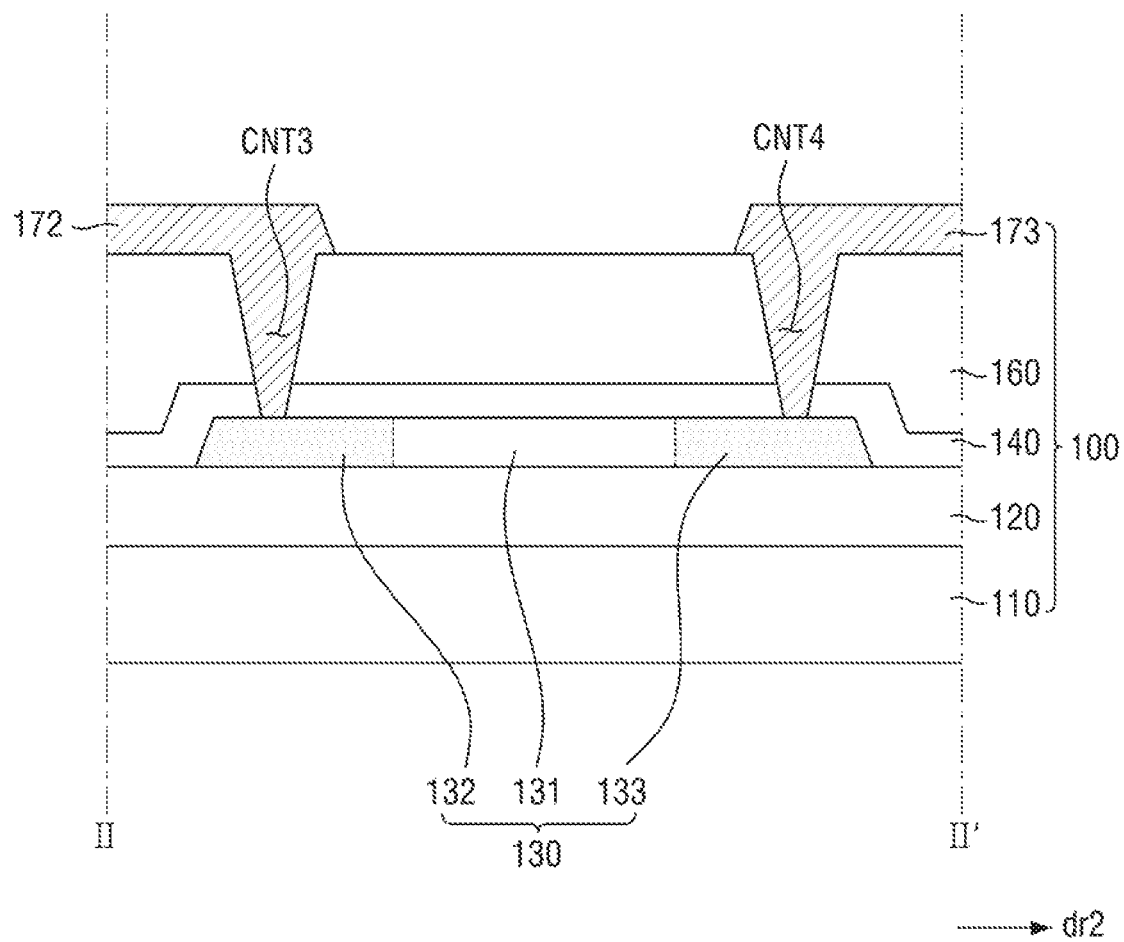
FIG. 6 is a cross-sectional view taken along line II-II' of FIG. 4.
Figure 7:
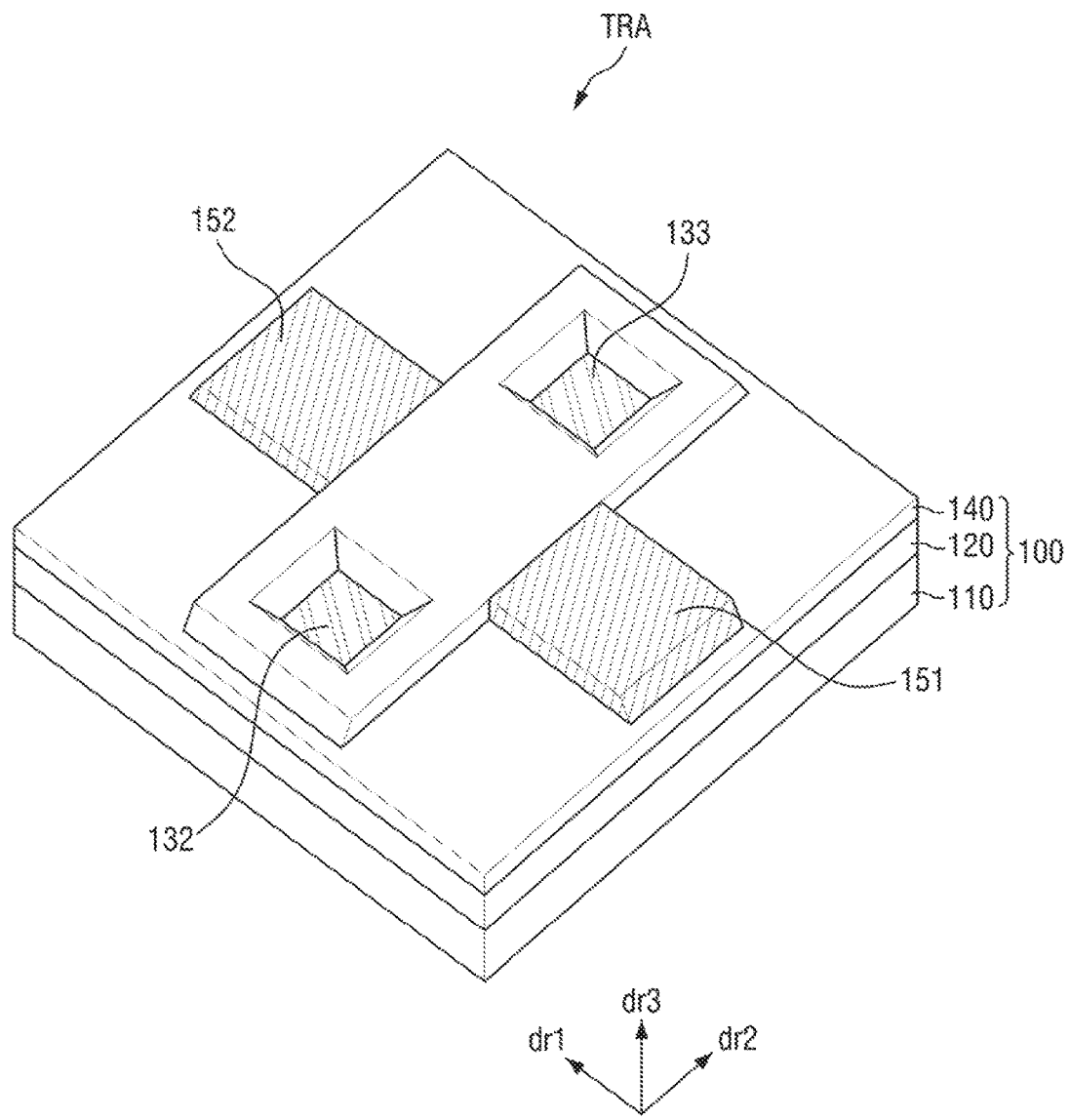
FIG. 7 is a perspective view of the TFT array substrate according to the exemplary embodiment of FIG. 4.
Figure 8:
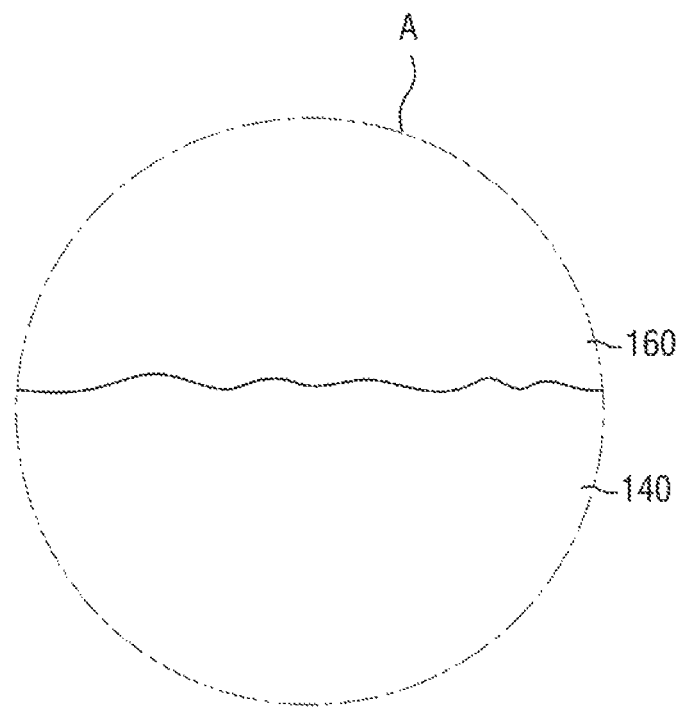
FIG. 8 is an enlarged cross-sectional view of an area A of FIG. 5.
Figure 9:
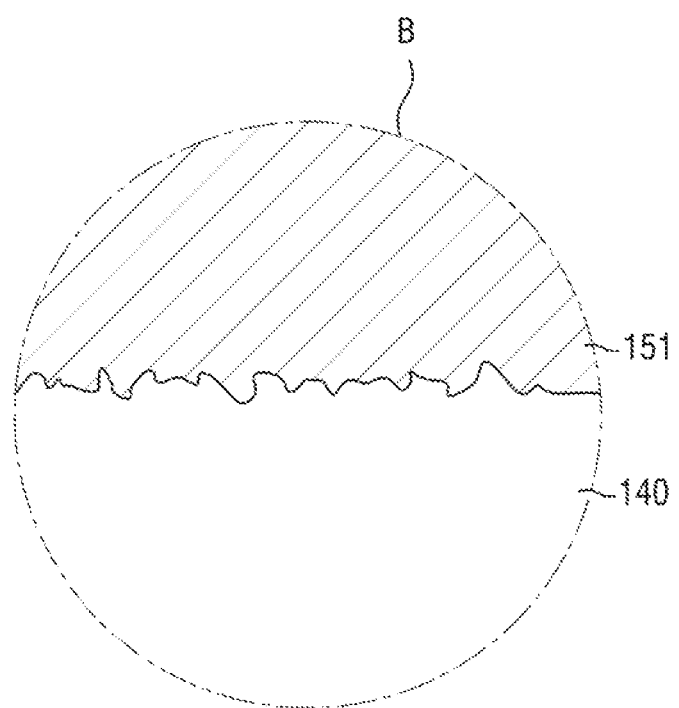
FIG. 9 is an enlarged cross-sectional view of an area B of FIG. 5.

FIG. 4 is a layout view of a TFT array substrate according to an exemplary embodiment of the present disclosure. Specifically, FIG. 4 shows the layout of part of at least one TFT included in each pixel of the display unit of FIG. 1. FIG. 5 is a cross-sectional view taken along line I-I' of FIG. 4, FIG. 6 is a cross-sectional view taken along line II-II' of FIG. 4, FIG. 7 is a perspective view of the TFT array substrate according to the exemplary embodiment of FIG. 4, FIG. 8 is an enlarged cross-sectional view of an area A of FIG. 5, and FIG. 9 is an enlarged cross-sectional view of an area B of FIG. 5.

Referring to FIGS. 4 through 9, a TFT array substrate 100 includes a base substrate 110, a buffer layer 120, a semiconductor layer 130, a first insulating layer 140, a gate electrode, a second insulating layer 160, a control electrode 171, a first source/drain electrode 172, and a second source/drain electrode 173. The first and second source/drain electrodes 172 and 173, the semiconductor layer 130, and the gate electrode may form a TFT. The TFT may include at least one transistor. The gate electrode may include a first gate electrode 151 and a second gate electrode 152. Thus, the TFT may correspond to two transistors, with one including the first gate electrode 151 and the other one including the second gate electrode 152.

The base substrate 110 is a substrate where a TFT array is disposed. The base substrate 110 may be an insulating substrate, and may be a transparent substrate or an opaque substrate. For example, the base substrate 110 may be, for example, a glass substrate, a quartz substrate, or a resin substrate. In an exemplary embodiment of the present disclosure, the base substrate 110 may be curved in one direction. In an exemplary embodiment of the present disclosure, the base substrate 110 may be flexible. That is, the base substrate 110 may be rollable, foldable, or bendable. The base substrate 110 may be formed by stacking multiple films having flexibility.

The buffer layer 120 is disposed on the base substrate 110, and may be formed on the entire surface of the base substrate 110. The buffer layer 120 may be formed of an inorganic material such as, for example, silicon nitride ($SiN_x$) or silicon oxide ($SiO_2$), and may be formed between the base substrate 110 and a TFT. Thus, the buffer layer 120 may prevent contaminants from the base substrate 110 from infiltrating into and causing damage to the TFT and may thus prevent the driving quality of the TFT from being degraded. Also, the buffer layer 120 may serve as a heat insulating layer and may thus allow the crystals of the semiconductor layer 130 to be sufficiently grown during the fabrication of the TFT array substrate 100. The buffer layer 120 may have a single-layer structure or a multilayer structure. In an exemplary embodiment of the present disclosure, the buffer layer 120 may be multilayers including inorganic material and/or organic material in each layer, and may function as an oxygen/moisture barrier.

First and second directions dr1 and dr2 are defined on the base substrate 110, and may perpendicularly intersect each other on a plane where the base substrate 110 is disposed. A third direction dr3 is defined as a direction perpendicularly intersecting both the first and second directions dr1 and dr2.

The semiconductor layer 130 is disposed on the buffer layer 120, and is formed on the buffer layer 120 to have a particular pattern. For example, the semiconductor layer 130 may be formed in a rectangular shape, and the rectangular shape may be formed with long sides extending in one direction (i.e., the second direction dr2). However, the shape of the semiconductor layer 130 is not particularly limited.

The semiconductor layer 130 may include at least one of, for example, amorphous silicon, an oxide semiconductor, and low-temperature polysilicon (LTPS). The conductivity of the semiconductor layer 130 may be controlled by controlling the TFT. For example, the conductivity of the semiconductor layer 130 may be dynamically modified by applying electric fields, or permanently modified through doping with impurities. The semiconductor layer 130 includes a first source/drain region 132, a second source/ drain region 133, and a channel region 131 provided between the first and second source/drain regions 132 and 133. The first and second source/drain regions 132 and 133 may be doped with a high concentration of n-type impurities (for example, phosphorus (P) or arsenic (As)) or p-type impurities (for example, boron (B) or aluminum (Al)). In a case where the semiconductor layer 130 is formed of an oxide semiconductor material, the doping of the first and second source/drain regions 132 and 133 with impurities may not be performed.

The first insulating layer 140 is disposed on the semiconductor layer 130. The first insulating layer 140 may physically separate the first and second gate electrodes 151 and 152 from the semiconductor layer 130. In other words, the first insulating layer 140 may serve as a gate insulator. The first insulating layer 140 may be formed of an insulating material such as, for example, silicon oxide, silicon nitride, silicon oxynitride or a high-k dielectric material with a dielectric constant higher than that of silicon oxide. The first insulating layer 140 may have a single-layer structure. Alternatively, the first insulating layer 140 may have a multilayer structure including two insulating films having different physical properties.

At least one gate electrode may be disposed on the first insulating layer 140. In the exemplary embodiment of FIGS. 4 through 9, two gate electrodes, i.e., the first and second gate electrodes 151 and 152, may be disposed on the first insulating layer 140.

The first and second gate electrodes 151 and 152 transmit a gate signal, which control the TFT. The gate signal is provided by the gate driving unit 10 of FIG. 1 and may have a variable level. The turning on or off of the TFT may be controlled in accordance with the level of the gate signal. For example, the first and second gate electrodes 151 and 152 may be connected to the same control electrode, i.e., the control electrode 171, and may thus be controlled by the same gate signal. Since the first and second gate electrodes 151 and 152 may be connected to the same control electrode, the first and second gate electrodes 151 and 152 may be defined as first and second sub-gate electrodes of the gate electrode.

Referring to FIG. 4, in a plan view, the first and second gate electrodes 151 and 152 may be spaced apart from each other with the semiconductor layer 130 interposed therebetween. The first and second gate electrodes 151 and 152 may be disposed not to overlap the semiconductor layer 130 in a plan view of the base substrate 110, i.e. not to overlap the semiconductor layer 130 in the direction perpendicular to the surface of the base substrate 110. For example, during the formation of the first and second gate electrodes 151 and 152, a gate metal layer for forming the first and second gate electrodes 151 and 152 may overlap the semiconductor layer 130, but once the first and second gate electrodes 151 and 152 are formed by continuously polishing the gate metal layer through chemical mechanical polishing (CMP) until the top surface of the first insulating layer 140, which overlaps the semiconductor layer 130, is exposed, the first and second gate electrodes 151 and 152 may then be separated from each other, and may no longer overlap the semiconductor layer 130. That is, the top surface of the first insulating layer 140 overlapping, the semiconductor layer 130 is the highest top surface of the first insulating layer 140.

Although the first gate electrode 151 (or the second gate electrode 152) and the semiconductor layer 130 are disposed not to overlap each other in a plan view of the base substrate 110, the first gate electrode 151 (or the second gate electrode 152) is disposed adjacent to the semiconductor layer 130 and overlaps the semiconductor layer 130 in a direction parallel to a top surface of the base substrate 110. That is, the first gate electrode 151 (or the second gate electrode 152) is disposed next to the semiconductor layer 130 and overlaps the semiconductor layer 130 with the first insulating layer 140 interposed therebetween in the direction parallel to the top surface of the base substrate 110. The semiconductor layer 130 may be completely or partially overlapped by the first gate electrode 151 (or the second gate electrode 152) in the direction parallel to the top surface of the base substrate 110 depending on the structure arrangement of the TFT array substrate. Here, a bottom portion of the first gate electrode 151 (or a bottom portion of the second gate electrode 152) overlaps a top portion of the semiconductor layer 130 in the direction parallel to the top surface of the base substrate 110.

In a case where an on-level gate signal is provided to the first gate electrode 151, a first channel ch1 is formed on a sidewall of the semiconductor layer 130 corresponding to part of the channel region 131 adjacent to the first gate electrode 151. Similarly, in a case where an on-level gate signal is provided to the second gate electrode 152, a second channel ch2 is formed on a sidewall of the semiconductor layer 130 corresponding to part of the channel region 131 adjacent to the second gate electrode 152. Accordingly, the width of the first and second channels ch1 and ch2 may be measured along the sidewalls of the semiconductor layer 130.

The width of the first channel ch1 may be determined by a thickness h1 of the semiconductor layer 130, a thickness h4 of the first gate electrode 151, and the degree of correspondence between the sidewall of the first gate electrode 151 and the corresponding sidewall of the semiconductor layer 130. Similarly, the width of the second channel ch2 may be determined by the thickness h1 of the semiconductor layer 130, the thickness of the second gate electrode 152 (i.e., the thickness h4 of the first gate electrode 151), and the degree of correspondence between the sidewall of the second gate electrode 152 and the corresponding sidewall of the semiconductor layer 130.

The degree of correspondence between the sidewall of a gate electrode (i.e., the first or second gate electrode 151 or 152) and the corresponding sidewall of the semiconductor layer 130 denotes the degree to which the sidewall of the gate electrode and the corresponding sidewall of the semiconductor layer 130 overlap in a direction parallel to the surface of the base substrate 110. If the sidewall of the semiconductor layer 130 and the corresponding sidewall of the first gate electrode 151 (or the sidewall of the second gate electrode 152) do not overlap in the direction parallel to the surface of the base substrate 110, the degree of correspondence between the sidewall of the first gate electrode 151 and the corresponding sidewall of the semiconductor layer 130 may indicate the degree to which the bottom surface of the first gate electrode 151 (or the bottom surface of the second gate electrode 152) and the top surface of the semiconductor layer 130 are spaced apart from each other in a direction perpendicular to the base substrate 110. In this case, the bottom surface of the first gate electrode 151 (or the bottom surface of the second gate electrode 152) and the top surface of the semiconductor layer 130 may need to overlap in a direction perpendicular to the base substrate 110 to increase channel width.

In accordance with the exemplary embodiment of FIGS. 4 through 9, the width of the first and second channels ch1 and ch2 is determined not by the planar shape of the first and second gate electrodes 151 and 152, but the thickness h4 of the first gate electrode 151, the thickness of the second gate electrode 152 (which is the same as the thickness h4 of the first gate electrode 151), and the thickness h1 of the semiconductor layer 130.

In a case where a plurality of TFTs are formed on the TFT array substrate 100 in accordance with the exemplary embodiment of FIGS. 4 through 9, the TFTs may be formed to have a uniform channel width. On the other hand, in a case where the semiconductor layer 130 and at least one gate electrode are formed to overlap in a plan view, the channel width of TFTs may be determined by the planar shape of the gate electrode. As a result, the channel width of TFTs is determined by the resolution of exposure equipment patterning the gate electrode. Therefore, a minimum channel width and the distribution of channel widths of TFTs are determined by the resolution of the exposure equipment. Accordingly, a fine channel width and a uniform channel width distribution may not be achieved beyond the resolution limit of the available exposure equipment.

In accordance with the exemplary embodiment of FIGS. 4 through 9, a minimum channel width and the distribution of channel widths of TFTs may be determined without being affected by the resolution of exposure equipment. Thus, the thicknesses of the semiconductor layer 130, the first gate electrode 151, the second gate electrode 152, and the first insulating layer 140 may be controlled to a level finer than that in a case where patterns are formed on a plane using exposure equipment. Accordingly, TFTs included in the TFT array substrate 100 may be controlled to have not only a fine channel width, but also a uniform channel width distribution.

In accordance with the exemplary embodiment of FIGS. 4 through 9, a gate electrode layer and/or the first insulating layer 140 may be polished at the same time by a CMP process. As a result, the top surface of the first gate electrode 151, the top surface of the second gate electrode 152, and the top surface of the first insulating layer 140, which overlaps the semiconductor layer 130, may all be placed on the same level, in other words, may be coplanar.

Since no gate electrode material remains on top of a portion of the first insulating layer 140 overlapping the semiconductor layer 130 and the CMP process is continued until the top surface of the first insulating layer 140 is exposed, the top surface of the first insulating layer 140 may also be partially polished during the CMP process. On the other hand, portions of the first insulating layer 140 overlapped by the first and second gate electrodes 151 and 152 are not affected by the CMP process because they are still covered by the first and second gate electrodes 151 and 152 and are thus not exposed. As a result, a thickness h2 of the portions of the first insulating layer 140 overlapped in a plane view by the first and second gate electrodes 151 and 152 may be greater than a thickness h3 of the portion of the first insulating layer 140 overlapping the semiconductor layer 130.

As described above, since no gate electrode material remains on top of the portion of the first insulating layer 140 overlapping the semiconductor layer 130 and the CMP process is continued until the top surface of the first insulating layer 140 is exposed, the top surface of the first insulating layer 140 may be partially polished by the CMP process. Accordingly, the top surface of the portion of the first insulating layer 140 overlapping the semiconductor layer 130 may have polished surface characteristics as illustrated in FIG. 8. On the other hand, since the portions of the first insulating layer 140 overlapped by the first and second gate electrodes 151 and 152 are covered by the first and second gate electrodes 151 and 152 and are thus not exposed, the top surfaces of the portions of the first insulating layer 140 overlapped by the first and second gate electrodes 151 and 152 have the same surface characteristics as originally deposited, as illustrated in FIG. 9.

In general, due to the nature of a polishing process, the surface of a layer is rougher when originally deposited than when polished and planarized. Accordingly, as is apparent from FIGS. 8 and 9, the top surfaces of the portions of the first insulating layer 140 overlapped by the first and second gate electrodes 151 and 152 are rougher than the top surface of the portion of the first insulating layer 140 overlapping the semiconductor layer 130.

The top surfaces of the first and second gate electrodes 151 and 152 and the top surface of the portion of the first insulating layer 140 overlapping the semiconductor layer 130 may have the same roughness because the top surfaces of the first and second gate electrodes 151 and 152 and the top surface of the portion of the first insulating layer 140 overlapping the semiconductor layer 130 are all formed from polishing. However, although the roughness may be generally the same, there may be a slight difference in roughness characteristics between the top surfaces of the first and second gate electrodes 151 and 152 and the top surface of the portion of the first insulating layer 140 overlapping the semiconductor layer 130, due to the first insulating layer 140 and the first and second gate electrodes 151 and 152 are formed of different materials, and may respond to the CMP process differently.

The first and second gate electrodes 151 and 152 may be formed of the same material. For example, the first and second gate electrodes 151 and 152 may be formed as single layers or multilayers using at least one metal selected from among, for example, aluminum (Al), platinum (Pt), palladium (Pd), silver (Ag), magnesium (Mg), gold (Au), nickel (Ni), neodymium (Nd), iridium (Ir), chromium (Cr), nickel (Ni), calcium (Ca), molybdenum (Mo), titanium (Ti), tungsten (W), copper (Cu), and an alloy thereof.

The second insulating layer 160 is disposed on the first and second gate electrodes 151 and 152. The second insulating layer 160 may be formed of an insulating material such as, for example, silicon nitride or silicon oxide. The second insulating layer 160 may also be formed of an organic material and the top of the second insulating layer 160 may be planarized. The second insulating layer 160 may have a single-layer structure. Alternatively, the second insulating layer 160 may have a multilayer structure including two insulating films having different physical properties.

The control electrode 171, the first source/drain electrode 172, and the second source/drain electrode 173 are disposed on the second insulating layer 160.

The control electrode 171 may be connected to the first gate electrode 151 via a first contact hole CNT1, which penetrates the second insulating layer 160, and may be connected to the second gate electrode 152 via a second contact hole CNT2, which penetrates the second insulating layer 160. The control electrode 171 may provide signals to the first and second gate electrodes 151 and 152. The signals provided to the first and second gate electrodes 151 and 152 may be the gate signals G1 through Gn of FIG. 1.

The first source/drain electrode 172 may be connected to the first source/drain region 132 via a third contact hole CNT3, which penetrates the first and second insulating layers 140 and 160. The second source/drain electrode 173 may be connected to the second source/drain region 133 via a fourth contact hole CNT4, which penetrates the first and second insulating layers 140 and 160. The first source/drain electrode 172 may provide signals to, or receive signals from, the first source/drain region 132. The second source/drain electrode 173 may provide signals to, or receive signals from, the second source/drain region 133.

In an exemplary embodiment, the gate electrode may include two or more sub-gate electrodes, with all the sub-gate electrodes connected to the same control electrode, and may thus be controlled by the same gate signal. For example, the first and second gate electrodes 151 and 152 may be the first and second sub-gate electrodes of the gate electrode, the first sub-gate electrode may be disposed adjacent to one side of the semiconductor layer 130, and the second sub-gate electrode may be disposed adjacent to the other side of the semiconductor layer 130, in which the electrical connections between the first and second source/drain electrodes 172 and 173 may be controlled by both the first and second sub-gate electrodes.

The control electrode 171, the first source/drain electrode 172, and the second science/drain electrode 173 may be formed as single layers or multilayers using at least one metal selected from among, for example, Al, Pt, Pd, Ag, Mg, Au, Ni, Nd, Ir, Cr, Li, Ca, Mo, Ti, W, Cu, and an alloy thereof.

The control electrode 171, the first source/drain electrode 172, and the second source/drain electrode 173 may be disposed on the same plane, but the present disclosure is not limited thereto. For example, in a ease where the control electrode 171 and the first source/drain electrode 172 need to be designed to intersect each other, an insulating layer is additionally provided such that the control electrode 171 and the first source/drain electrode 172 can be arranged on different layers.

The characteristics of a TFT according to the exemplary embodiment of FIGS. 4 through 9 will be hereinafter described.

Figure 10:
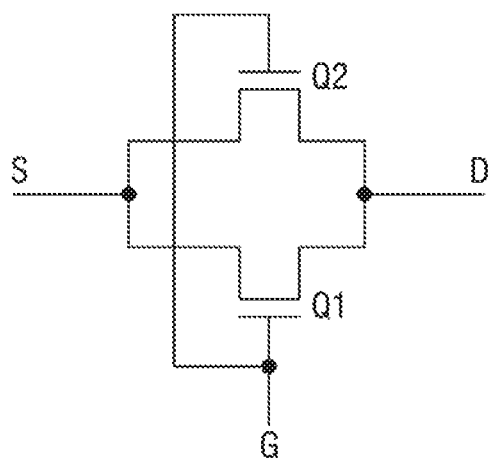
FIG. 10 is an equivalent circuit diagram of a TFT according to the exemplary embodiment of FIGS. 4 through 9.

FIG. 10 is an equivalent circuit diagram of a TFT according to the exemplary embodiment of FIGS. 4 through 9.

Referring to FIG. 10, the TFT according to the exemplary embodiment of FIGS. 4 through 9 corresponds to two switching transistors, i.e., first and second switching transistors Q1 and Q2. The first and second switching transistors Q1 and Q2 may be controlled by signals provided via the same control line, i.e., a control line G. The first and second switching transistors Q1 and Q2 may share the same input line, i.e., an input line S, and the same output line, i.e., an output line D.

Figure 11:
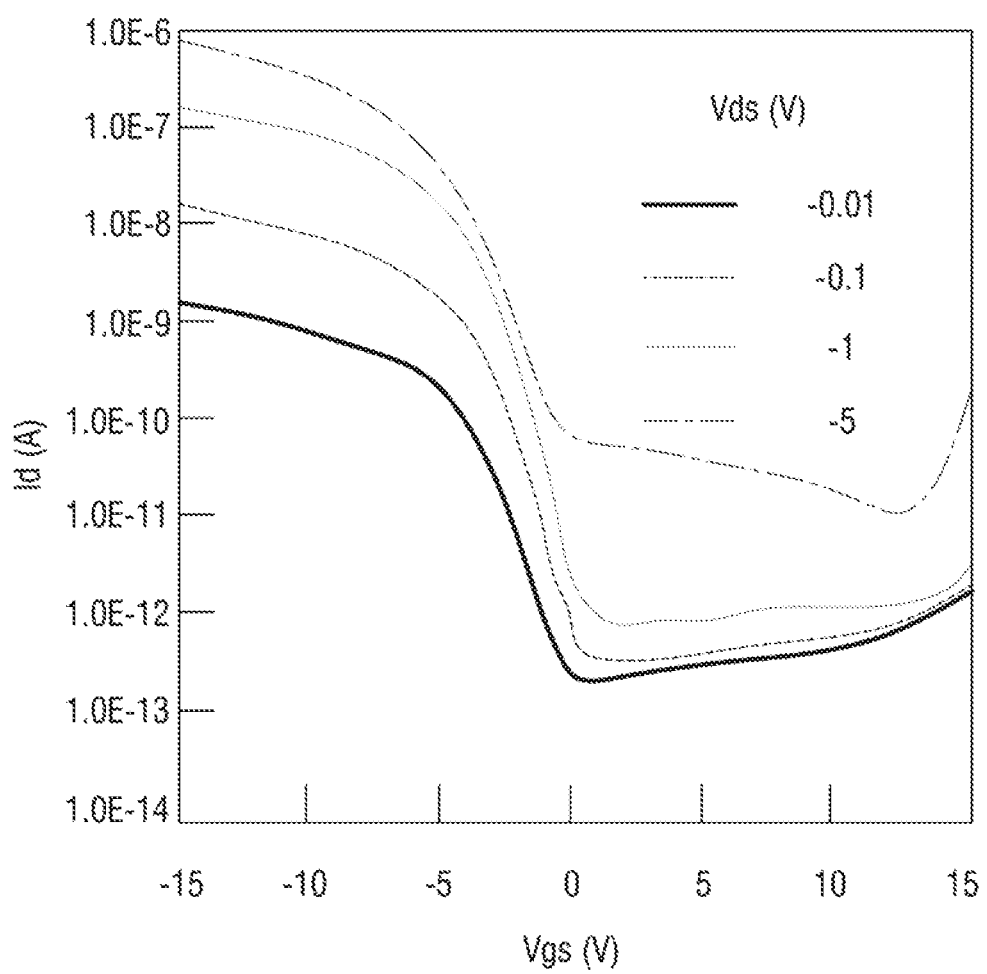
FIG. 11 is a graph showing the voltage-current characteristics of the TFT according to the exemplary embodiment of FIGS. 4 through 9.

FIG. 11 is a graph showing the voltage-current characteristics of the TFT according to the exemplary embodiment of FIGS. 4 through 9.

FIG. 11 shows the variation of a drain current Id in accordance with a gate-source voltage Vgs and a source-drain voltage Vds of the TFT according to the exemplary embodiment of FIGS. 4 through 9.

FIG. 11 illustrates a graph for a p-type TFT, but the present disclosure is not limited thereto. For example, the TFT may be an n-type.

Referring to FIG. 11, since the TFT according to the exemplary embodiment of FIGS. 4 through 9 is a p-type TFT, the lower the source-gate voltage Vgs the higher the drain current Id, and as shown in FIG. 11, the TFT exhibits favorable voltage-current characteristics when the source-drain voltage Vds is −1 V or higher. When the source-gate voltage Vgs is approximately 0 V or higher, the drain current Id is dose to the order of $10^{-13}$ A, and the TFT according to the exemplary embodiment of FIGS. 4 through 9 is turned off.

As described above, in a case where channels are formed along the sidewalls of a TFT, as in the exemplary embodiment of FIGS. 4 through 9, favorable TFT characteristics, such as small subthreshold swing and good on-off-state drive current ratio, may be achieved.

A method of manufacturing the TFT array substrate 100 according to the exemplary embodiment of FIG. 5 will be hereinafter described with reference to FIGS. 12 through 15.

FIGS. 12 through 15 are cross-sectional views illustrating a method of manufacturing the TFT array substrate according to the exemplary embodiment of FIG. 5. Specifically, FIGS. 12 through 15 are cross-sectional views taken along line I-I' of FIG. 4, and the TFT array substrate 100 of FIG. 5 may be obtained by the method of FIGS. 12 through 15.

Figure 12:
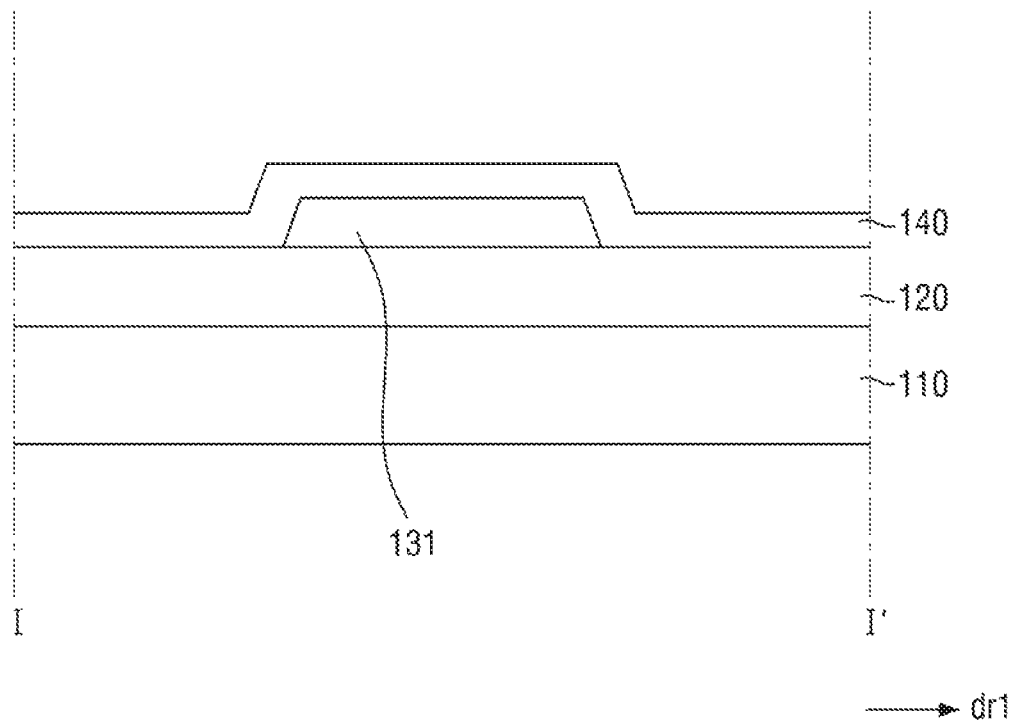
FIGS. 12 through 15 are cross-sectional views illustrating a method of manufacturing the TFT array substrate according to the exemplary embodiment of FIG. 5.

Referring to FIG. 12, the buffer layer 120 is formed on the base substrate 110. The buffer layer 120 may include an inorganic material such as, for example, silicon nitride or silicon oxide, and may be formed by various deposition methods such as, for example, plasma enhanced chemical vapor deposition (PECVD), atmospheric pressure chemical vapor deposition (APCVD), and low-pressure chemical vapor deposition (LPCVD).

Thereafter, the semiconductor layer 130 is formed on the buffer layer 120. Specifically, a semiconductor material layer is formed by depositing a semiconductor material on the buffer layer 120 and crystallizing the semiconductor material. The semiconductor material layer may include at least one of, for example, amorphous silicon, an oxide semiconductor, and LTPS, and may be formed by various methods such as, for example, rapid thermal annealing (RTA), solid phase crystallization (SPC), excimer laser annealing (ELA), metal induced crystallization (MIC), metal induced lateral crystallization (MILC), and sequential lateral solidification (SLS). The semiconductor layer 130 is formed by patterning the semiconductor material layer using a mask.

In an exemplary embodiment of the present disclosure, the buffer layer 120 having a pattern the same as that of the semiconductor layer 130 on the base substrate 110 may be formed before the forming of the semiconductor layer 130. The area of the buffer layer 120 having the pattern is overlapped by the semiconductor layer 130, and having a thickness larger than a thickness of other area of the buffer layer 120 not overlapped by the semiconductor layer 130.

The semiconductor layer 130 is patterned, but is yet to be doped.

Thereafter, the first insulating layer 140 is formed on the semiconductor layer 130. The first insulating layer 140 is formed of an inorganic insulating material in the form of a single layer or a multilayer. The first insulating layer 140 may include an insulating material such as, for example, silicon oxide, silicon nitride, silicon oxynitride or a high-k dielectric material with a dielectric constant higher than that of silicon oxide, and may be formed by, for example, PECVD, APCVD, or LPCVD.

Figure 13:
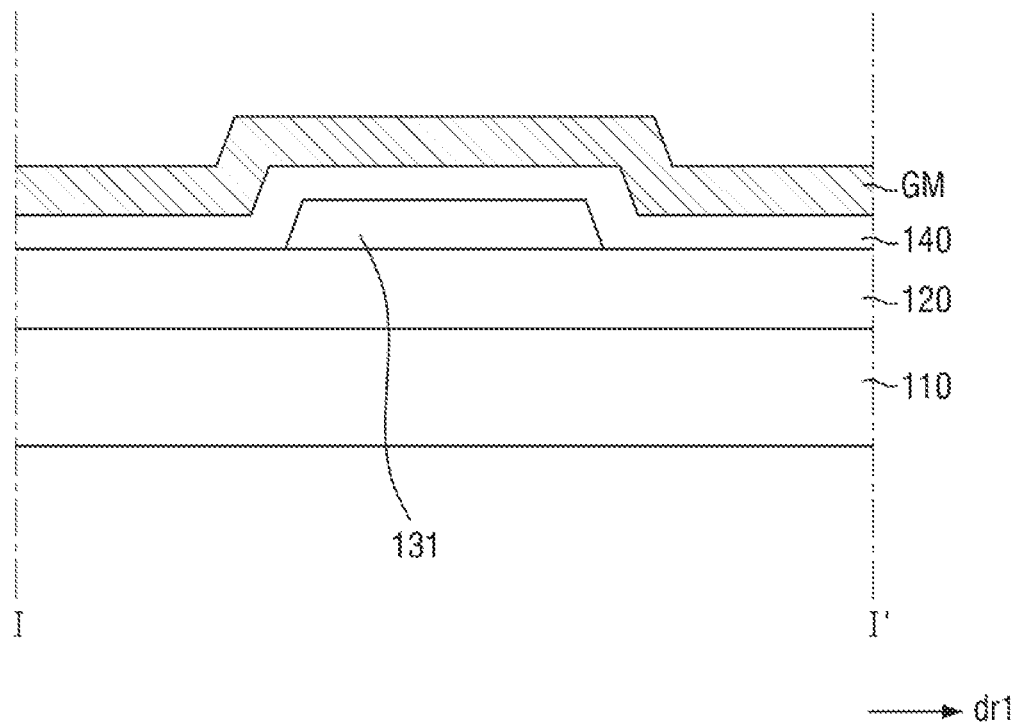

Thereafter, referring to FIG. 13, a gate electrode material layer GM is deposited and formed on the first insulating layer 140. The material of the gate electrode material layer GM may be the same as the material of the first and second gate electrodes 151 and 152. The gate electrode material layer may include at least one of, for example, Al, Pt, Pd, Ag, Mg, Au, Ni, Nd, Ir, Cr, Li, Ca, Mo, Ti, W, Cu, and an alloy thereof, and may be formed by for example, physical vapor deposition (PVD), chemical vapor deposition (CVD), atomic layer deposition (ALD), electrochemical deposition (ECD), electroplating, electroless plating and spin coating.

Figure 14:
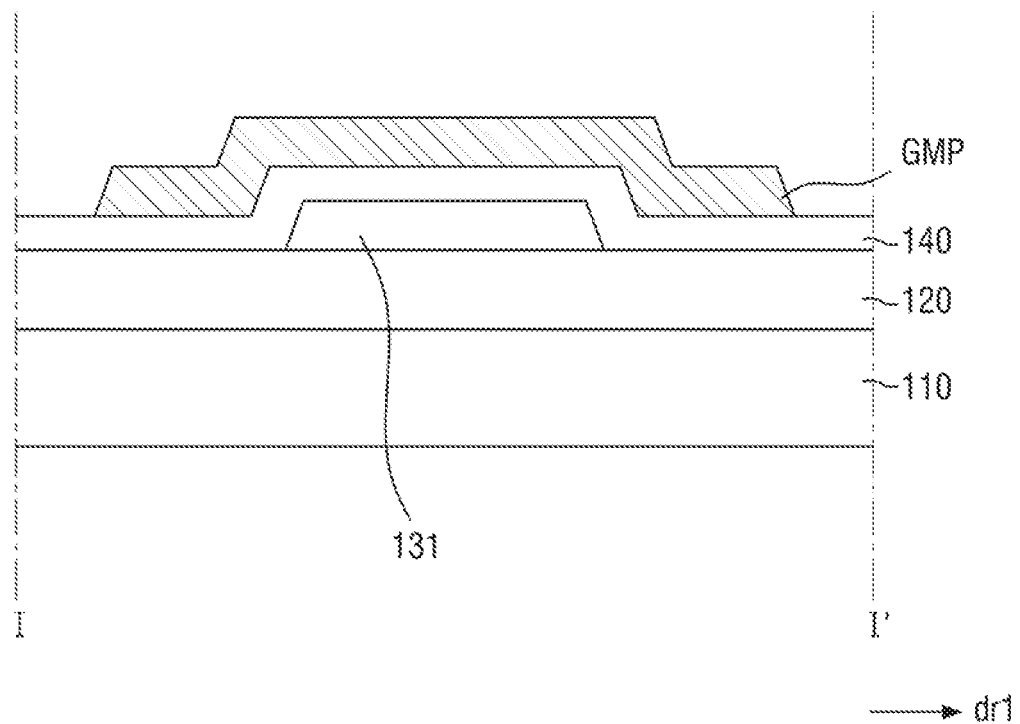

Thereafter, referring to FIG. 14, a gate electrode pattern layer GMP is formed by patterning the gate electrode material layer GM using a mask. The gate electrode pattern layer GMP is disposed to overlap part of the semiconductor layer 130. Specifically, the overlap region between the gate electrode pattern layer SMP and the semiconductor layer 130 may correspond to the channel region 131 of FIG. 4.

Thereafter, the semiconductor layer 130 is doped with n- or p-type impurities using the gate electrode pattern layer GMP as a self-aligned mask. For example, the semiconductor layer 130 may be doped with a high concentration of n-type impurities, for example, P or As, or p-type impurities, for example, B or Al, and may be doped by ion implantation. As a result, the first source/drain region 132, the second source/drain region 133, and the channel region 131 may be formed. A region between the first and second source/drain regions 132 and 133 may become the channel region 131.

Figure 15:
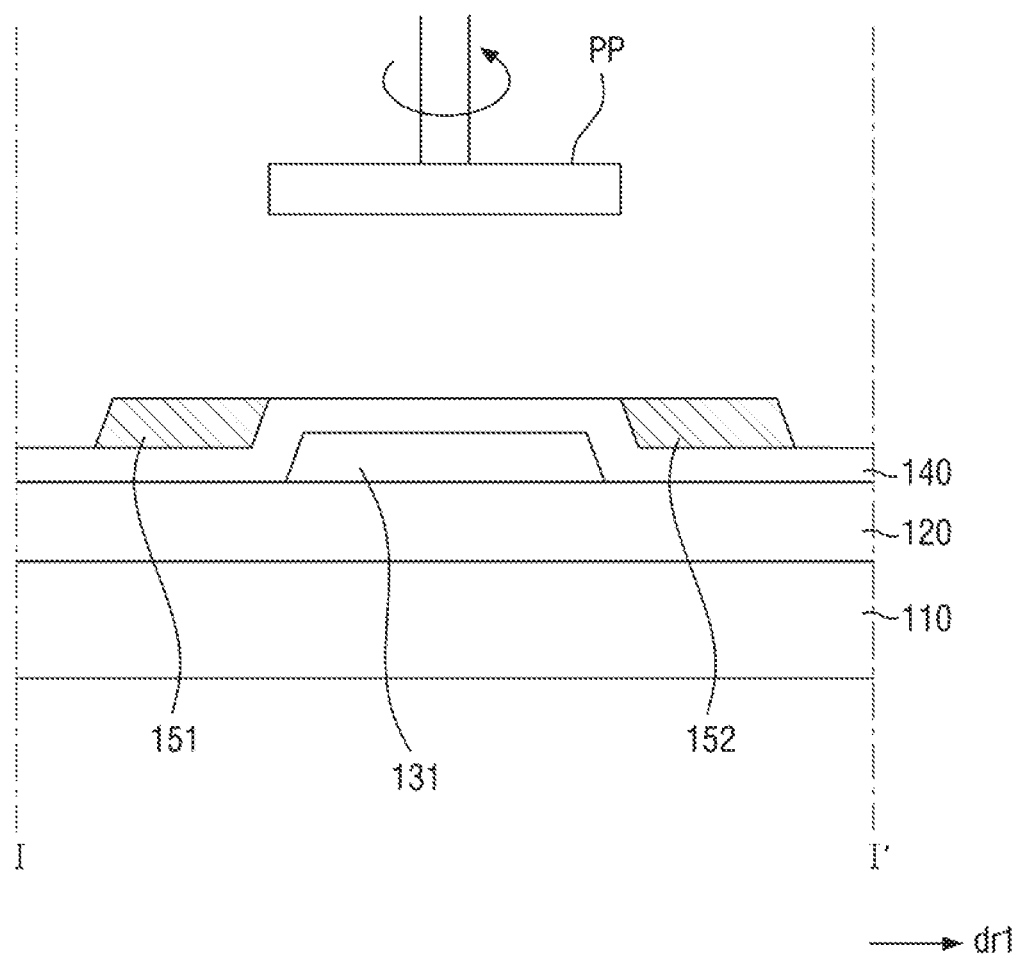

Thereafter, referring to FIG. 15, the gate electrode pattern layer GMP is polished by performing CMP with the use of a polishing pad PP until the top surface of the portion of the first insulating layer 140 overlapping the semiconductor layer 130 is exposed. During the polishing of the gate electrode pattern layer GMP, a slurry that can chemically react with the surface of a target object to be polished may be additionally provided.

During the CMP process, a portion of the gate electrode pattern layer GMP that protrudes upwardly is continuously polished away until the gate electrode pattern layer GMP is divided into the first and second gate electrodes 151 and 152. Since the gate electrode pattern layer GMP reflects a height difference produced by the semiconductor layer 130, a portion of the gate electrode pattern layer GMP overlapping the semiconductor layer 130 may be removed by CMP.

Thereafter, the second insulating layer 160 is formed, and the control electrode 171, the first source/drain electrode 172, the second source/drain electrode 173, and the first, second, third, and fourth contact holes CNT1, CNT2, CNT3, and CNT4 are formed. The second insulating layer 160 may be formed of an organic material. The control electrode 171, the first source/drain electrode 172, and the second source/drain electrode 173 may be formed of a material the same as that of the first and second gate electrodes 151 and 152. As a result, the TFT array substrate 100 of FIG. 5 is obtained.

Figure 16:
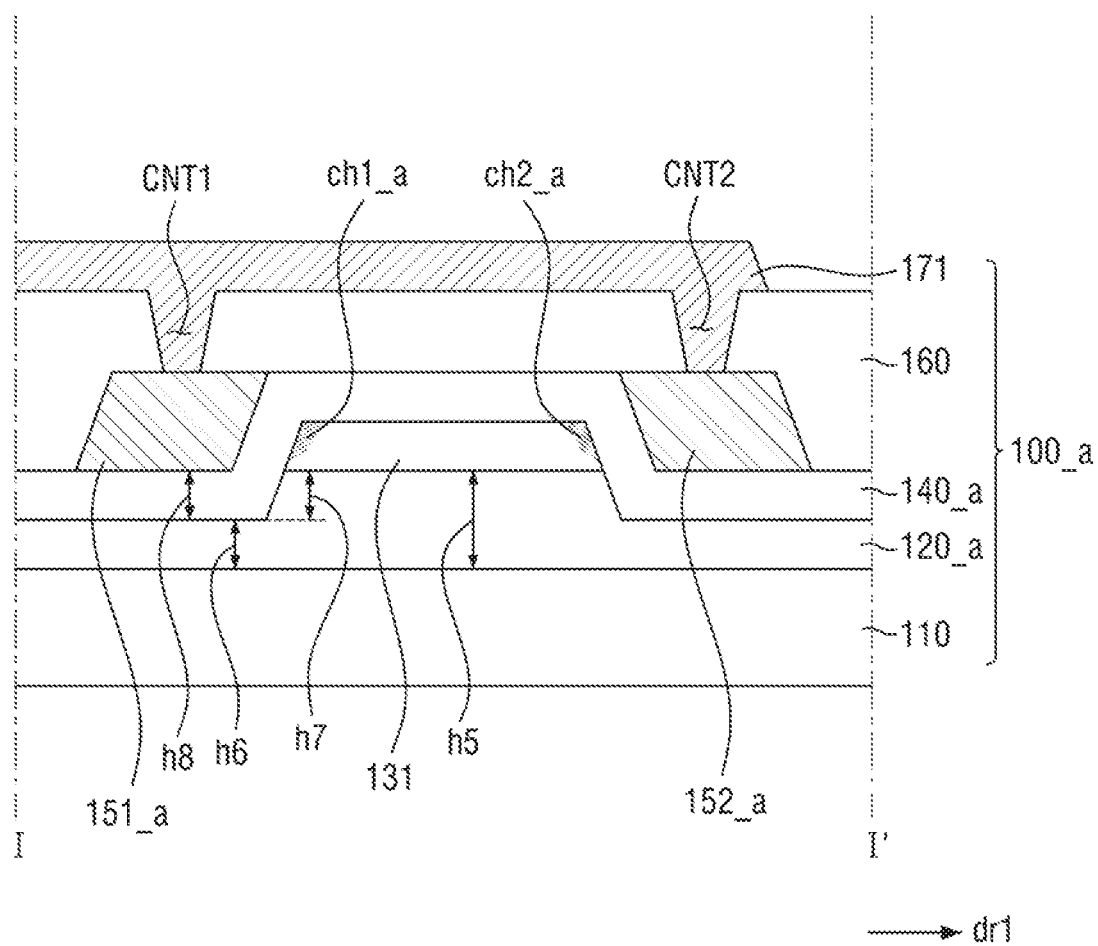
FIG. 16 is a cross-sectional view, taken along line I-I' of FIG. 4, of a TFT array substrate according to an exemplary embodiment of the present disclosure.
Figure 17:
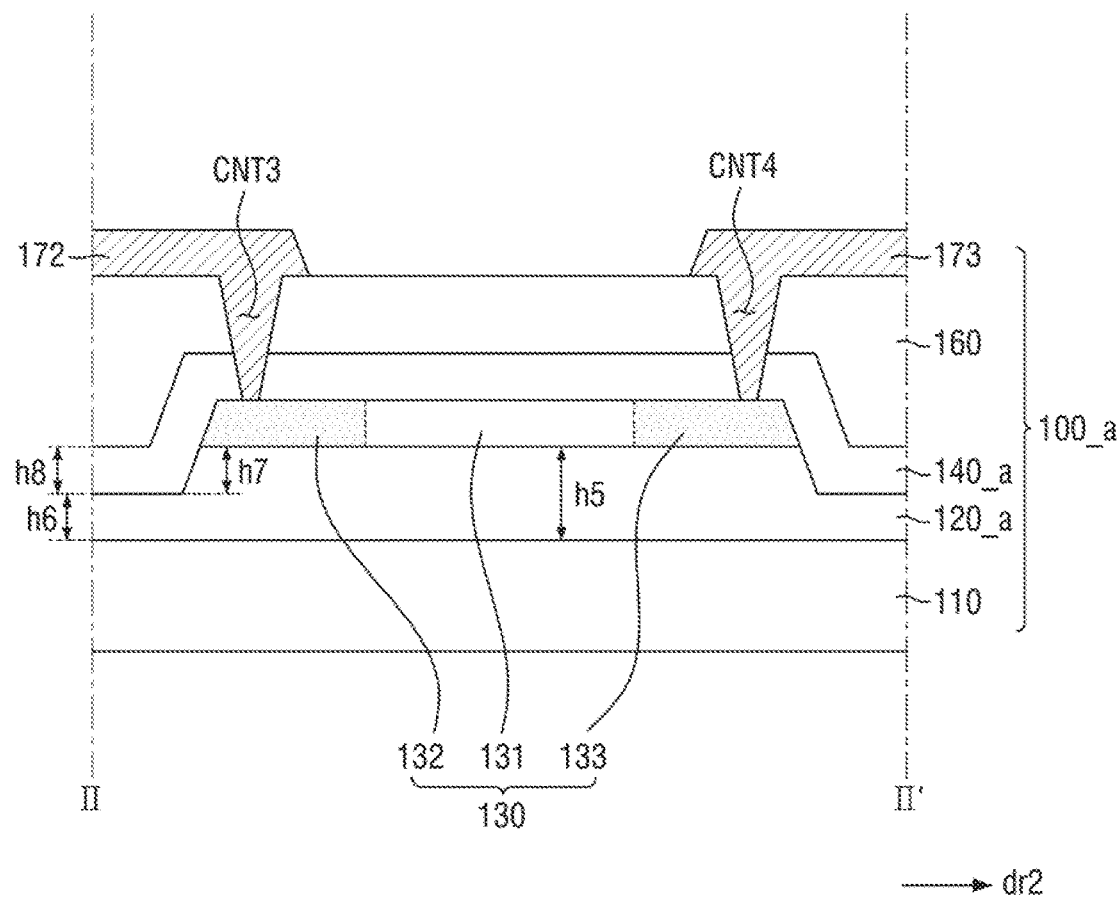
FIG. 17 is a cross-sectional view, taken along line II-II' of FIG. 4, of the TFT array substrate according to the exemplary embodiment of FIG. 16.

FIG. 16 is a cross-sectional view, taken along line I-I' of FIG. 4, of a TFT array substrate according to an exemplary embodiment of the present disclosure, and FIG. 17 is a cross-sectional view, taken along line II-II' of FIG. 4, of the TFT array substrate according to the exemplary embodiment of FIG. 16.

A TFT array substrate 100_a according to the exemplary embodiment of FIGS. 16 and 17 differs from the TFT array substrate 100 according to the exemplary embodiment of FIGS. 5 and 6 in that a buffer layer 120_a has a height difference. Thus, the TFT array substrate 100_a will be hereinafter described, focusing mainly on the buffer layer 120_a, and descriptions of the other elements of the TFT array substrate 100_a will be omitted or at least simplified. In FIGS. 5, 6, 16 and 17, like reference numerals indicate like elements.

Referring to FIGS. 16 and 17, the TFT array substrate 100_a includes a base substrate 110, the buffer layer 120_a, a semiconductor layer 130, a first insulating layer 140_a, a first gate electrode 151_a, a second gate electrode 152_a, a second insulating layer 160, a control electrode 171, a first source/drain electrode 172, and a second source/drain electrode 173.

A thickness h5 of a portion of the buffer layer 120_a overlapped by the semiconductor layer 130 may be greater than a thickness h6 of portions of the buffer layer 120_a not overlapped by the semiconductor layer 130, and this structure may be realized by adding patterning to the process of forming the buffer layer 120_a. That is, the buffer layer 120 is patterned to have a patterned area, which is the portion overlapping the semiconductor layer 130, having a pattern the same as the pattern of the semiconductor layer 130. Accordingly, the degree of correspondence between the sidewall of the first gate electrode 151_a and the corresponding sidewall of the semiconductor layer 130 may increase. Also, the degree of correspondence between the sidewall of the second gate electrode 152_a and the corresponding sidewall of the semiconductor layer 130 may increase.

In a case where a height difference h7 between the top surface of the portion of the buffer layer 120_a overlapped by the semiconductor layer 130 and the top surface of the portions of the buffer layer 120_a not overlapped by the semiconductor layer 130 is the same as a thickness h8 of the first insulating layer 140_a, the bottom surface of the semiconductor layer 130 and the bottom surface of the first gate electrode 151_a (or the bottom surface of the second gate electrode 152_a) may be placed on the same level. That is, the top surface of the portions of the insulating layer 140_a not overlapped by the semiconductor layer 130 and the top surface of the portion of the buffer layer 120_a overlapped by the semiconductor layer 130 may be placed on the same level. Accordingly, the width of first and second channels ch1_a and ch2_a formed along the sidewalls of the semiconductor layer 130 may be maximized. Alternatively, in an exemplary embodiment of the present disclosure, the height difference h7 may be larger than the thickness h8. That is, the bottom surface of the semiconductor layer 130 is placed on a level higher than that of the bottom surface of the first gate electrode 151_a (or the bottom surface of the second gate electrode 152_a). Since the degree of the correspondence between the sidewall of the first gate electrode 151_a (or the sidewall of the second gate electrode 152_a) and the corresponding sidewall of the semiconductor layer 130 may also increase. Accordingly, the width of the first and second channels ch1_a and ch2_a formed along the sidewalks of the semiconductor layer 130 may also be maximized.

Figure 18:
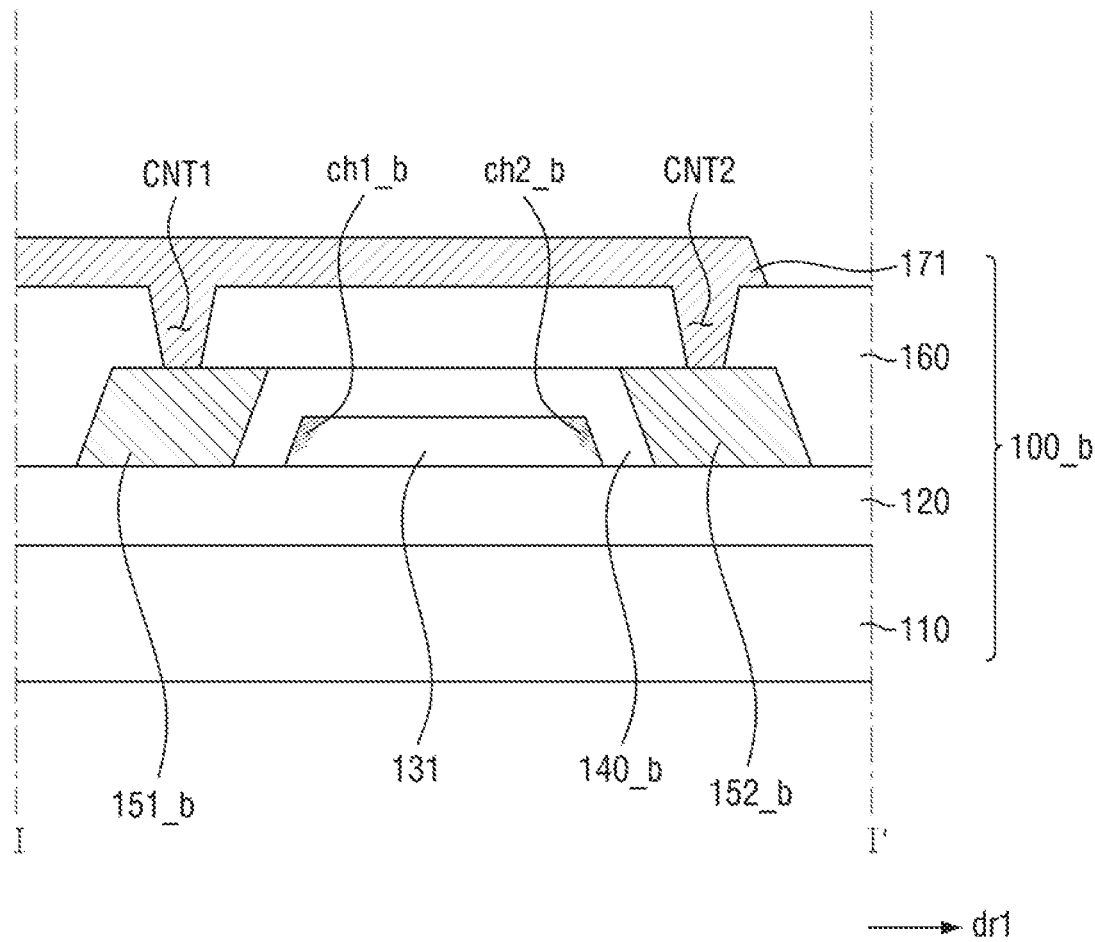
FIG. 18 is a cross-sectional view, taken along line I-I' of FIG. 4, of a TFT array substrate according to an exemplary embodiment of the present disclosure.
Figure 19:
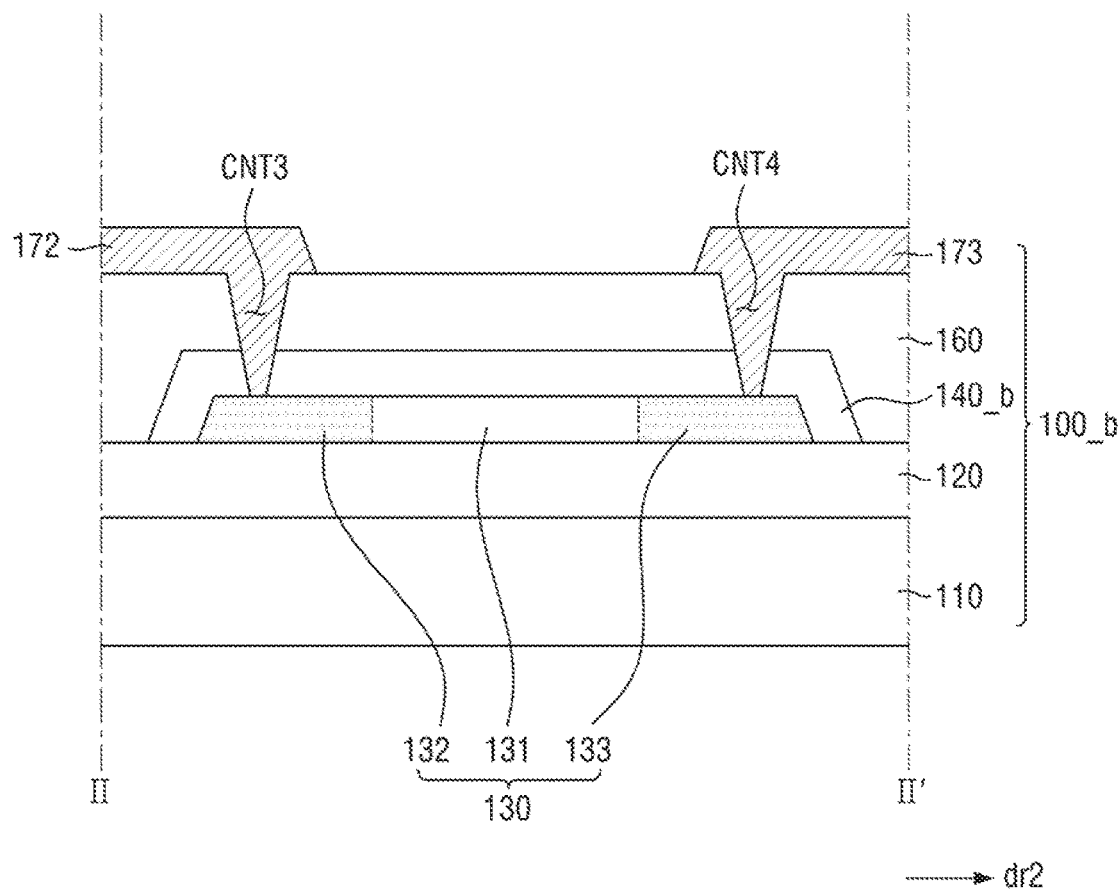
FIG. 19 is a cross-sectional view, taken along line II-II' of FIG. 4, of the TFT array substrate according to the exemplary embodiment of FIG. 18.

FIG. 18 is a cross-sectional view, taken along line I-I' of FIG. 4, of a TFT array substrate according to an exemplary embodiment of the present disclosure, and FIG. 19 is a cross-sectional view, taken along line II-II' of FIG. 4, of the TFT array substrate according to the exemplary embodiment of FIG. 18.

A TFT array substrate 100_b according to the exemplary embodiment of FIGS. 18 and 19 differs from the TFT array substrate 100 according to the exemplary embodiment of FIGS. 5 and 6 in that a first insulating layer 140_b is patterned. Thus, the TFT array substrate 100_b will be hereinafter described, focusing mainly on the first insulating layer 140_b, and descriptions of the other elements of the TFT array substrate 100_b will be omitted or at least simplified. In FIGS. 5, 6, 18, and 19, like reference numerals indicate like elements.

Referring to FIGS. 18 and 19, the TFT array substrate 100_19 includes a base substrate 110, a buffer layer 120, a semiconductor layer 130, a first insulating layer 140_b, a first gate electrode 151_b, a second gate electrode 152_b, a second insulating layer 160, a control electrode 171, a first source/drain electrode 172, and a second source/drain electrode 173.

The first insulating layer 140_b is disposed to overlap the semiconductor layer 130 and is patterned to reflect the pattern of the semiconductor layer 130. The first and second gate electrodes 151_b and 152_b are disposed to be placed in contact with the buffer layer 120. That is, the bottom surface of the semiconductor layer 130 and the bottom surface of the first gate electrode 151_b (or the bottom surface of the second gate electrode 152_b) may be placed on the same level. Accordingly, the width of first and second channels ch1_b and ch2_b formed along the sidewalls of the semiconductor layer 130 may be maximized.

As shown in FIG. 18, the top surface of the semiconductor layer 130 is lower than the top surfaces of the first and second gate electrodes 151_b and 152_b. However, the present disclosure is not limited thereto. For example, in an exemplary embodiment of the present disclosure, the top surface of the semiconductor layer 130 and the top surfaces of the first and second gate electrodes 151_b and 152_b are placed on the same level. In other words, the first insulating layer 140_b is disposed on each side of the semiconductor layer 130 to separate the semiconductor layer 130 from the first and second gate electrodes 151_b and 152_b. Thus, the degree of correspondence between the sidewall of the first gate electrode 151_b and the corresponding sidewall of the semiconductor layer 130 may increase. Also, the degree of correspondence between the sideman of the second gate electrode 152_b and the corresponding sidewall of the semiconductor layer 130 may increase. Accordingly, the width of first and second channels ch1_b and ch2_b formed along the sidewalls of the semiconductor layer 130 may be further maximized.

Figure 20:
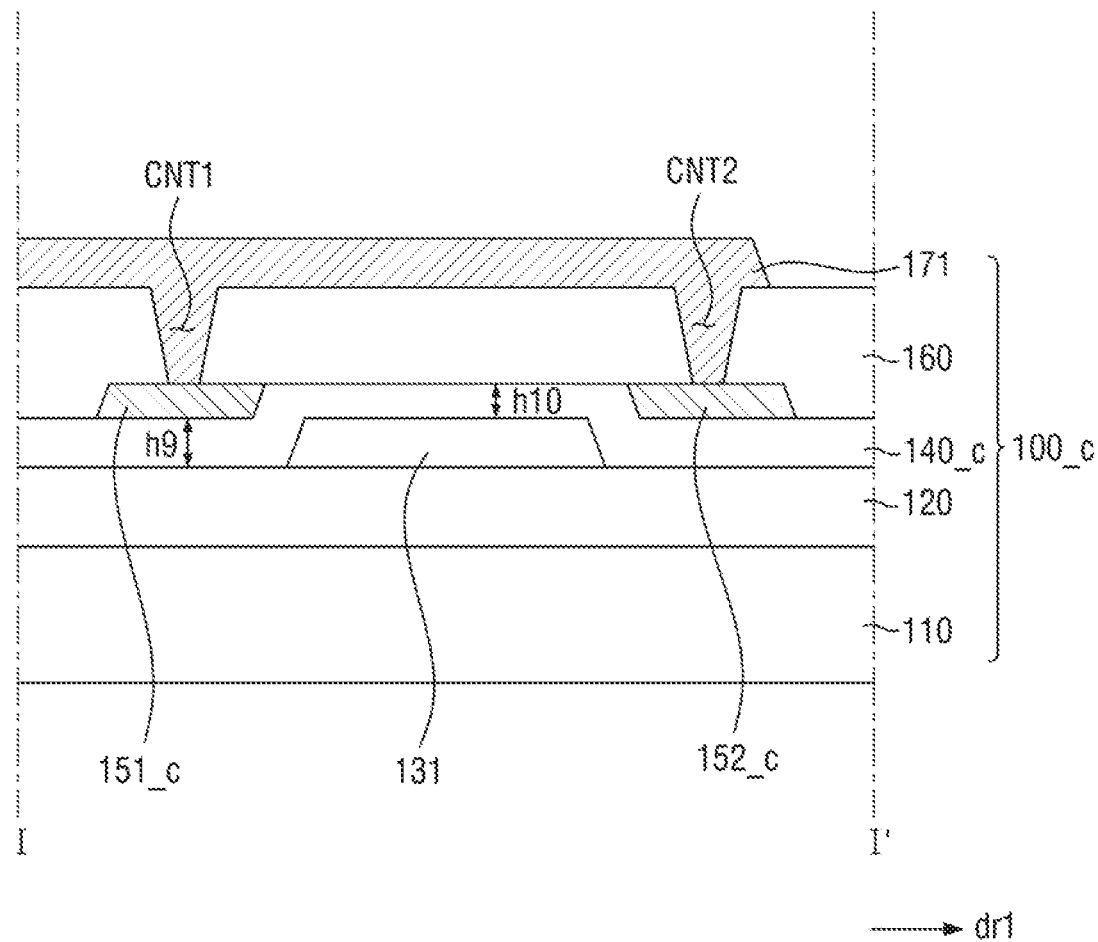
FIG. 20 is a cross-sectional view, taken along line I-I' of FIG. 4, of a TFT array substrate according to an exemplary embodiment of the present disclosure.
Figure 21:
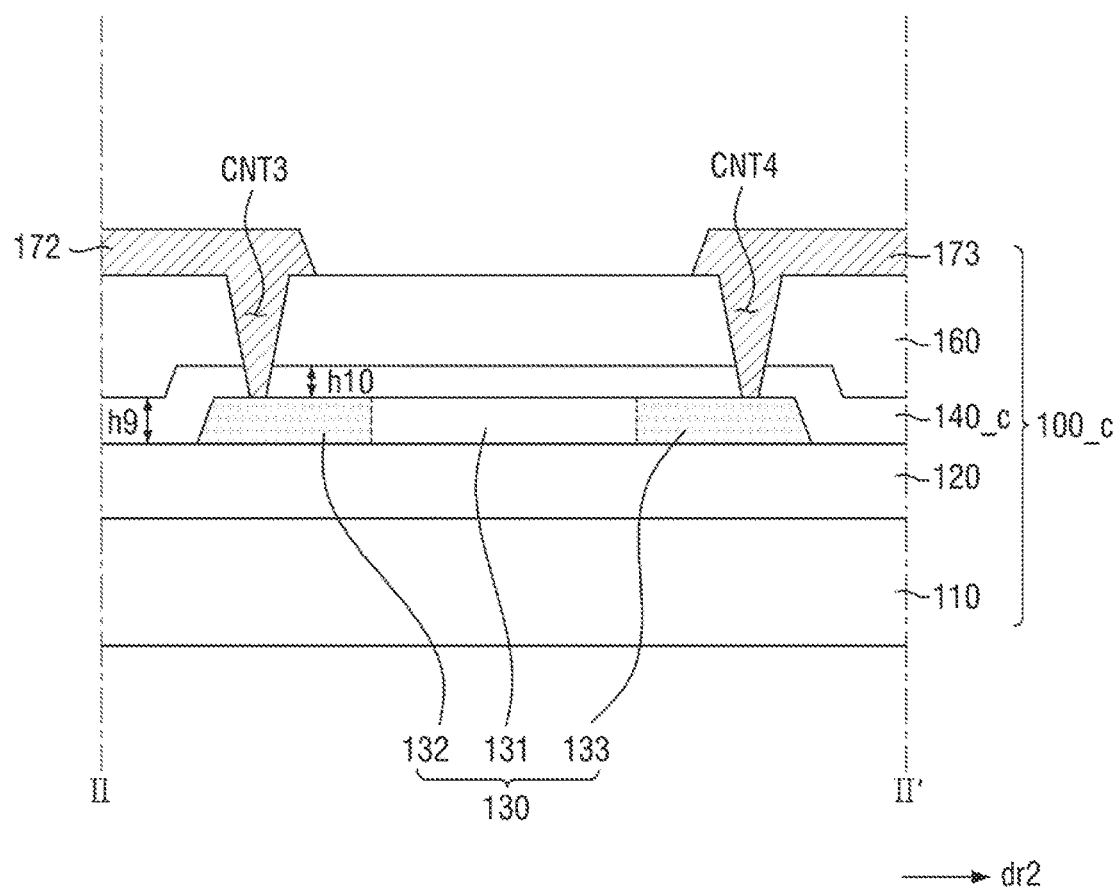
FIG. 21 is a cross-sectional view, taken along line II-II' of FIG. 4, of the TFT array substrate according to the exemplary embodiment of FIG. 20.

FIG. 20 is a cross-sectional view, taken along line I-I' of FIG. 4, of a TFT array substrate according to an exemplary embodiment of the present disclosure, and FIG. 21 is a cross-sectional view, taken along line II-II' of FIG. 4, of the TFT array substrate according to the exemplary embodiment of FIG. 20.

A TFT array substrate 100_c according to the exemplary embodiment of FIGS. 20 and 21 differs from the TFT array substrate 100 according to the exemplary embodiment of FIGS. 5 and 6 in that a first gate electrode 151_c, a second gate electrode 152_c, and a first insulating layer 140_c are more polished than their respective counterparts of FIGS. 5 and 6. Thus, the TFT array substrate 100_c will be hereinafter described, focusing mainly on the first gate electrode 151_c, the second gate electrode 152_c, and the first insulating layer 140_c, and descriptions of the other elements of the TFT array substrate 100_c will be omitted or at least simplified. In FIGS. 5, 6, 20, and 21, like reference numerals indicate like elements.

Referring to FIGS. 20 and 21, the TFT array substrate 100_c includes a base substrate 110, a semiconductor layer 130, the first insulating layer 140_c, the first gate electrode 151_c, the second gate electrode 152_c, a second insulating layer 160, a control electrode 171, a first source/drain electrode 172, and a second source/drain electrode 173.

A thickness h9 of portions of the first insulating layer 140_c overlapped by the first and second gate electrodes 151_c and 152_c may be greater than a thickness h10 of a portion of the first insulating layer 140_c overlapping the semiconductor layer 130. The difference between the thickness h9 and the thickness h10 of FIG. 20 is larger than the difference between the thickness h3 and the thickness h2 of FIG. 5. That is, the more intensely and longer the first gate electrode 151_c, the second gate electrode 152_c, and the first insulating layer 140_c are polished, the thinner the first gate electrode 151_c, the second gate electrode 152_c, and the portion of the first insulating layer 140_c overlapping the semiconductor layer 130 become. As a result, the structure illustrated in FIGS. 20 and 21 may be formed.

Figure 22:
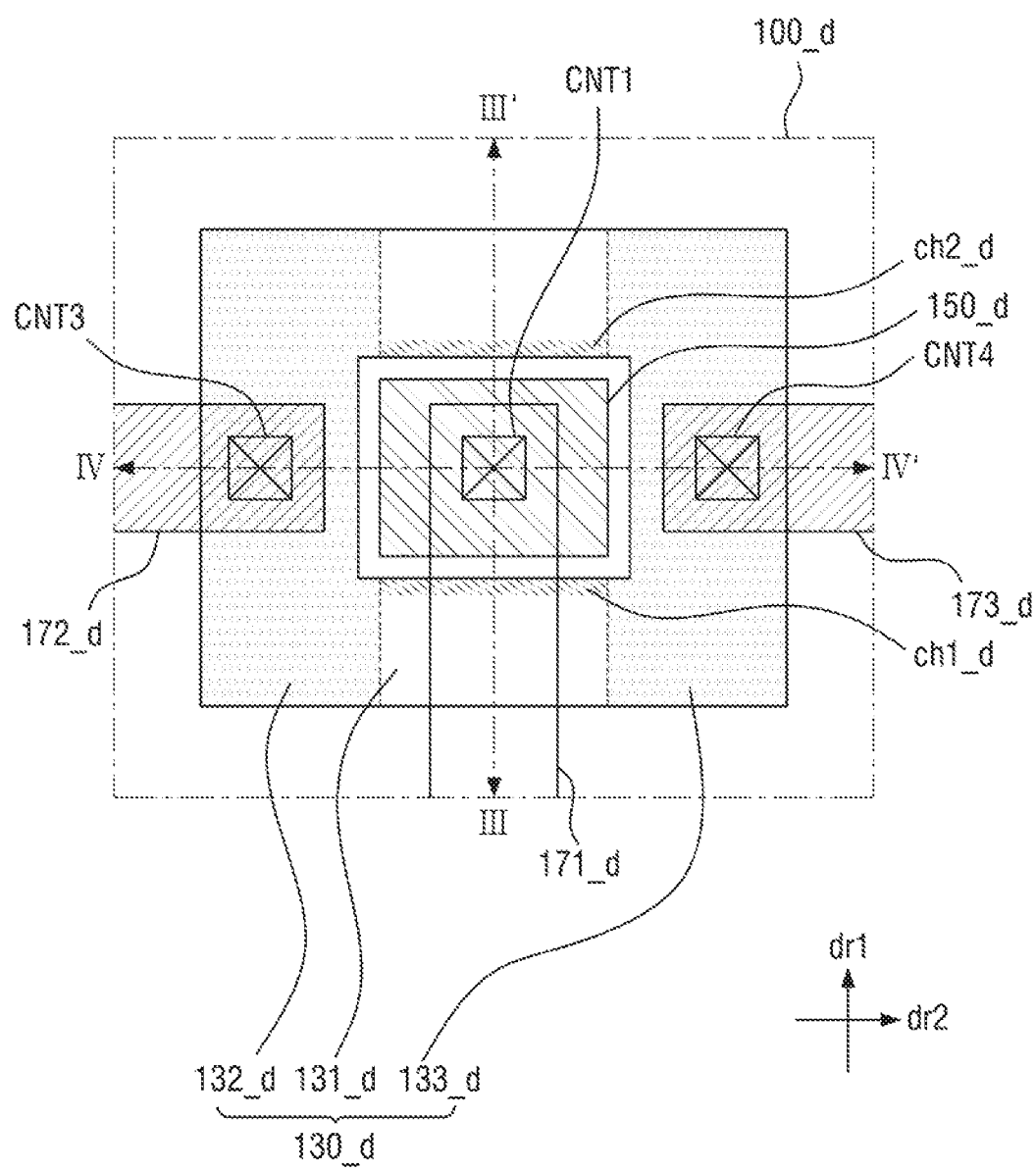
FIG. 22 is a layout view of a TFT array substrate according to an exemplary embodiment of the present disclosure.
Figure 23:
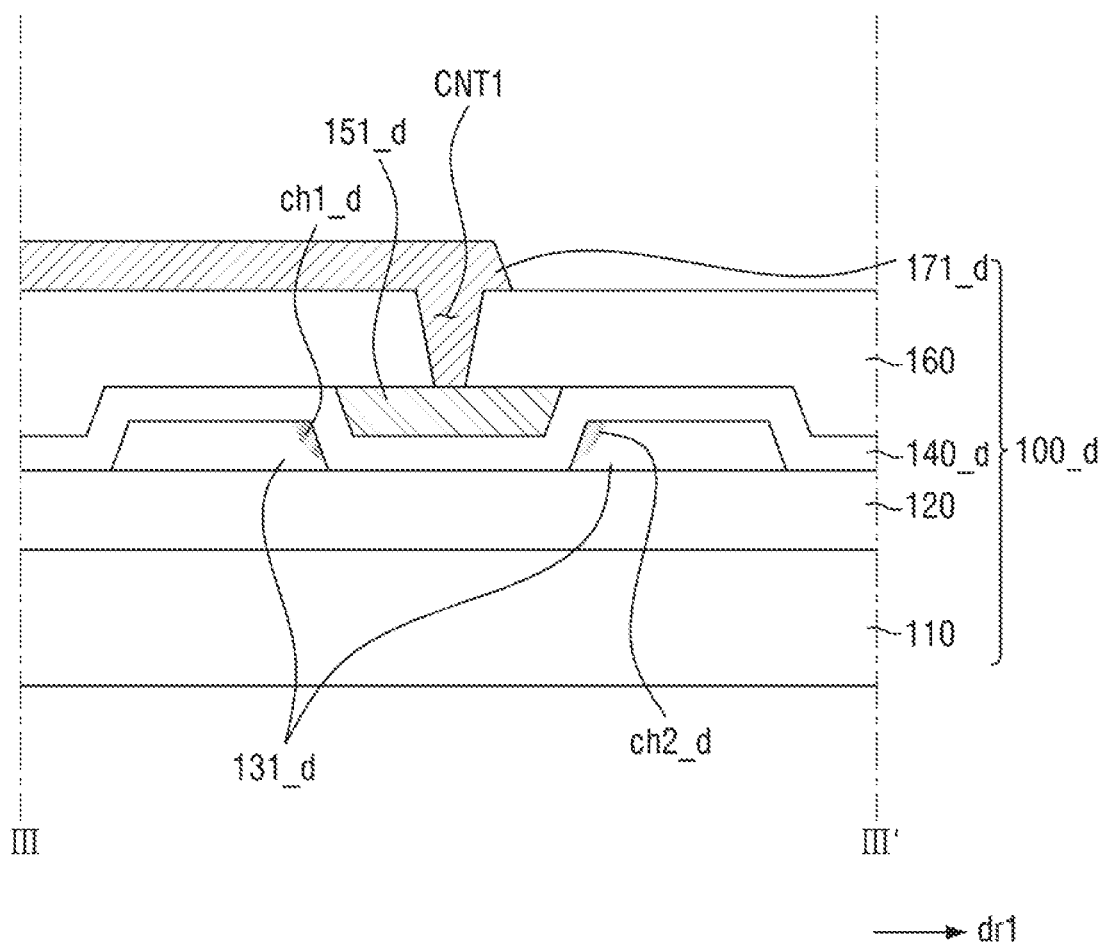
FIG. 23 is a cross-sectional view taken along line III-III' of FIG. 22.
Figure 24:
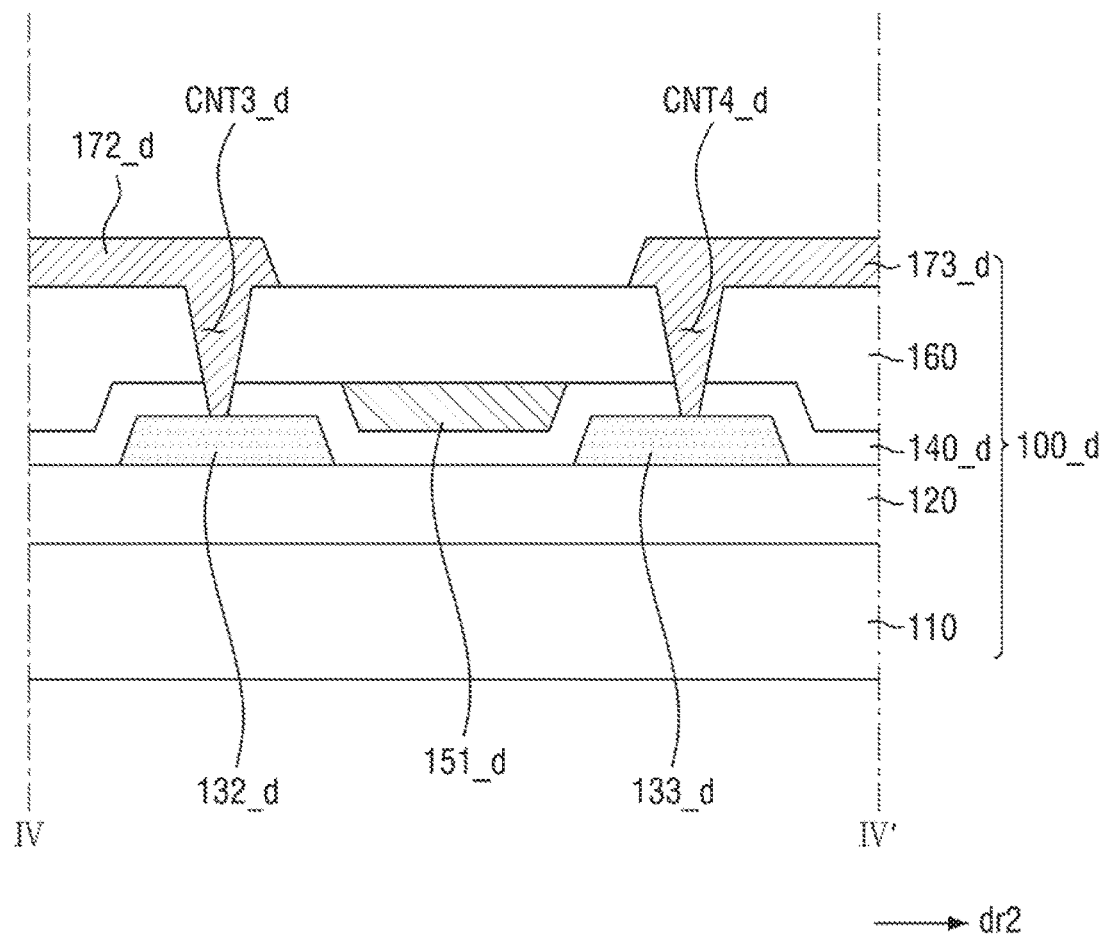
FIG. 24 is a cross-sectional view taken along line IV-IV' of FIG. 22.

FIG. 22 is a layout view of a TFT array substrate according to an exemplary embodiment of the present disclosure, FIG. 23 is a cross-sectional view taken along line III-III' of FIG. 22, and FIG. 24 is a cross-sectional view taken along line IV-IV' of FIG. 22.

A TFT array substrate 100_d according to the exemplary embodiment of FIGS. 22 through 24 differs from the TFT array substrate 100 according to the exemplary embodiment of FIGS. 4 through 6 in that a semiconductor layer 130_d is formed to have an opening at the center thereof. Thus, the TFT array substrate 100_d will be hereinafter described, focusing mainly on the semiconductor layer 130_d, and descriptions of the other elements of the TFT array substrate 100_d will be omitted or at least simplified. In FIGS. 4 through 6 and 22 through 24, like reference numerals indicate like elements.

Referring to FIGS. 22 through 24, the TFT array substrate 100_d includes a base substrate 110, the semiconductor layer 130_d, a first insulating layer 140_d, a first gate electrode 151_d, a second insulating layer 160, a control electrode 171_d, a first source/drain electrode 172_d, and a second source/drain electrode 173_d.

The semiconductor layer 130_d may be formed to have an opening at the center thereof. The first gate electrode 151_d may be disposed in the opening of the semiconductor layer 130_d. Accordingly, the first gate electrode 151_d may form a first channel ch1_d on one sidewall of the opening of the semiconductor layer 130_d and may form a second channel ch2_d on the other sidewall of the opening of the semiconductor layer 130_d, when an on-level gate signal is provided to the first gate electrode 151_d. That is, two channels, i.e., the first and second channels ch1_d and ch2_d, may be formed along the sidewalk of the semiconductor layer 130_d by controlling a single gate electrode, i.e., the first gate electrode 151_d.

Figure 25:
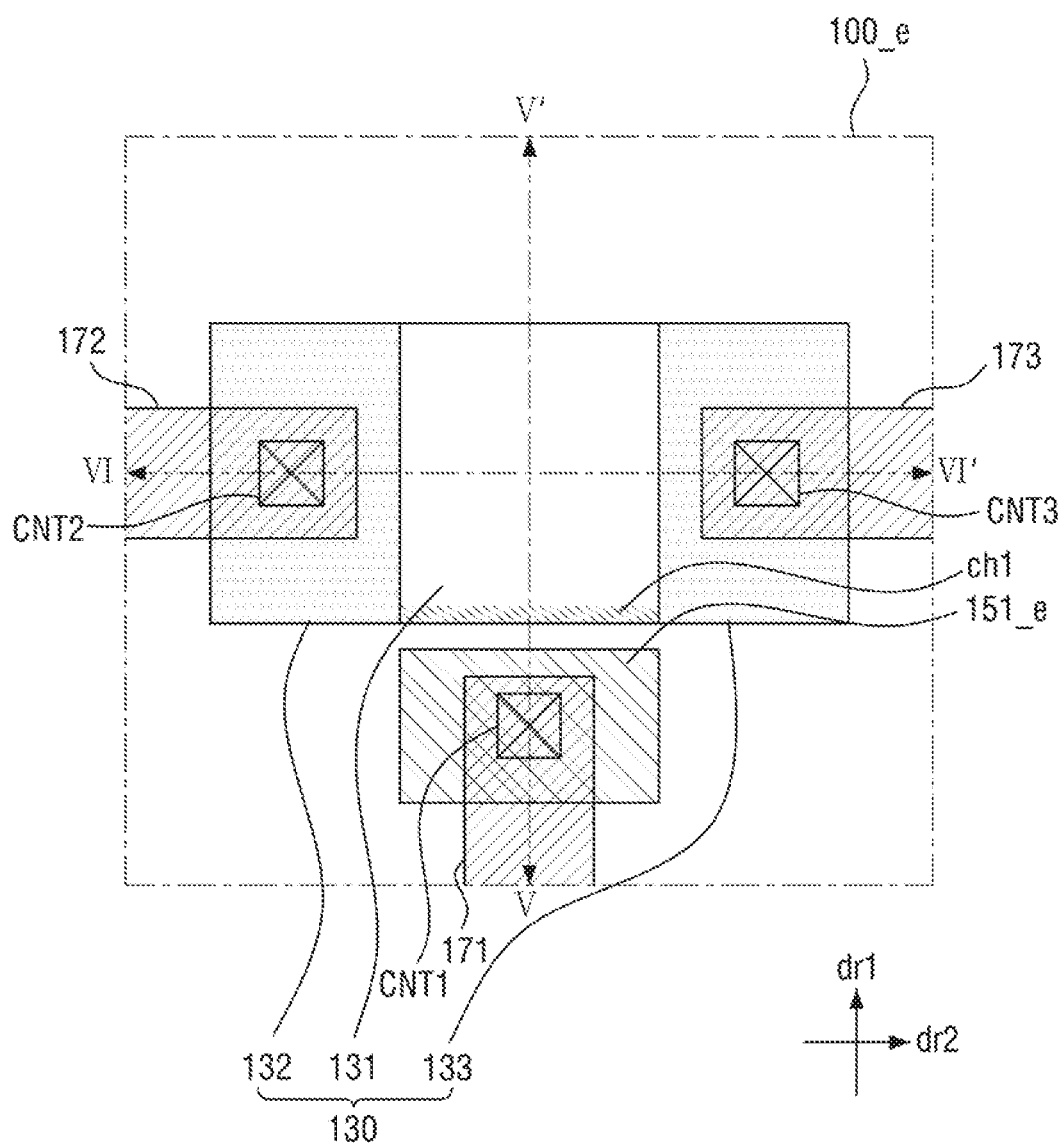
FIG. 25 is a layout view of a TFT array substrate according to an exemplary embodiment of the present disclosure.
Figure 26:
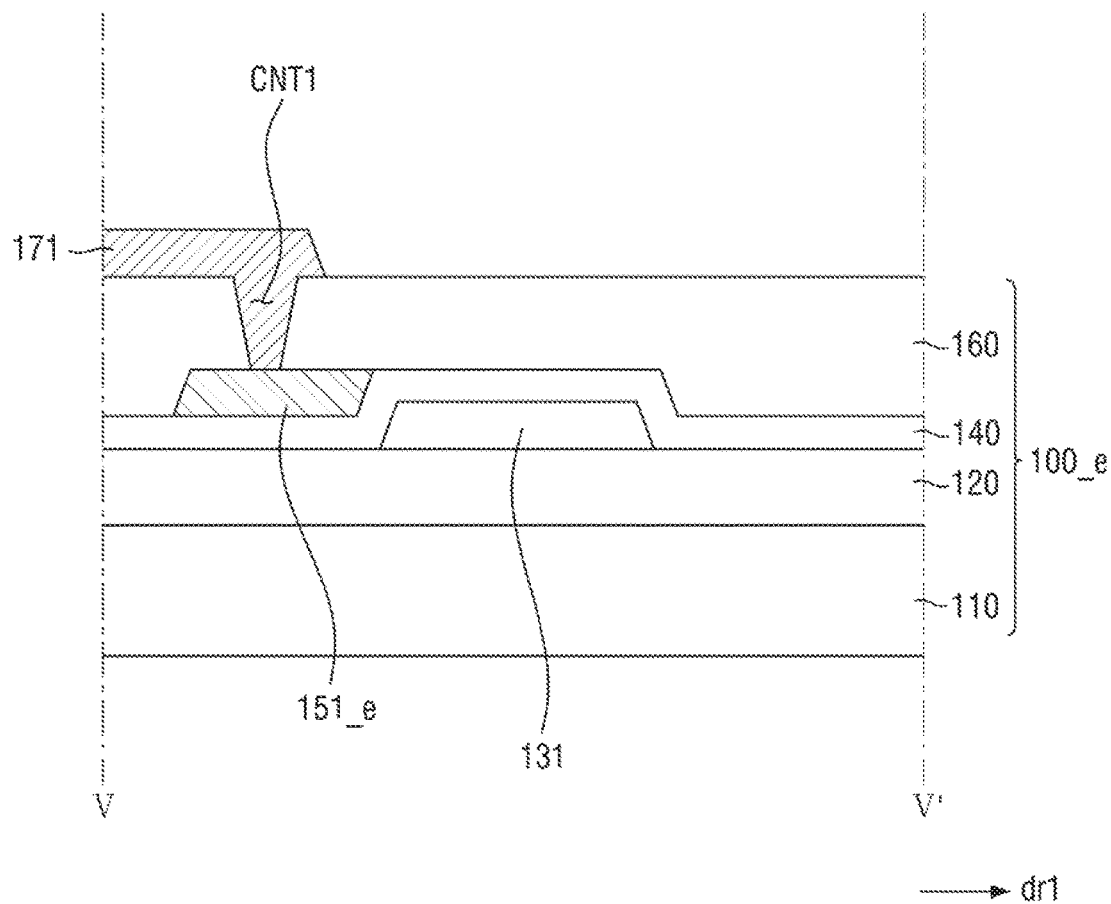
FIG. 26 is a cross-sectional view taken along line V-V' of FIG. 25.
Figure 27:
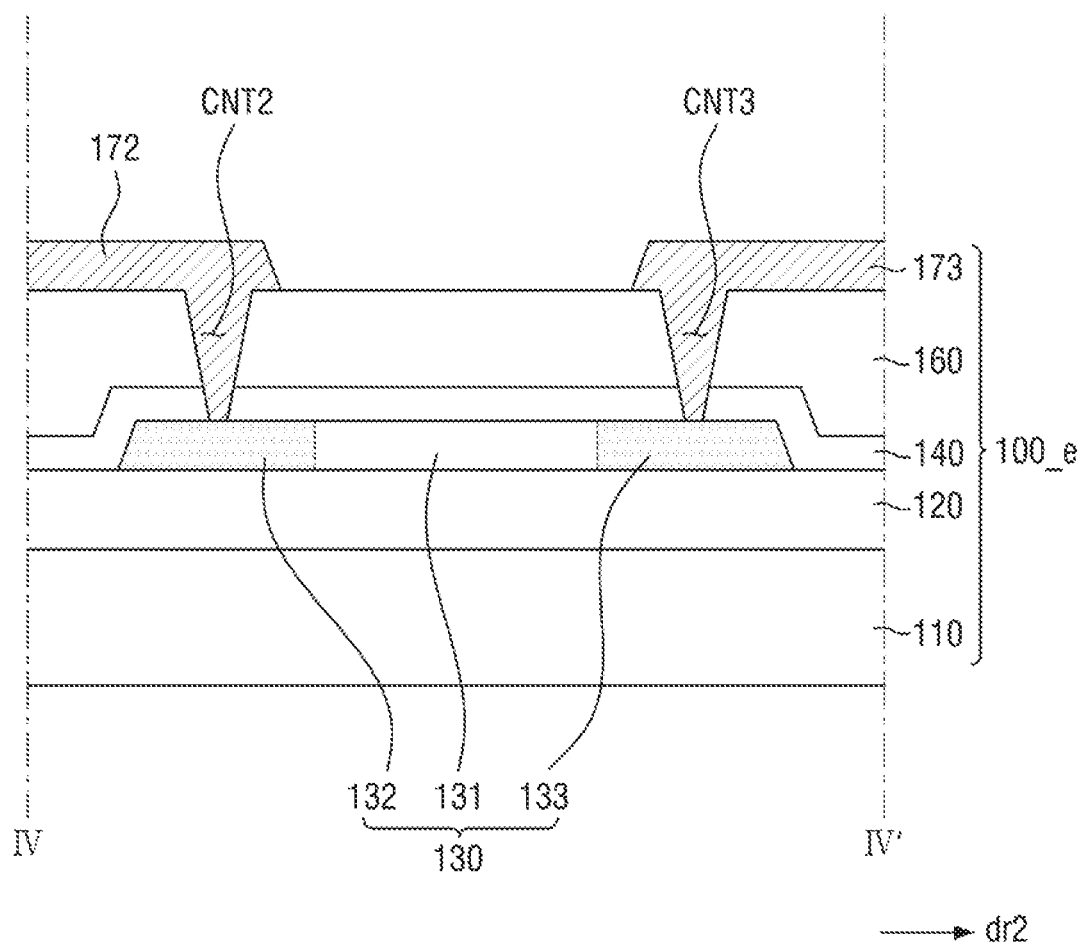
FIG. 27 is a cross-sectional view taken along line VI-VI' of FIG. 25.

FIG. 25 is a layout view of a TFT array substrate according to an exemplary embodiment of the present disclosure, FIG. 26 is a cross-sectional view taken along line V-V' of FIG. 25, and FIG. 27 is a cross-sectional view taken along line VI-VI' of FIG. 25.

A TFT array substrate 100_e according to the exemplary embodiment of FIGS. 25 through 27 differs from the TFT array substrate 100 according to the exemplary embodiment of FIGS. 4 through 6 in that the second gate electrode 152 of FIG. 4 is not provided. Thus, the TFT array substrate 100_e will be hereinafter described, focusing mainly on a first gate electrode 151_e, and descriptions of the other elements of the TFT array substrate 100_e will be omitted or at least simplified. In FIGS. 4 through 6 and 25 through 27, like reference numerals indicate like elements.

Referring to FIGS. 25 through. 27, the TFT array substrate 100_e includes a base substrate 110, a semiconductor layer 130, a first insulating layer 140, the first gate electrode 151_e, a second insulating layer 160, a source electrode, a control electrode 171, a first source/drain electrode 172, and a second source/drain electrode 173.

The first gate electrode 151_e is disposed adjacent to one side of the semiconductor layer 130. In the TFT array substrate 100_e, the second gate electrode 152 of FIG. 4 is not provided. Accordingly, a first channel ch1 may be formed in the semiconductor layer 130 when an on-level gate signal is provided to the first gate electrode 151_e, but the second channel ch2 of FIG. 4 may not be formed. In accordance with the exemplary embodiment of FIGS. 25 through 27, a TFT having only the first channel ch1 may be fabricated.

Figure 28:
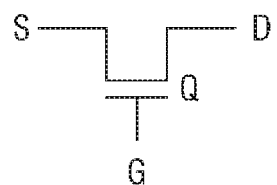
FIG. 28 is an equivalent circuit diagram of a TFT according to the exemplary embodiment of FIGS. 25 through 27.

FIG. 28 is an equivalent circuit diagram of a TFT according to the exemplary embodiment of FIGS. 25 through 27.

Referring to FIG. 28, the TFT according to the exemplary embodiment of FIGS. 25 through 27 may correspond to a switching transistor Q having a single control line G, a single input line S, and a single output line D.

Figure 29:
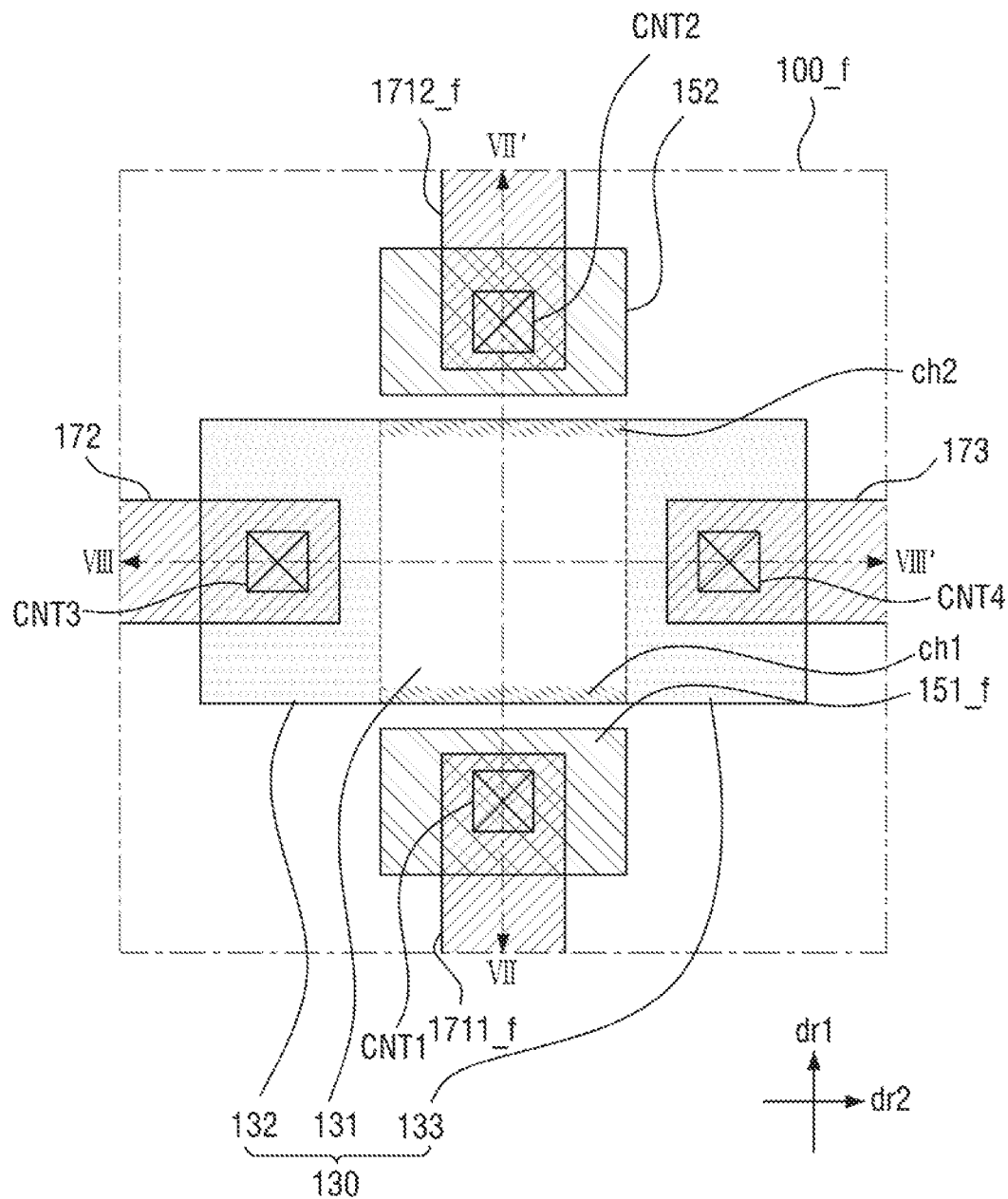
FIG. 29 is a layout view of a TFT array substrate according to an exemplary embodiment of the present disclosure.
Figure 30:
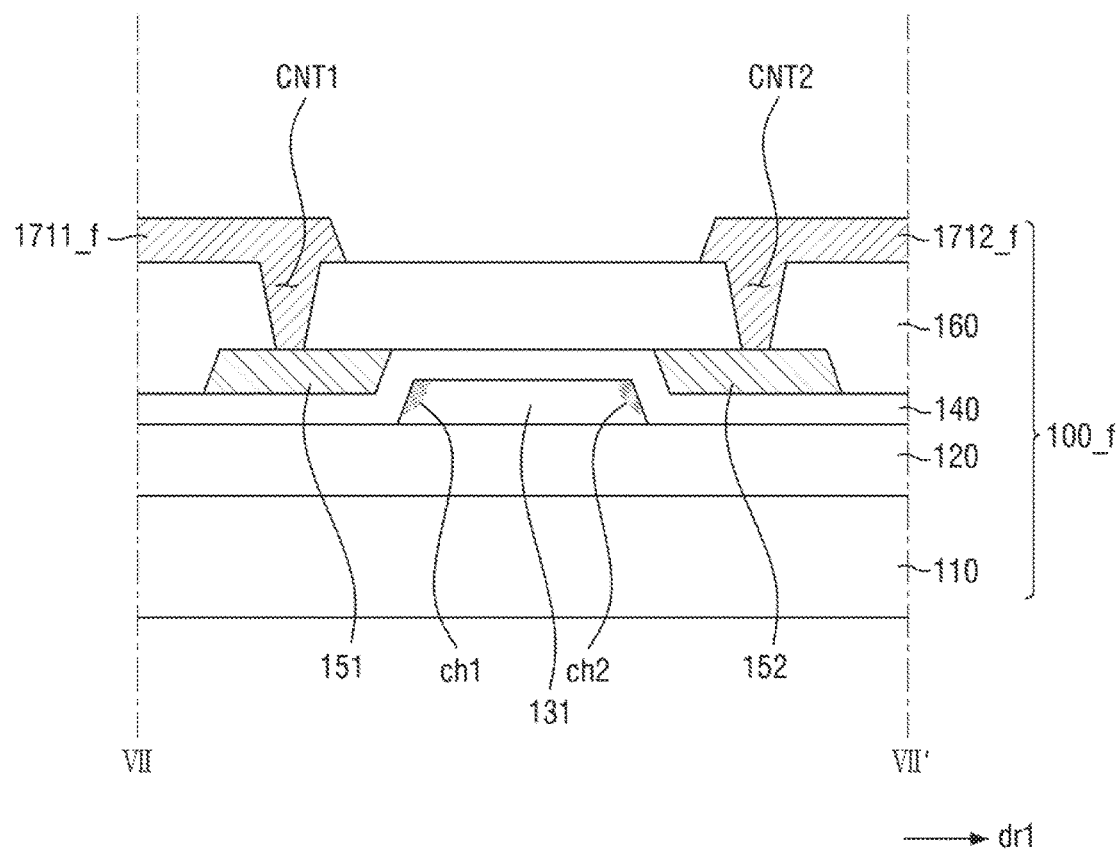
FIG. 30 is a cross-sectional view taken along line VII-VII' of FIG. 29.
Figure 31:
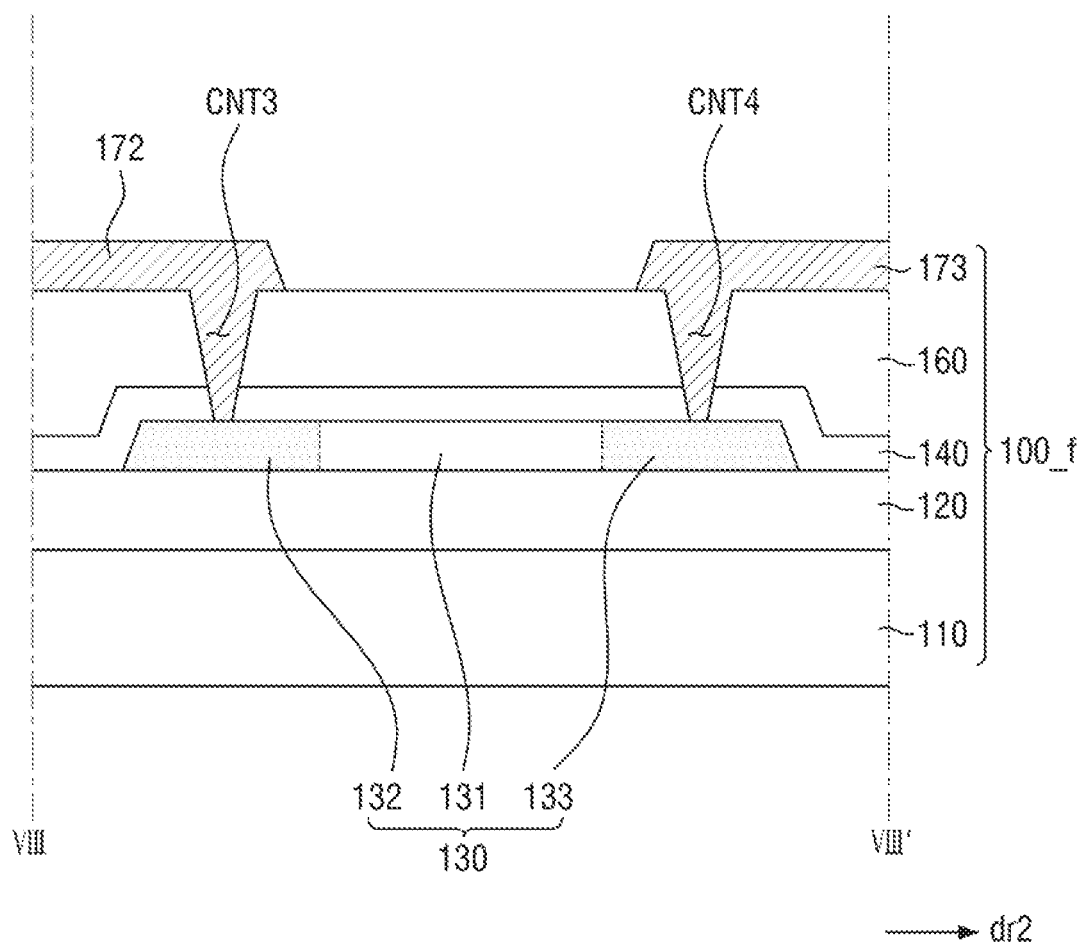
FIG. 31 is a cross-sectional view taken along line VIII-VIII' of FIG. 29.

FIG. 29 is a layout view of a TFT array substrate according to an exemplary embodiment of the present disclosure, FIG. 30 is a cross-sectional view taken along line VII-VII' of FIG. 29, and FIG. 31 is a cross-sectional view taken along line VIII-VIII' of FIG. 29.

A TFT array substrate 100_f according to the exemplary embodiment of FIGS. 29 through 31 differs from the TFT array substrate 100 according to the exemplary embodiment of FIGS. 4 through 6 in that it includes first and second control electrodes 1711_f and 1712_f. Thus, the TFT array substrate 100_f will be hereinafter described, focusing mainly on the first and second control electrodes 1711_f and 1712_f, and descriptions of the other elements of the TFT array substrate 100_f will be omitted or at least simplified. In FIGS. 4 through 6 and 29 through 31, like reference numerals indicate like elements.

Referring to FIGS. 29 through 31, the TFT array substrate 100_f includes a base substrate 110, a semiconductor layer 130, a first insulating layer 140, a first gate electrode 151, a second insulating layer 160, the first control electrode 1711_f, the second control electrode 1712_f, a first source/drain electrode 172, and a second source/drain electrode 173.

The first gate electrode 151 is connected to the first control electrode 1711_f via a first contact hole CNT1, which penetrates the second insulating layer 160. The second gate electrode 152 is connected to the second control electrode 1712_f via a second contact hole CNT2, which penetrates the second insulating layer 160. The first and second gate electrodes 151 and 152 may be provided with different voltages. That is, the gate signal provided to the first control electrode 1711_f may be different from the gate signal provided to the second control electrode 1712_f.

In a case where an on-level voltage is provided to the first gate electrode 151, a first channel ch1 is formed on a sidewall of the semiconductor layer 130 corresponding to part of the channel region 131 adjacent to the first gate electrode 151, but a second channel ch2 is not affected by the on-level voltage provided to the first gate electrode 151. Similarly, in a case where an on-level voltage is provided to the second gate electrode 152, the second channel ch2 is formed on a sidewall of the semiconductor layer 130 corresponding to part of the channel region 131 adjacent to the second gate electrode 152, but the first channel ch1 is not affected by the on-level voltage provided to the second gate electrode 152. Accordingly, the first and second channels ch1 and ch2, which are formed by the first and second gate electrodes 151 and 152, respectively, may be controlled independently. In other words, two channels, i.e., the first and second channels ch1 and ch2, may be formed using a single semiconductor layer, i.e., the semiconductor layer 130.

Figure 32:
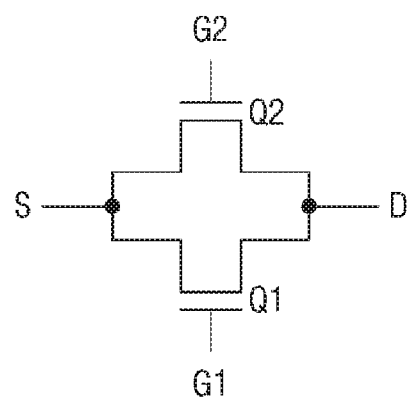
FIG. 32 is an equivalent circuit diagram of a TFT according to the exemplary embodiment of FIGS. 29 through 31.

FIG. 32 is an equivalent circuit diagram of a TFT according to the exemplary embodiment of FIGS. 29 through 31.

Referring to FIG. 32, the TFT according to the exemplary embodiment of FIGS. 29 through 31 may correspond to two switching transistors, i.e., first and second switching transistors Q1 and Q2. The first switching transistor Q1 may be controlled by a first control line G1, and the second switching transistor Q2 may be controlled by a second control line G2. The first and second switching transistors Q1 and Q2 may share the same input line, i.e., an input line S, and the same output line, i.e., an output line D.

Figure 33:
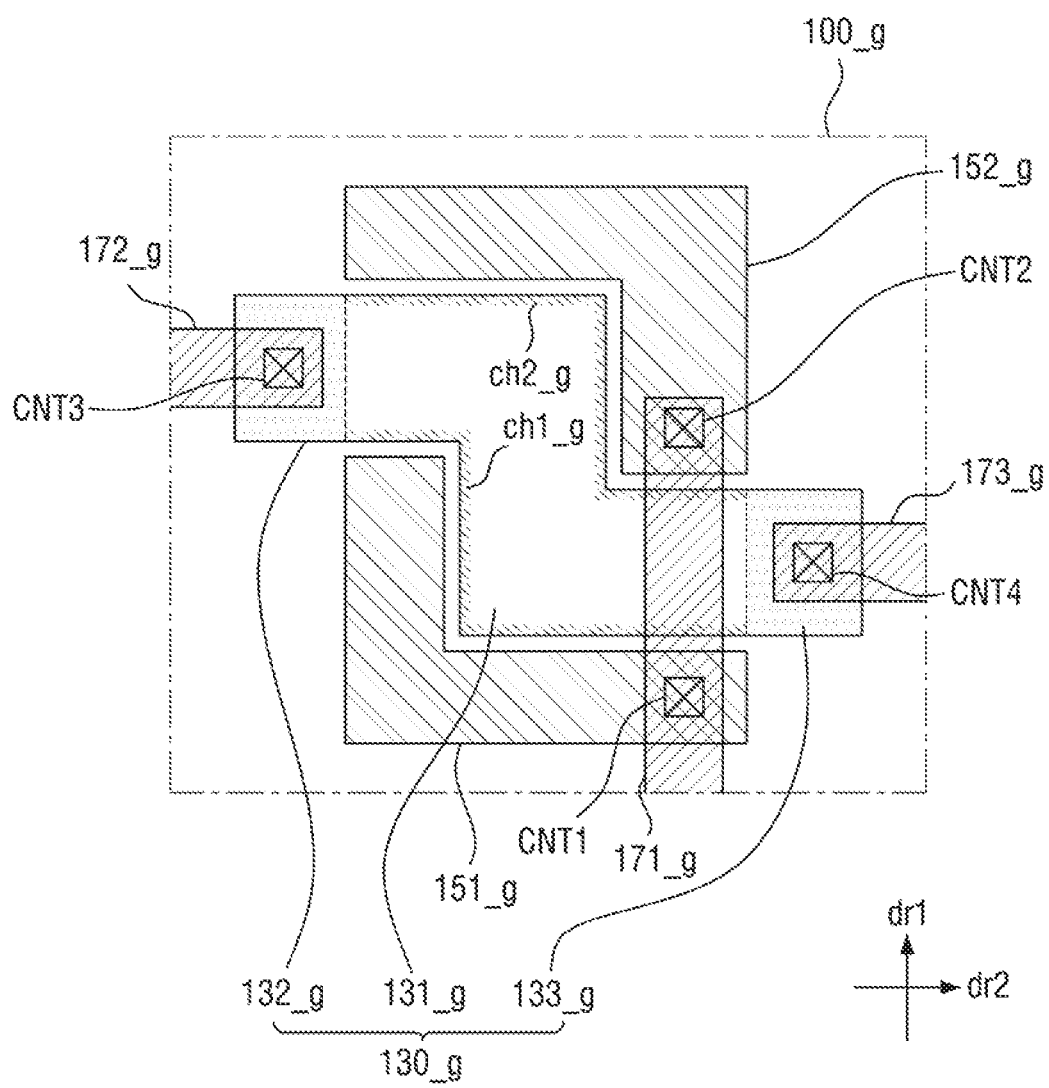
FIG. 33 is a layout view of a TFT array substrate according to an exemplary embodiment of the present disclosure.

FIG. 33 is a layout view of a TFT array substrate according to an exemplary embodiment of the present disclosure.

A TFT array substrate 100_g according to the exemplary embodiment of FIG. 33 differs from the TFT array substrate 100 according to the exemplary embodiment of FIG. 4 in that it includes a zigzag-shaped semiconductor layer 130_g. Thus, the TFT array substrate 100_g will be hereinafter described, focusing mainly on the semiconductor layer 130_g, and descriptions of the other elements of the TFT array substrate 100_g will be omitted or at least simplified. In FIGS. 4 and 33, like reference numerals indicate like elements.

Referring to FIG. 33, the semiconductor layer 130_g may be formed in a zigzag shape, and first and second source/drain regions 132_g and 133_g may be formed near both ends of a channel region 131_g, which is formed in a zigzag shape. First and second gate electrodes 151_g and 152_g may be formed in a bent shape, conforming to the zigzag shape of the semiconductor layer 130_g. Both the first and second gate electrodes 151_g and 152_g may be connected to a control electrode 171_g. Accordingly, first and second channels ch1_g and ch2_g may also be formed in a zigzag shape in the semiconductor layer 130_g, when an on-level gate signal is provided to the first and second gate electrodes 151_g and 152_g.

Figure 34:
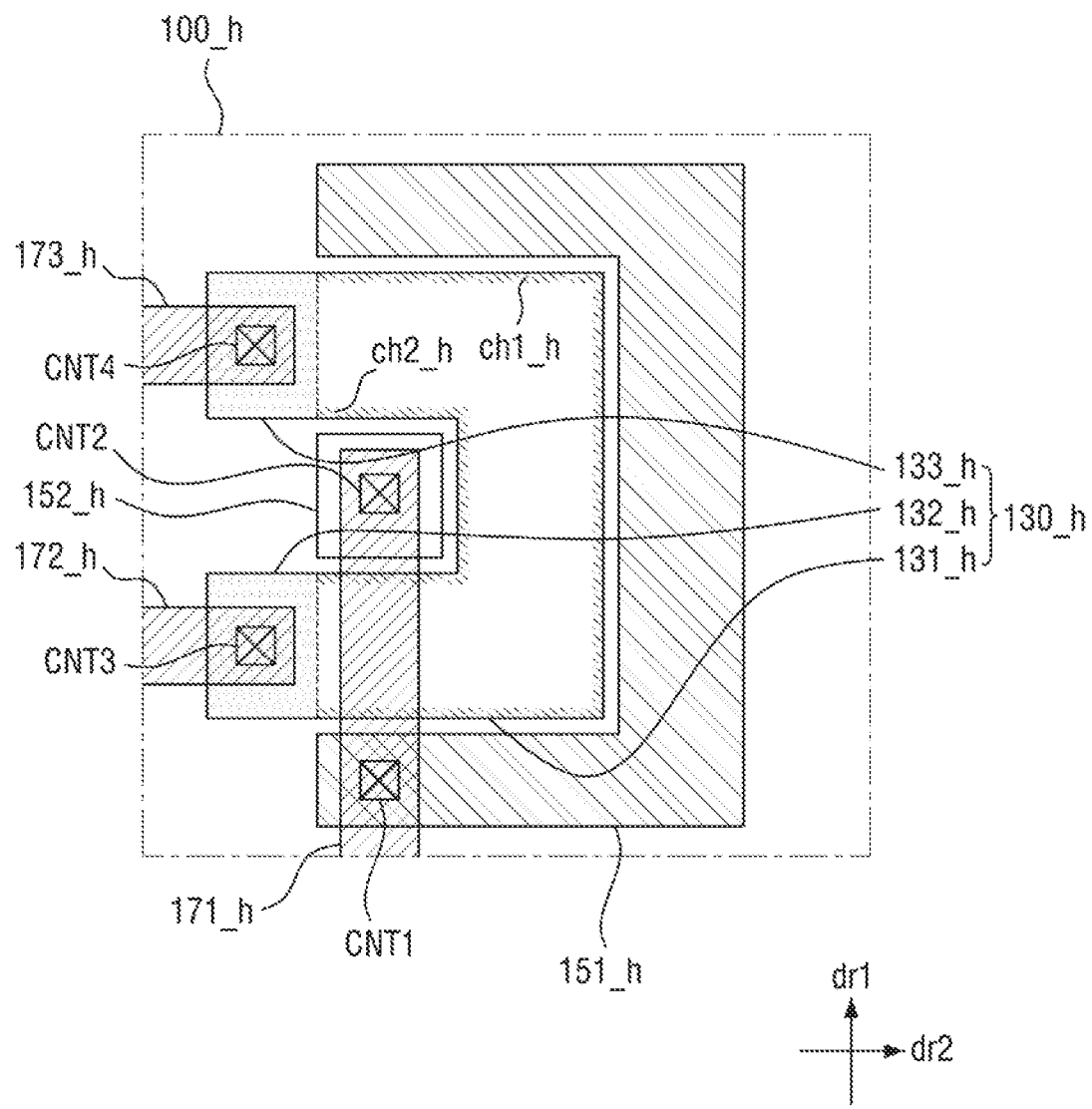
FIG. 34 is a layout view of a TFT array substrate according to an exemplary embodiment of the present disclosure.

FIG. 34 is a layout view of a TFT array substrate according to an exemplary embodiment of the present disclosure.

A TFT array substrate 100_h according to the exemplary embodiment of FIG. 34 differs from the TFT array substrate 100 according to the exemplary embodiment of FIG. 4 in that it includes a U-shaped semiconductor layer 130_h. Thus, the TFT array substrate 100_h will be hereinafter described, focusing mainly on the semiconductor layer 130_h, and descriptions of the other elements of the TFT array substrate 100_h will be omitted or at least simplified. In FIGS. 4 and 34, like reference numerals indicate like elements.

Referring to FIG. 34, the semiconductor layer 130_h may be formed in a "U" shape, and first and second source/drain regions 132_h and 133_h may be formed near both ends of a channel region 131_h, which is formed in a "U" shape. First and second gate electrodes 151_h and 152_h may be formed in a U shape and a rectangular shape, respectively, confirming to the "U" shape of the semiconductor layer 130_h. Both the first and second gate electrodes 151_h and 152_h may be connected to a control electrode 171_h. Accordingly, first and second channels ch1_h and ch2_h may also be formed in a "U" shape and may have different lengths, when an on-level gate signal is provided to the first and second gate electrodes 151_h and 152_h.

Figure 35:
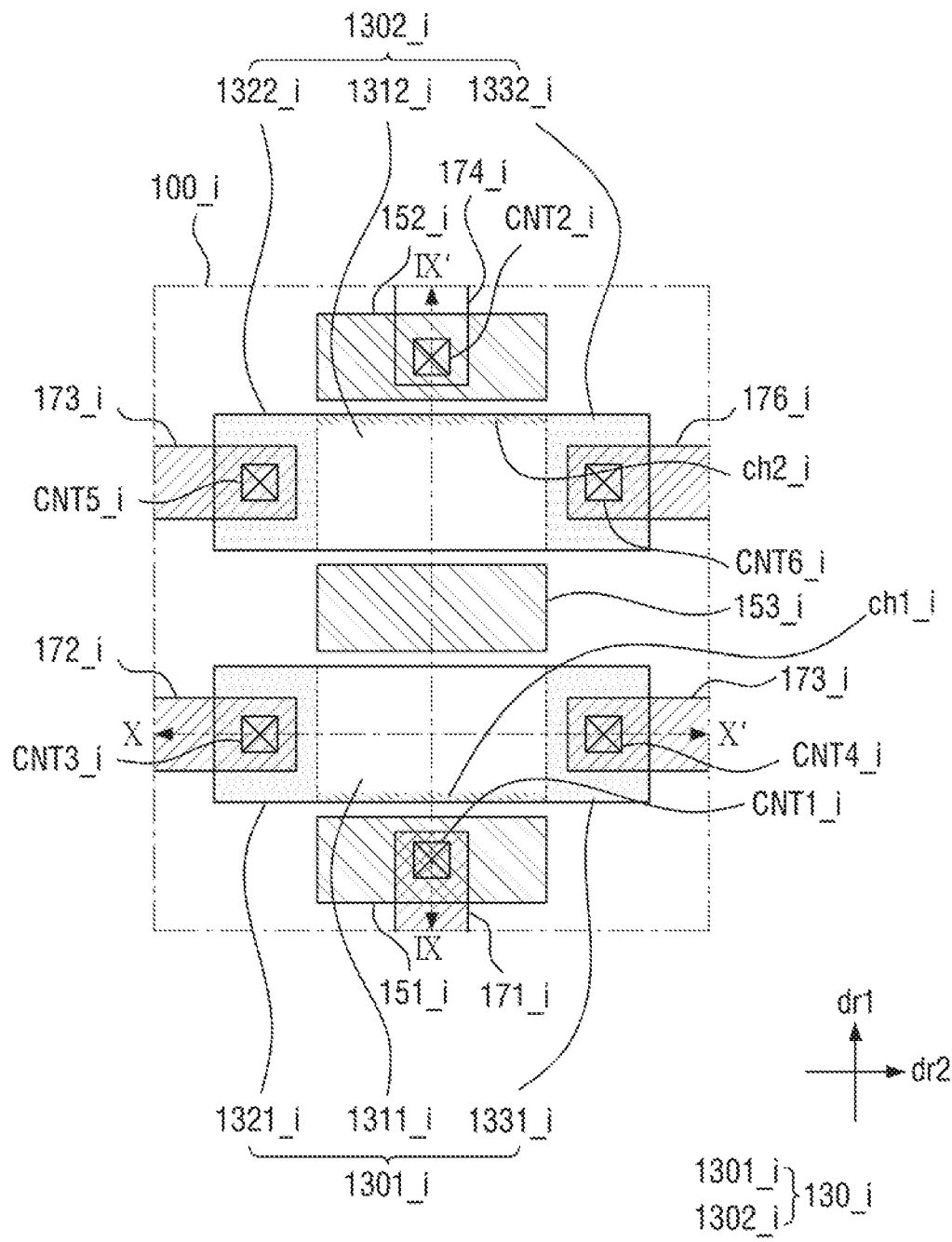
FIG. 35 is a layout view of a TFT array substrate according to an exemplary embodiment of the present disclosure.
Figure 36:
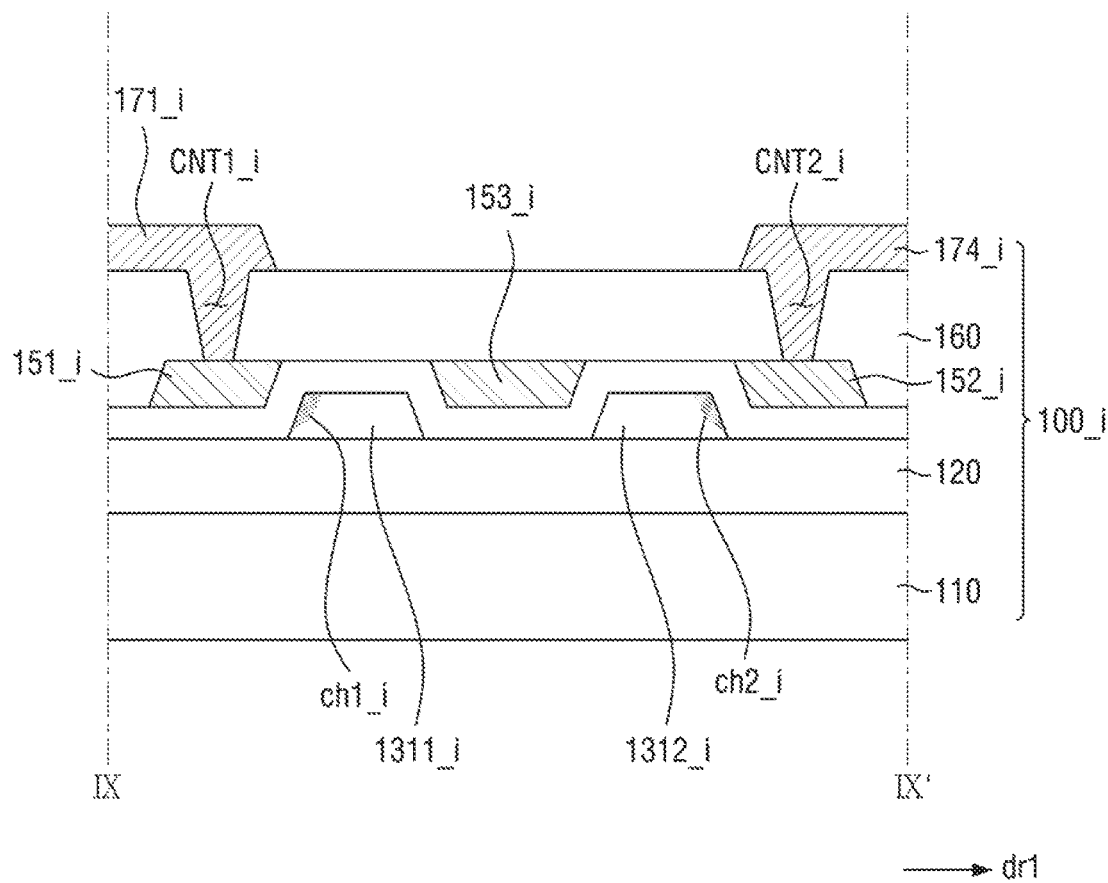
FIG. 36 is a cross-sectional view taken along line IX-IX' of FIG. 35.
Figure 37:
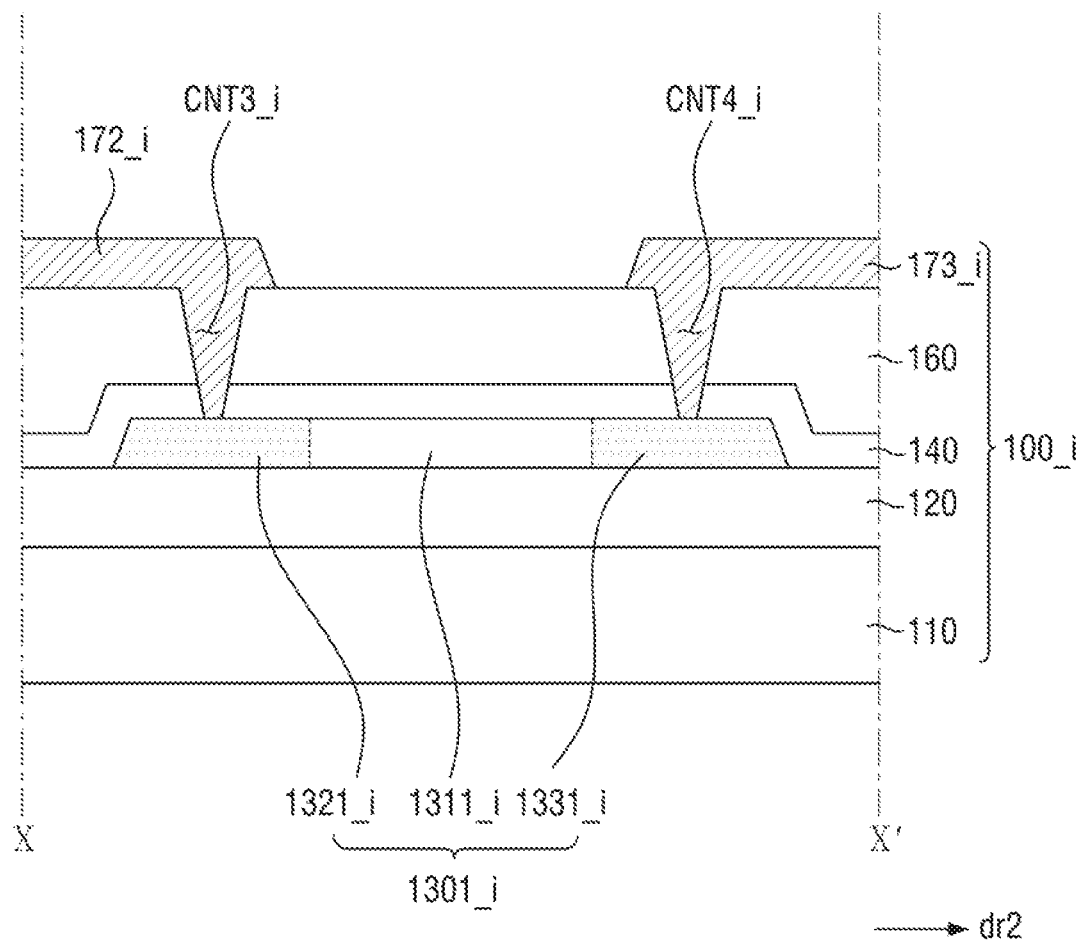
FIG. 37 is a cross-sectional view taken along line X-X' of FIG. 35.

FIG. 35 is a layout view of a TFT array substrate according to an exemplary embodiment of the present disclosure, FIG. 36 is a cross-sectional view taken along line IX-IX' of FIG. 35, and FIG. 37 is a cross-sectional view taken along line X-X' of FIG. 35.

A TFT array substrate 100_i according to the exemplary embodiment of FIGS. 35 through 37 differs from the TFT array substrate 100 according to the exemplary embodiment of FIGS. 4 through 6 in that it further includes a first semiconductor pattern 1301_i, a second semiconductor pattern 1302_i, a first control electrode 171_i, a second control electrode 174_i, a third source/drain electrode 175_i, a fourth source/drain electrode 176_i, a dummy gate electrode 153_i, first, second, third, and fourth source/drain regions 1321_i, 1331_i, 1322_i, and 1332_i, a first channel region 1311_i, a second Channel region 1312_i, and first, second, third, fourth, fifth, and sixth contact holes CNT1_i, CNT2_i, CNT3_i, CNT4_i, CNT5_i, and CNT6_i. Thus, the TFT array substrate 100_i will be hereinafter described, focusing mainly on the differences with the TFT array substrate 100 according to the exemplary embodiment of FIGS. 4 through 6, and descriptions of the other elements of the TFT array substrate 100_i will be omitted or at least simplified. In FIGS. 4 through 6 and 35 through 37, like reference numerals indicate like elements.

Referring to FIGS. 35 through 37, the semiconductor layer 130_j includes the first and second semiconductor patterns 1301_i and 1302_i. The first semiconductor pattern 1301_i includes the first source/drain region 1321_i, which is connected to the first source/drain electrode 172_i via the third contact hole CNT3_i, the first channel region 1311_i, and the second source/drain region 1331_i, which is connected to the second source/drain electrode 173_i via the fourth contact hole CNT4_i. A first gate electrode 151_i is connected to the first control electrode 171_i via the first contact hole CNT1_i, is disposed near the first channel region 1311_i, and induces the formation of a first channel ch1_i. That is, the first channel ch1_i may be formed on a sidewall of the first semiconductor pattern 1301_i corresponding to part of the first channel region 1311_i adjacent to the first gate electrode 151_i, when an on-level gate signal is provided to the first gate electrode 151_i.

The second semiconductor pattern 1302_i includes the third source/drain region 1322_i, which is connected to the third source/drain electrode 175_i via the fifth contact hole CNT5_i, the second channel region 131_i, and the fourth source/drain region 1332_i, which is connected to the fourth source/drain electrode 176_i via the sixth contact hole CNT6_i. A second gate electrode 152_i is connected to the second control electrode 174_i via the second contact hole CNT2_i, is disposed near the second channel region 1312_i, and induces the formation of a second channel ch2_i. That is, the second channel ch2_i may be formed on a side wall of the second semiconductor pattern 1302_i corresponding to part of the second channel region 1312_i adjacent to the second gate electrode 152_i, when an on-level gate signal is provided to the second gate electrode 152_i.

The dummy gate electrode 153_i may be disposed between the first and second channel regions 1311_i and 1312_i. Since the dummy gate electrode 153_i is not connected to any element capable of applying a voltage, no channels may be formed in the first and second channel regions 1311_i and 1312_i near the dummy gate electrode 153_i.

Figure 38:
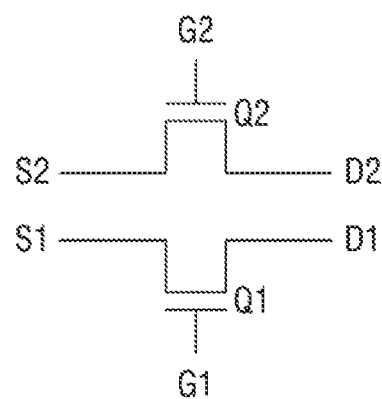
FIG. 38 is an equivalent circuit diagram of a TFT according to the exemplary embodiment of FIGS. 35 through 37.

FIG. 38 is an equivalent circuit diagram of a TFT according to the exemplary embodiment of FIGS. 35 through 37.

Referring to FIG. 38, the TFT according to the exemplary embodiment of FIGS. 35 through 37 may correspond to first and second switching transistors Q1 and Q2. The first switching transistor Q1 may be controlled by a first control line G1 and may have a first input line S1 and a first output line D1. The second switching transistor Q2 may be controlled by a second control line G2 and may have a second input line S2 and a second output line D2. That is, the first and second switching transistors Q1 and Q2 may be completely independent from each other.

Figure 39:
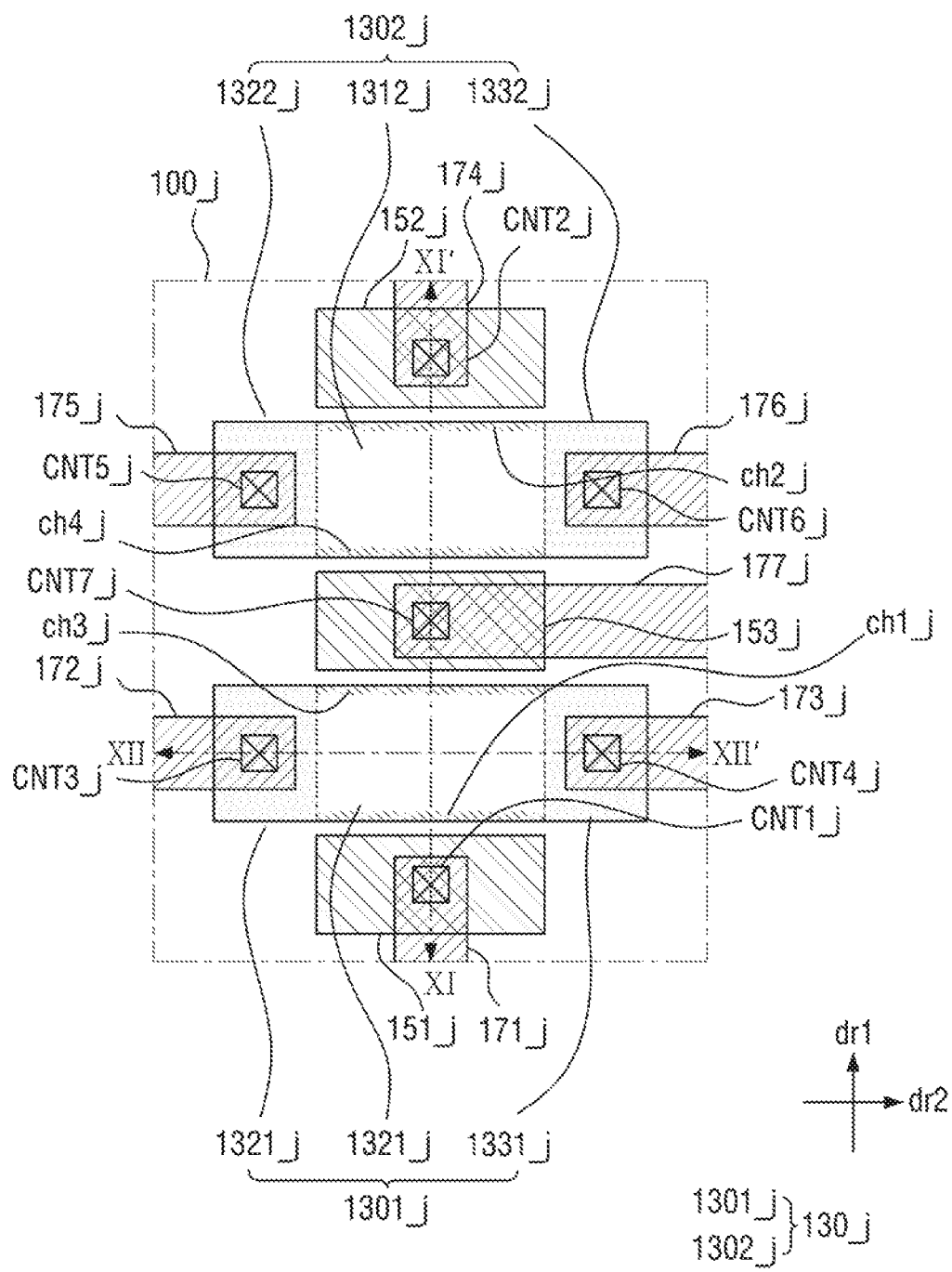
FIG. 39 is a layout view of a TFT array substrate according to an exemplary embodiment of the present disclosure.
Figure 40:
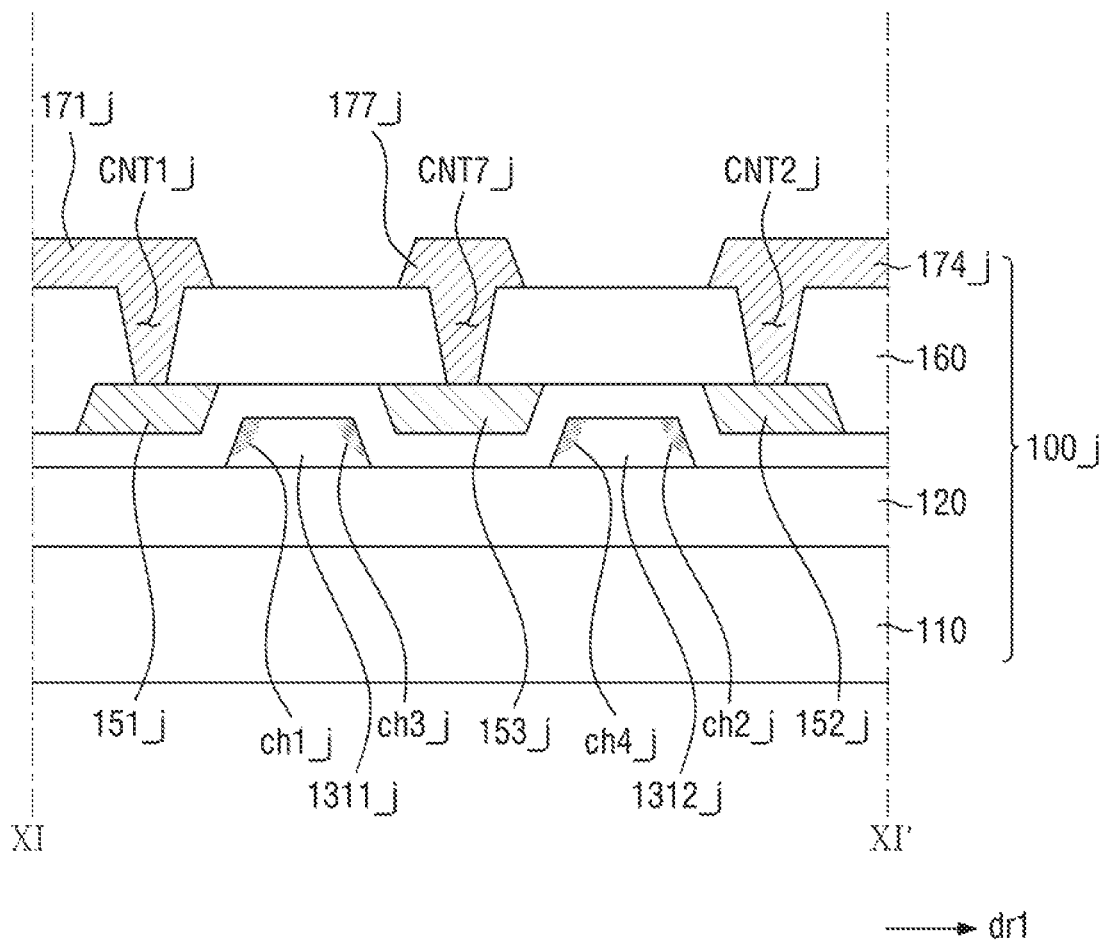
FIG. 40 is a cross-sectional view taken along line XI-XI' of FIG. 39.
Figure 41:
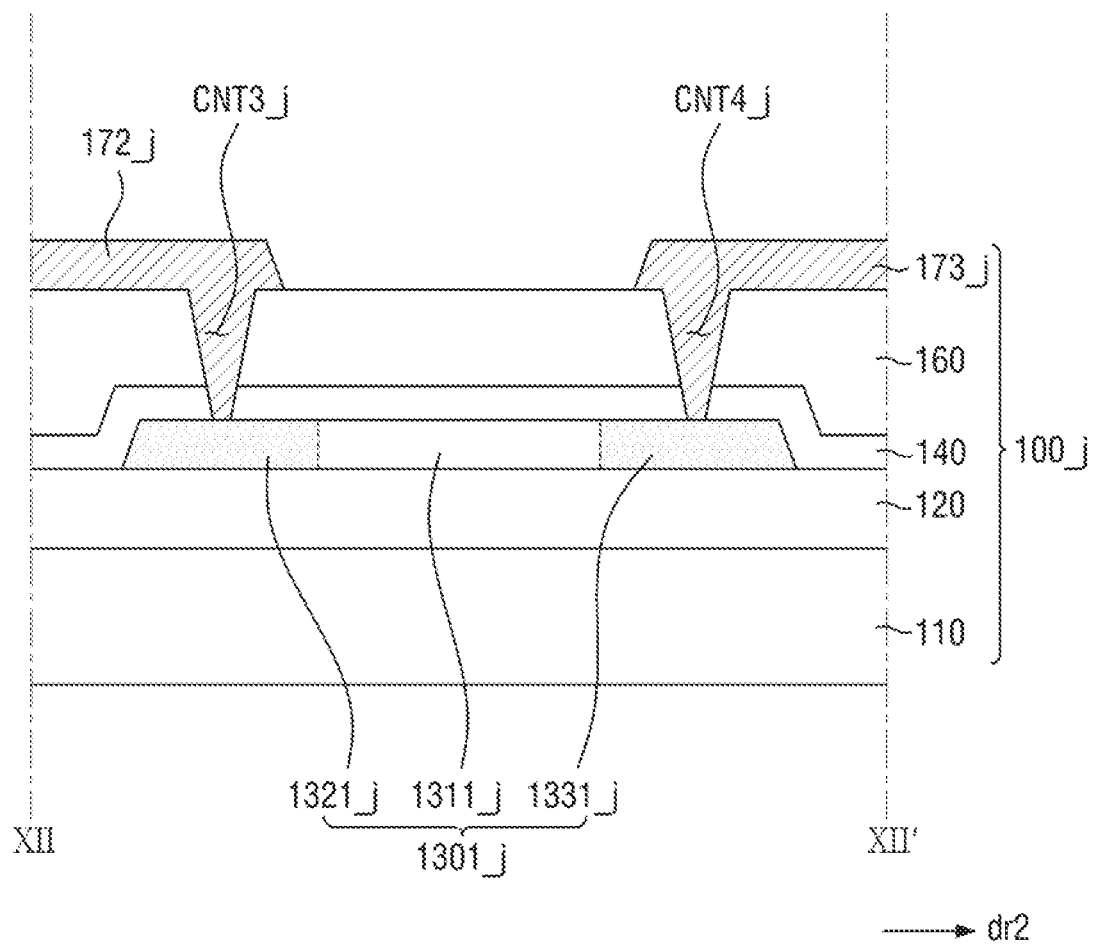
FIG. 41 is a cross-sectional view taken along line XII-XII' of FIG. 39.

FIG. 39 is a layout view of a TFT array substrate according to an exemplary embodiment of the present disclosure, FIG. 40 is a cross-sectional view taken along line XI-XI' of FIG. 39, and FIG. 41 is a cross-sectional view taken along line XII-XII' of FIG. 39.

A TFT array substrate 100_j according to the exemplary embodiment of FIGS. 39 through 41 differs from the TFT array substrate 100_i according to the exemplary embodiment of FIGS. 35 through 37 in that it further includes a third gate electrode 153_j and a third control electrode 177_j. Thus, the TFT array substrate 100_j will be hereinafter described, focusing mainly on the third gate electrode 153_j and the third control electrode 177_j, and descriptions of the other elements of the TFT array substrate 100_j will be omitted or at least simplified. In FIGS. 35 through 37 and 39 through 41, like reference numerals indicate like elements.

Referring to FIGS. 39 through 41, the third gate electrode 153_j is provided, instead of the dummy gate electrode 153_i of FIG. 35. Accordingly, third and fourth channels ch3_j and ch4_j may be formed in first and second channel regions 1311_j and 1312_j, respectively, near the third gate electrode 153_j, when an on-level gate signal is provided to the third gate electrode 153_j. The third gate electrode 153_j may be connected to the third control electrode 177_j via a seventh contact hole CNT7_j.

Figure 42:
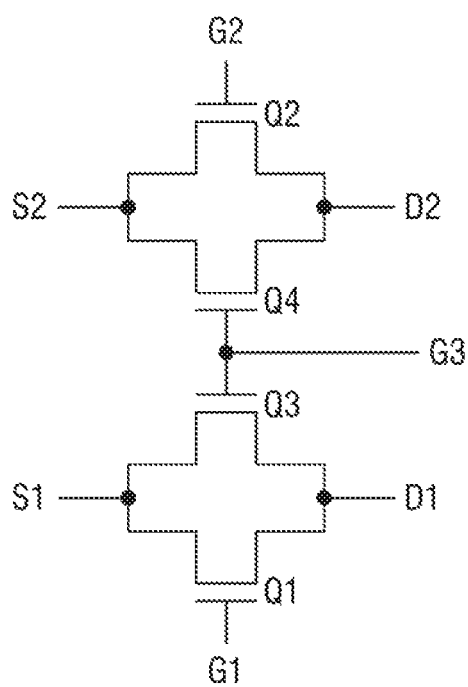
FIG. 42 is an equivalent circuit diagram of a TFT according to the exemplary embodiment of FIGS. 39 through 41.

FIG. 42 is an equivalent circuit diagram of TFT according to the exemplary embodiment of FIGS. 39 through 41.

Referring to FIG. 42, the TFT according to the exemplary embodiment of FIGS. 39 through 41 includes first, second, third, and fourth switching transistors Q1, Q2, Q3, and Q4. The first switching transistor Q1 may be controlled by a first control line G1, the second switching transistor Q2 may be controlled by a second control line G2, and the third and fourth switching transistors Q3 and Q4 may be controlled at the same time by a third control line G3. The first and third switching transistors Q1 and Q3 may share a first input line S1 and a first output line D1. The second and fourth switching transistors Q2 and Q4 may share a second input line S2 and a second output line D2.

Figure 43:
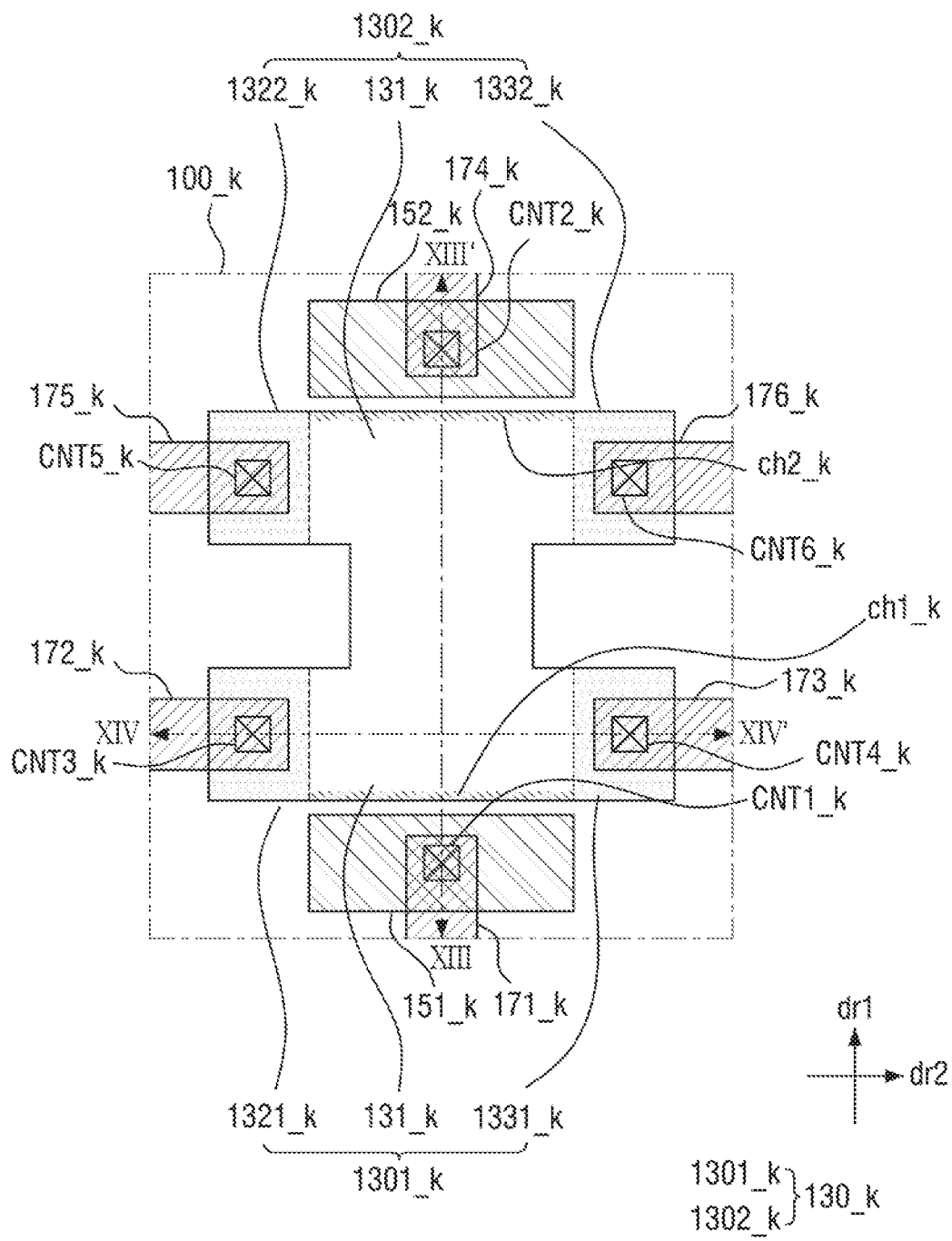
FIG. 43 is a layout view of a TFT array substrate according to an exemplary embodiment of the present disclosure.
Figure 44:
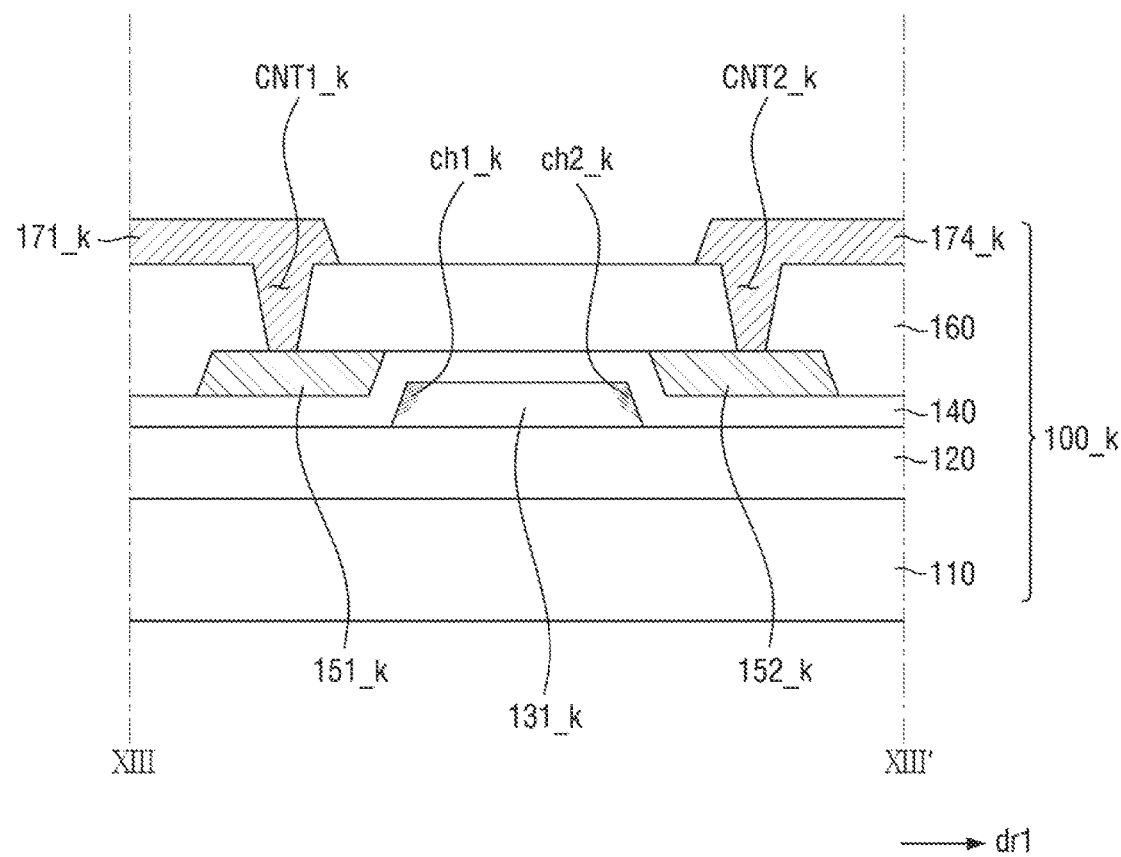
FIG. 44 is a cross-sectional view taken along line XIII-XIII' of FIG. 43.
Figure 45:
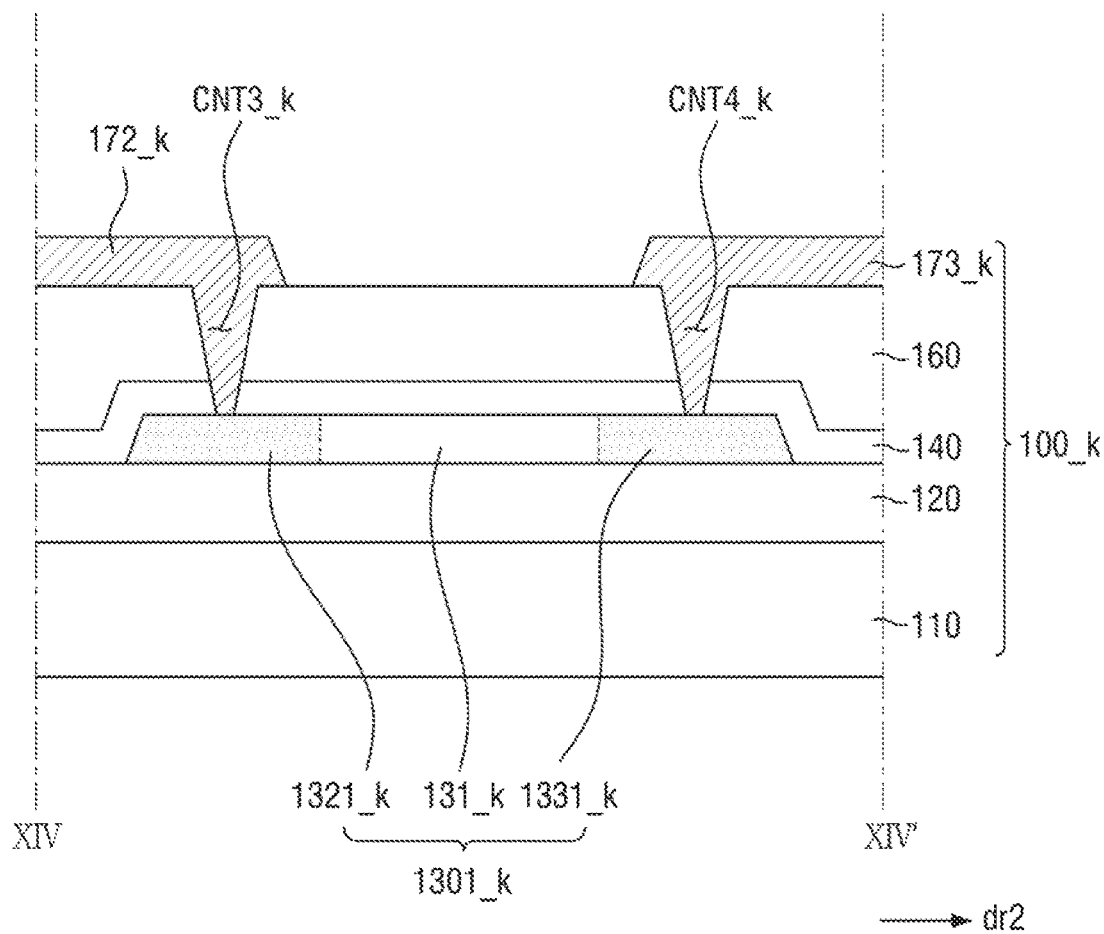
FIG. 45 is a cross-sectional view taken along line XIV-XIV' of FIG. 43.

FIG. 43 is a layout view of a TFT array substrate according to an exemplary embodiment of the present disclosure, FIG. 44 is a cross-sectional view taken along line XIII-XIII' of FIG. 43, and FIG. 45 is a cross-sectional view taken along line XIV-XIV' of FIG. 43.

A TFT array substrate 100_k according to the exemplary embodiment of FIGS. 43 through 45 differs from the TFT array substrate 100_i according to the exemplary embodiment of FIGS. 35 through 37 in that the dummy gate electrode 153_i of FIG. 35 is not provided, and that first and second semiconductor patterns 1301_k and 1302_k share the same channel region, i.e., a channel region 131_k. Thus, the TFT array substrate 100_k will be hereinafter described, focusing mainly on the differences with the TFT array substrate 100_i according to the exemplary embodiment of FIGS. 35 through 37, and descriptions of the other elements of the TFT array substrate 100_k will be omitted or at least simplified. In FIGS. 35 through 37 and 43 through 45, like reference numerals indicate like elements.

Referring to FIGS. 43 through 45, a semiconductor layer 130_k is formed in an "H" shape with four protruding portions, and the four protruding portions include first, second, third, and fourth source/drain regions 1321_k, 1331_k, 1322_k, and 1332_k, respectively. A region of the semiconductor layer 130_k other than the first, second, third, and fourth source/drain regions 1321_k, 1331_k, 1322_k, and 1332_k corresponds to a channel region 131_k.

Even though the first and second semiconductor patterns 1301_k and 1302_k share the channel region 131_k, first and second channels ch1_k and ch2_k can be formed when on-level gate signals are provided to the first and second gate electrodes 151_k and 152_k, if the first and second semiconductor patterns 1301_k and 1302_k are sufficiently spaced apart from each other. The first and second gate electrodes 151_k and 152_k may be provided with different gate signals.

Figure 46:
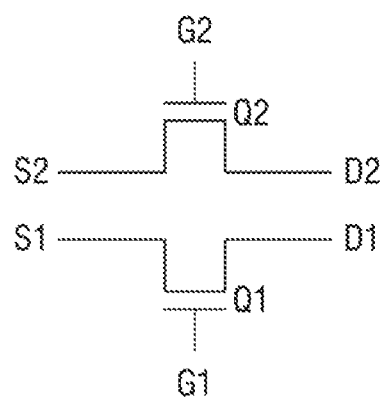
FIG. 46 is an equivalent circuit diagram of a TFT according to the exemplary embodiment of FIGS. 43 through 45.

FIG. 46 is an equivalent circuit diagram of a TFT according to the exemplary embodiment of FIGS. 43 through 45.

Referring to FIG. 46, the TFT according to the exemplary embodiment of FIGS. 43 through 45 may correspond to first and second switching transistors Q1 and Q2. The first switching transistor Q1 may be controlled by a first control line G1, and may have a first input line S1 and a first output line D1. The second switching transistor Q2 may be controlled by a second control line G2, and may have a second input line S2 and a second output line D2. That is, the first and second switching transistors Q1 and Q2 may be completely independent from each other.

Figure 47:
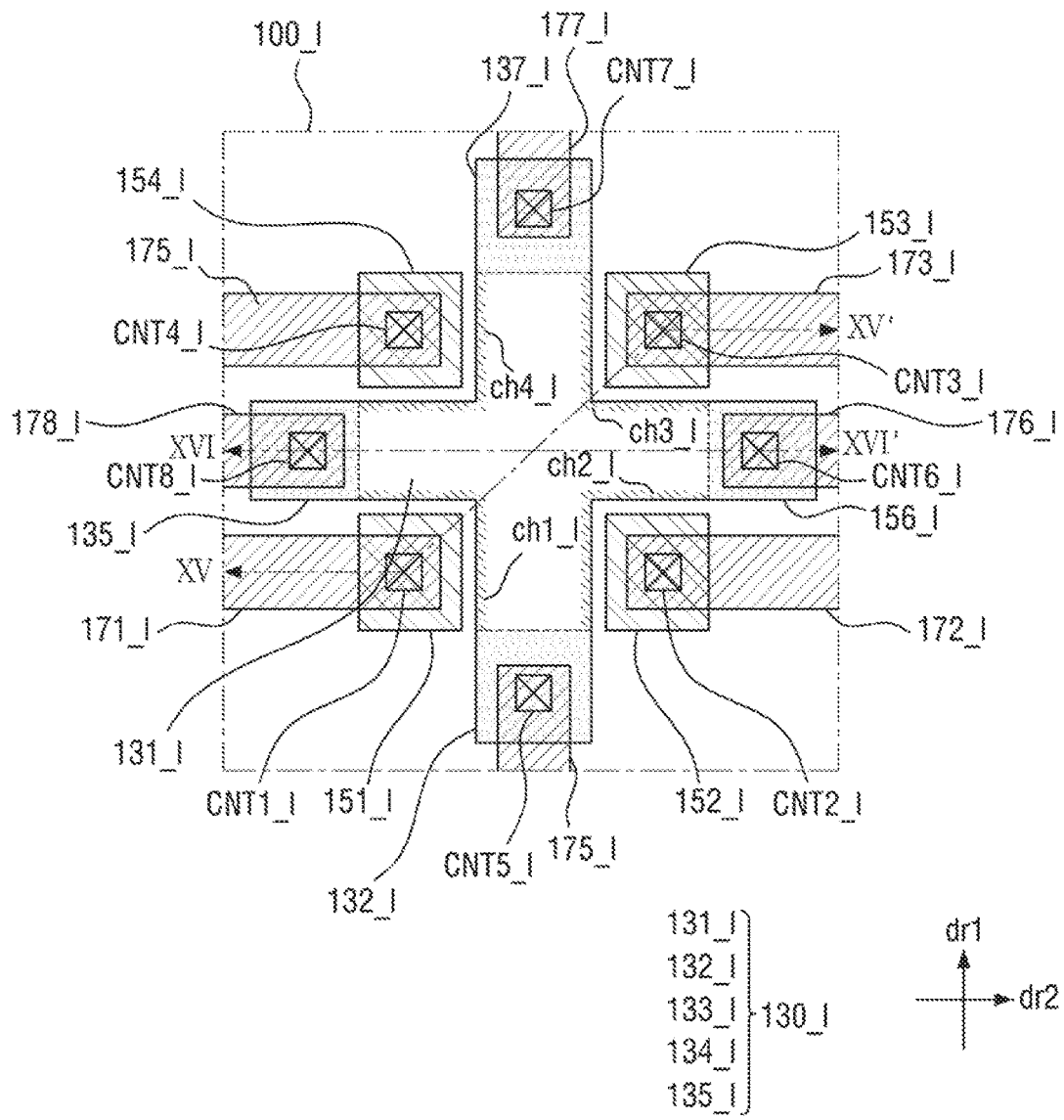
FIG. 47 is a layout view of a TFT array substrate according to an exemplary embodiment of the present disclosure.
Figure 48:
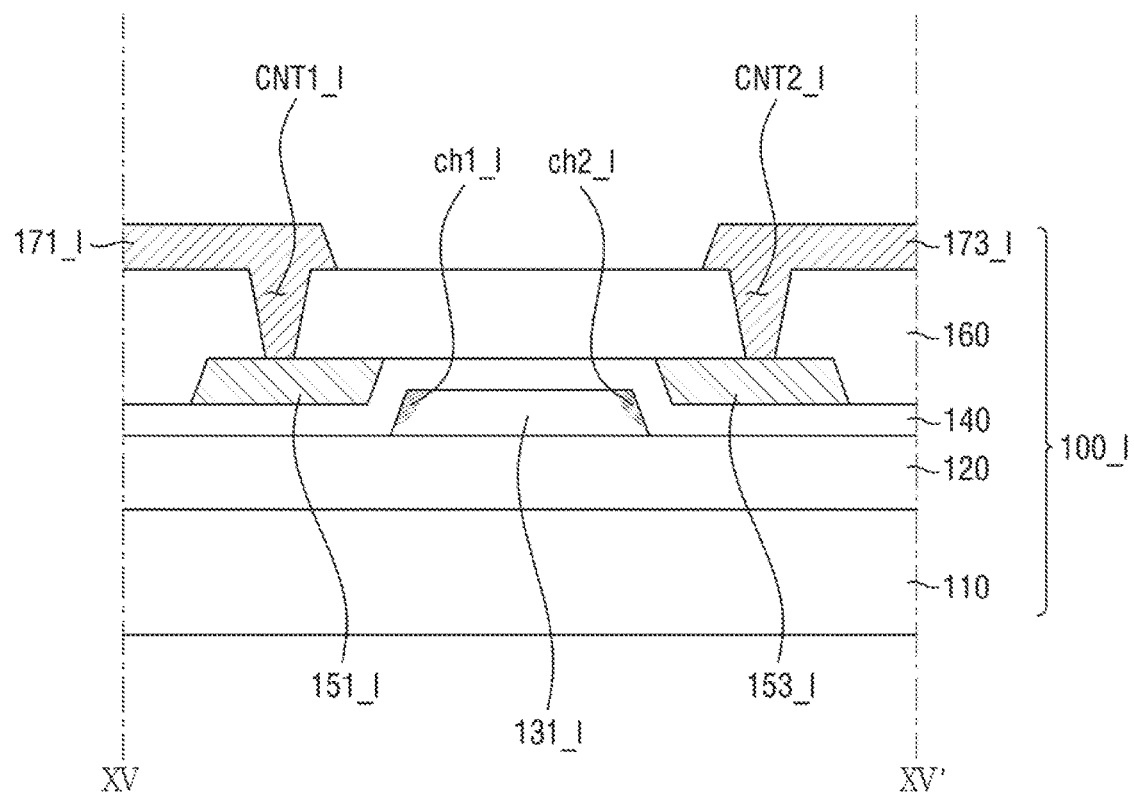
FIG. 48 is a cross-sectional view taken along line XV-XV' of FIG. 47.
Figure 49:
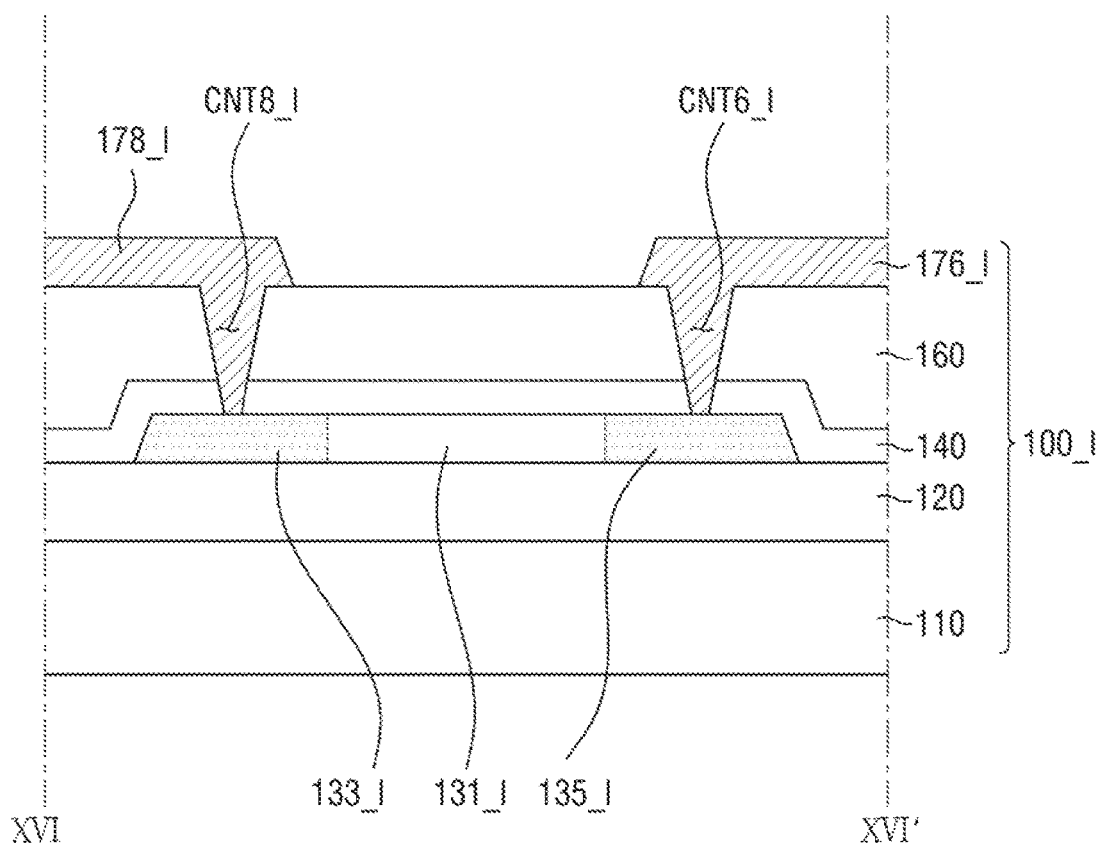
FIG. 49 is a cross-sectional view taken along line XVI-XVI' of FIG. 47.

FIG. 47 is a layout view of a TFT array substrate according to an exemplary embodiment of the present disclosure, FIG. 48 is a cross-sectional view taken along line XV-XV' of FIG. 47, and FIG. 49 is a cross-sectional view taken along line XVI-XVI' of FIG. 47.

A TFT array substrate 100_l according to the exemplary embodiment of FIGS. 47 through 49 differs from the TFT array substrate 100 according to the exemplary embodiment of FIGS. 4 through 6 in that it includes first, second, third, and fourth gate electrodes 151_l, 152_l, 153_l, and 154_l, first, second, third, and fourth control electrodes 171_l, 172_l, 173_l, and 174_l, first, second, third, and fourth source/drain electrodes 175_l, 176_l, 177_l, and 178_l, and first, second, third, and fourth source/drain regions 132_l, 133_l, 134_l, and 135_l. Thus, the TFT array substrate 100_l will be hereinafter described, focusing mainly on the differences with the TFT array substrate 100 according to the exemplary embodiment of FIGS. 4 through 6, and descriptions of the other elements of the TFT array substrate 100_l will be omitted or at least simplified. In FIGS. 4 through 6 and 47 through 49, like reference numerals indicate like elements.

Referring to FIGS. 47 through 49, a semiconductor layer 130 is formed in a cross (+) shape with four protruding portions, and the four protruding portions include the first, second, third, and fourth source/drain regions 132_l, 133_l, 134_l, and 135_l, respectively. A region of the semiconductor layer 130_l other than the first, second, third, and fourth source/drain regions 132_l, 133_l, 134_l, and 135_l corresponds to a channel region 131_l. The first, second, third, and fourth gate electrodes 151_l, 152_l, 153_l, and 154_l may be disposed at four indented portions, respectively, of the semiconductor layer 130. Accordingly, first, second, third, and fourth channels ch1_l, ch2_l, ch3_l, and ch4_l may be formed along the outer sides of the channel region 131_l facing the first, second, third, and fourth gate electrodes 151_l, 152_l, 153_l, and 154_l, respectively, when on-level gate signals are provided to the first, second, third, and fourth gate electrodes 151_l, 152_l, 153_l, and 154_l. The first, second, third, and fourth gate electrodes 151_l, 152_l, 153_l, and 154_l may be provided with different gate signals.

Figure 50:
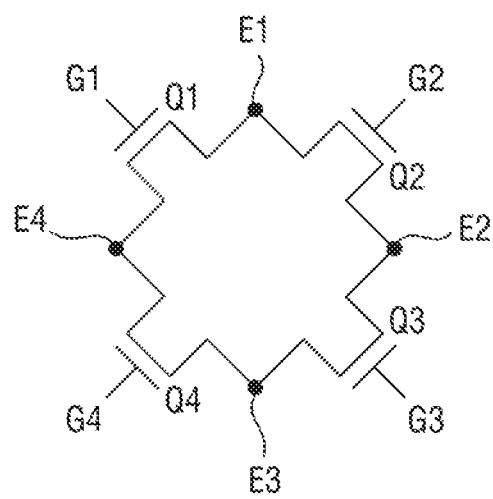
FIG. 50 is an equivalent circuit diagram of a TFT according to the exemplary embodiment of FIGS. 47 through 49.

FIG. 50 is an equivalent circuit diagram of a TFT according to the exemplary embodiment of FIGS. 47 through 49.

Referring to FIG. 50, the TFT according to the exemplary embodiment of FIGS. 47 through 49 may correspond to first, second, third, and fourth switching transistors Q1, Q2, Q3, and Q4. The first, second, third, and fourth switching transistors Q1, Q2, Q3, and Q4 may be controlled by first, second, third, and fourth control lines G1, G2, G3, and G4, respectively. The input electrodes and the output electrodes of the first, second, third, and fourth switching transistors Q1, Q2, Q3, and Q4 may be sequentially engaged via four input/output lines, i.e., first, second, third, and fourth input/output lines E1, E2, E3, and E4. For example, the output terminal of the first switching transistor Q1 and the input terminal of the second switching transistor Q2 may share the first input/output line E1.

Figure 51:
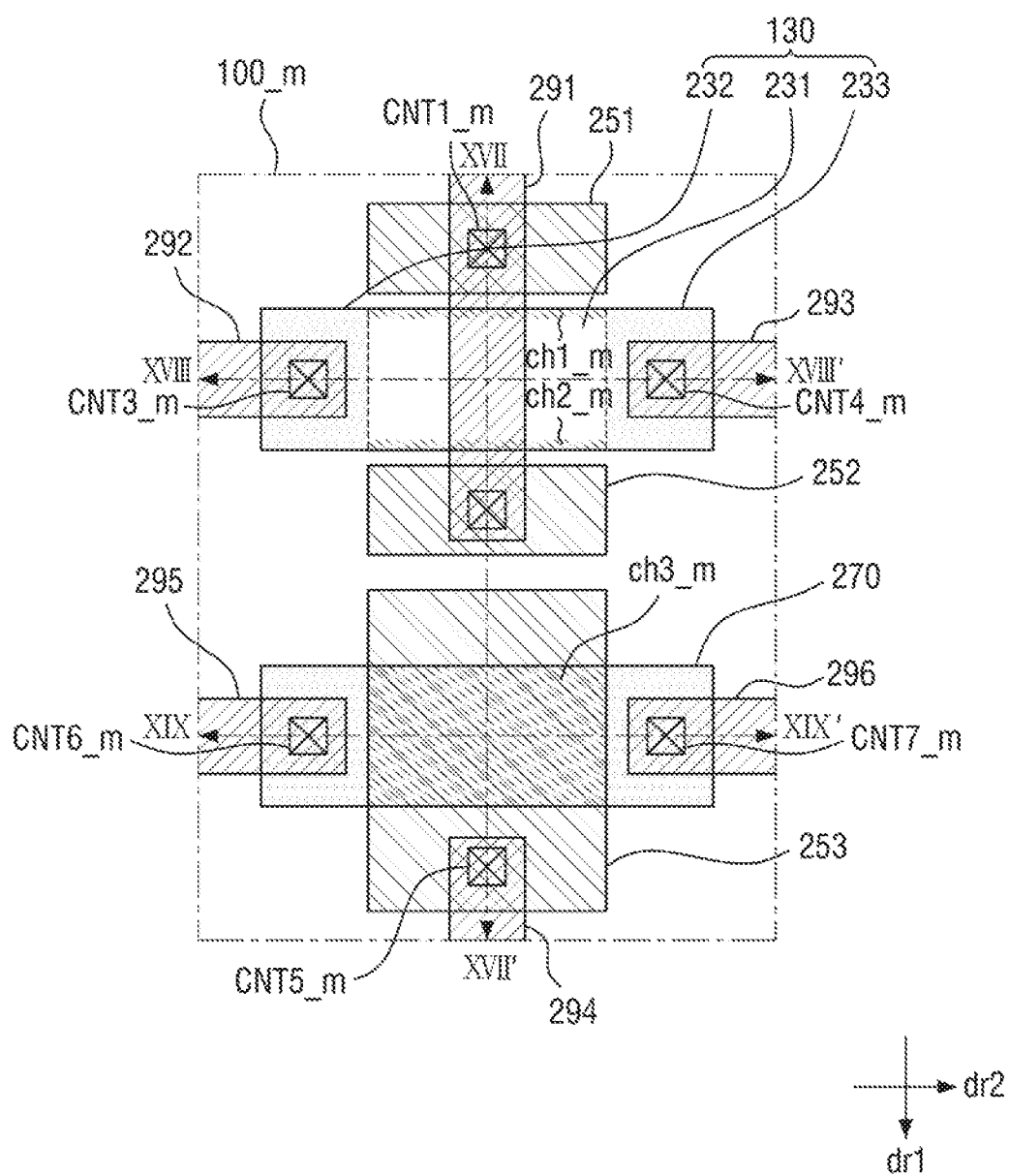
FIG. 51 is a layout view of a TFT array substrate according to an exemplary embodiment of the present disclosure.
Figure 52:
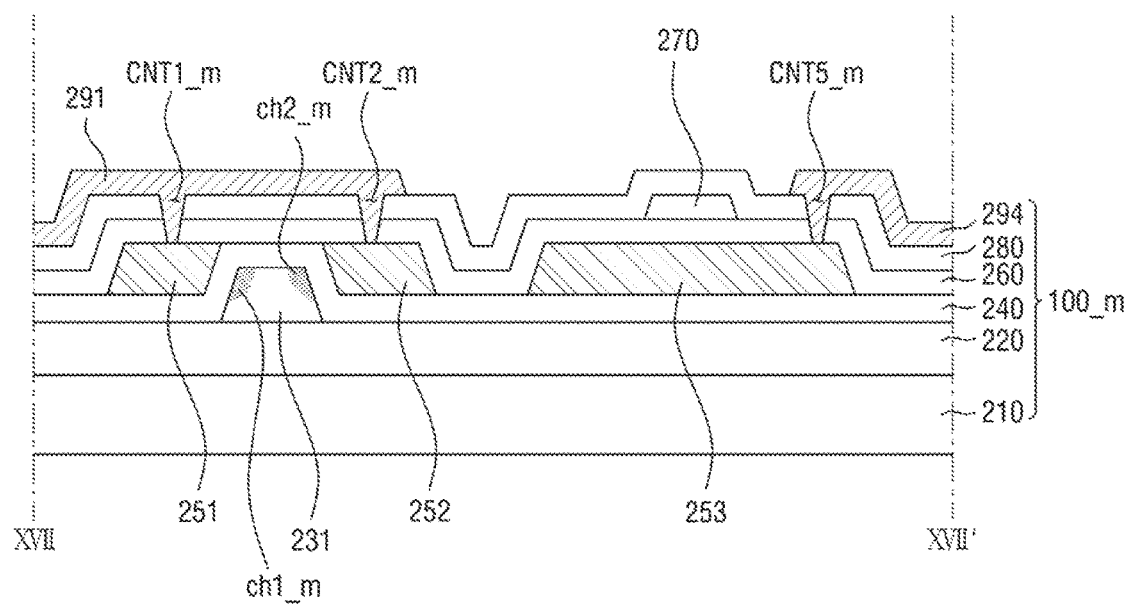
FIG. 52 is a cross-sectional view taken along line XVII-XVII' of FIG. 51.
Figure 53:
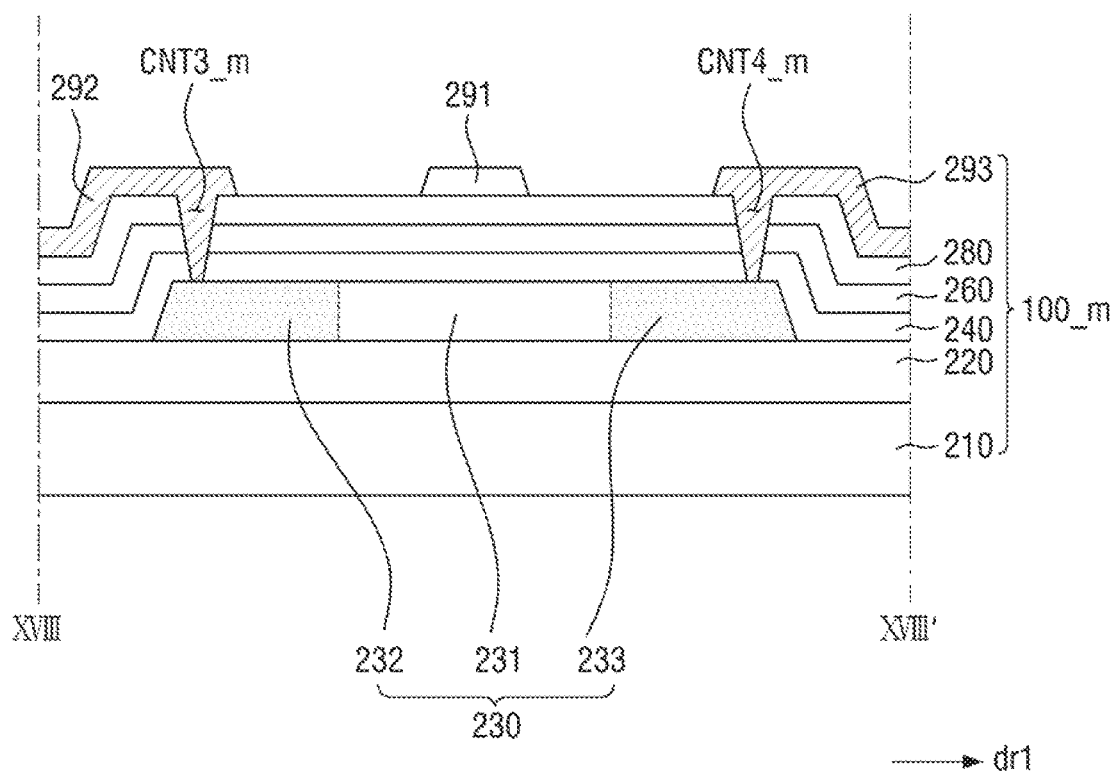
FIG. 53 is a cross-sectional view taken along line XVIII-XVIII' of FIG. 51.
Figure 54:
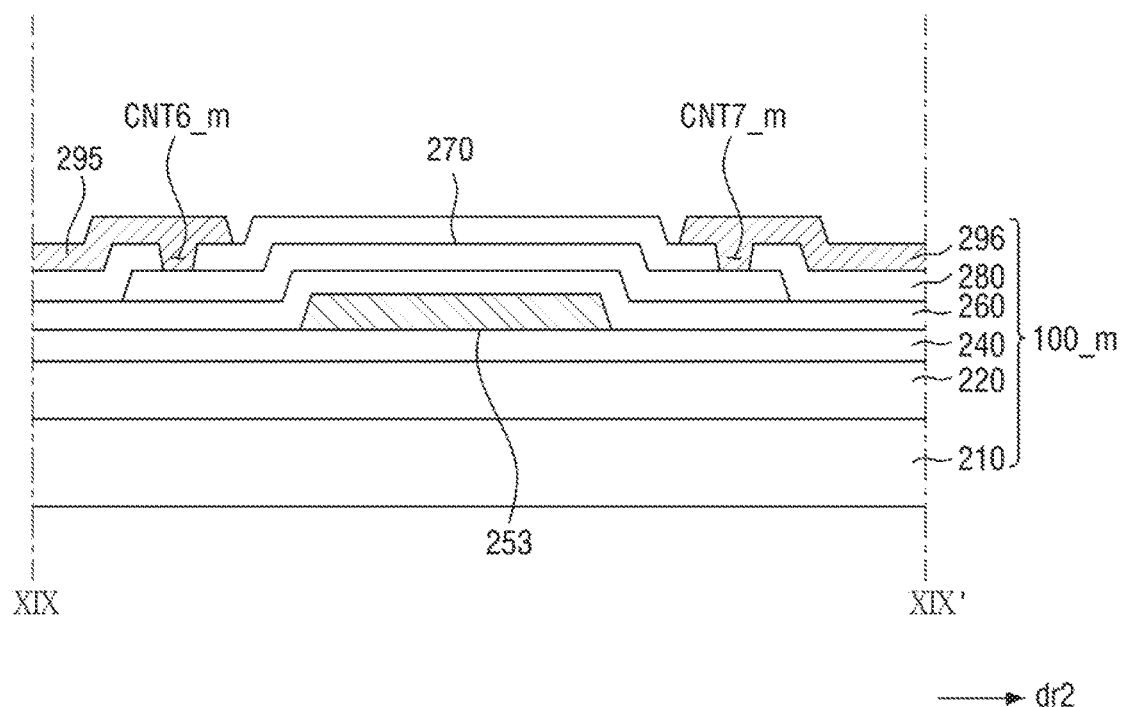
FIG. 54 is a cross-sectional view taken along line XIX-XIX' of FIG. 51.

FIG. 51 is a layout view of a TFT array substrate according to an exemplary embodiment of the present disclosure. Specifically, FIG. 51 shows the layout of part of at least one TFT included in each pixel of the display unit of FIG. 1, FIG. 52 is a cross-sectional view taken along line XVII-XVII' of FIG. 51, FIG. 53 is a cross-sectional view taken along line XVIII-XVIII' of FIG. 51, and FIG. 54 is a cross-sectional view taken along line XIX-XIX' of FIG. 51.

In FIGS. 4 through 6 and 51 through 54, like reference numerals indicate like elements, and thus, detailed descriptions thereof will be omitted.

Referring to FIGS. 51 through 54, a TFT array substrate 100_m includes a base substrate 210, a buffer layer 220, first and second semiconductor layers 230 and 270, first, second, and third insulating layers 240, 260, and 280, first, second, and third gate electrodes 251, 252, and 253, first and second control electrodes 291 and 294, and first, second, third, and fourth source/drain electrodes 292, 293, 295, and 296.

The base substrate 210 is a substrate on which a TFT array is disposed.

The buffer layer 220 is disposed on the base substrate 210.

The first semiconductor layer 230 is disposed on the buffer layer 220. The first semiconductor layer 230 may include at least one of, for example, amorphous silicon, an oxide semiconductor, and LTPS.

The first semiconductor layer 230 includes a first source/drain region 232, a second source/drain region 233, and a first channel region 231 provided between the first and second source/drain regions 232 and 233. The first and second source/drain regions 232 and 233 may be regions doped with a high concentration of n- or p-type impurities.

The first insulating layer 240 is disposed on the first semiconductor layer 230.

At least two gate electrodes are disposed on the first insulating layer 240. In the exemplary embodiment of FIGS. 51 through 54, the first, second, and third gate electrodes 251, 252, and 253 are disposed on the first insulating layer 240.

The first and second gate electrodes 251 and 252 may be disposed on both sides of the first channel region 231. The first gate electrode 251 may induce the formation of a first channel ch1_m in the first channel region 231. That is, the first channel ch1_m may be formed on a sidewall of the first semiconductor layer 230 corresponding to part of the first channel region 231 adjacent to the first gate electrode 251, when an on-level gate signal is provided to the first gate electrode 251. The second gate electrode 252 may induce the formation of a second channel ch2_m in the first channel region 231 adjacent to the second gate electrode 252. The first and second channels ch1_m and ch2_m may be formed along different sidewalls of the first semiconductor layer 230.

The third gate electrode 253 may be separated from the first and second gate electrodes 251 and 252, but the present disclosure is not limited thereto. That is, alternatively, the third gate electrode 253 may be formed in one integral body with the first or second gate electrode 251 or 252. The third gate electrode 253 may be formed on the first insulating layer 240 to have an arbitrary pattern. In the exemplary embodiment of FIGS. 51 through 54, the third gate electrode 253 is formed to have a rectangular shape.

The second insulating layer 260 is disposed on the first, second, and third gate electrodes 251, 252, and 253.

The second semiconductor layer 270 is disposed on the second insulating layer 260.

The second semiconductor layer 270 may include at least one of, for example, amorphous silicon, an oxide semiconductor, and LTPS, and may be formed of a material different from that of the first semiconductor layer 230. That is, two semiconductor layers (i.e., the first and second semiconductor layers 230 and 270) may be formed on a single TFT array substrate (i.e., the TFT array substrate 100_$m$), and may be disposed at different layers using different materials.

The second semiconductor layer 270 is disposed to overlap part of the third gate electrode 253. A third channel ch3_$m$ may be formed in the overlap region between the third gate electrode 253 and the second semiconductor layer 270, when an on-level gate signal is provided to the third gate electrode 253. The gate signal provided to the third gate electrode 253 may be different from the gate signal provided to the first and second gate electrodes 251 and 252.

The third insulating layer 280 is disposed on the second semiconductor layer 270.

The first and second control electrodes 291 and 294 and the first, second, third, and fourth source/drain electrodes 292, 293, 295, and 296 are disposed on the third insulating layer 280. The first and second control electrodes 291 and 294 and the first, second, third, and fourth source/drain electrodes 292, 293, 295, and 296 may be connected to the first, second, and third gate electrodes 251, 252, and 253 or the first and second semiconductor layers 230 and 270 via first, second, third, fourth, fifth, sixth, and seventh contact holes CNT1_$m$, CNT2_$m$, CNT3_$m$, CNT4_$m$, CNT5_$m$, CNT6_$m$, and CNT7_$m$.

Figure 55:
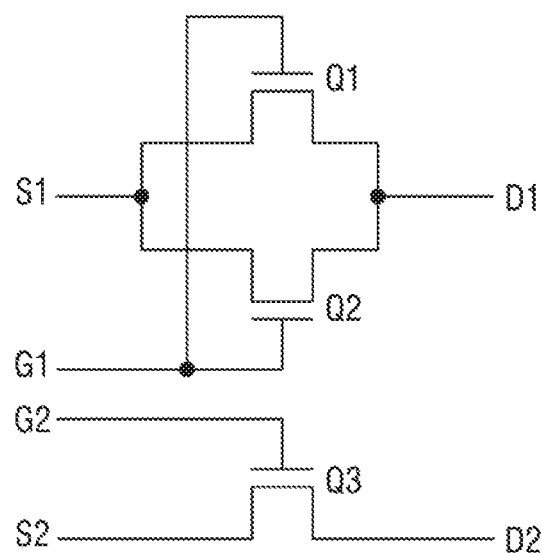
FIG. 55 is an equivalent circuit diagram of a TFT according to the exemplary embodiment of FIGS. 51 through 54.

FIG. 55 is an equivalent circuit diagram of a TFT according to the exemplary embodiment of FIGS. 51 through 54.

Referring to FIG. 55, the TFT according to the exemplary embodiment of FIGS. 51 through 54 may correspond to first, second, and third switching transistors Q1, Q2, and Q3. The first and second switching transistors Q1 and Q2 may both be controlled by a first control line G1 and may share a first input line S1 and a first output line D1.

The third switching transistor Q3 may be controlled by a second control line G2 and may include a second input line S2 and a second output line D2. That is, the third switching transistor Q3 may be driven independently of the first and second switching transistors Q2 and Q3.

Figure 56:
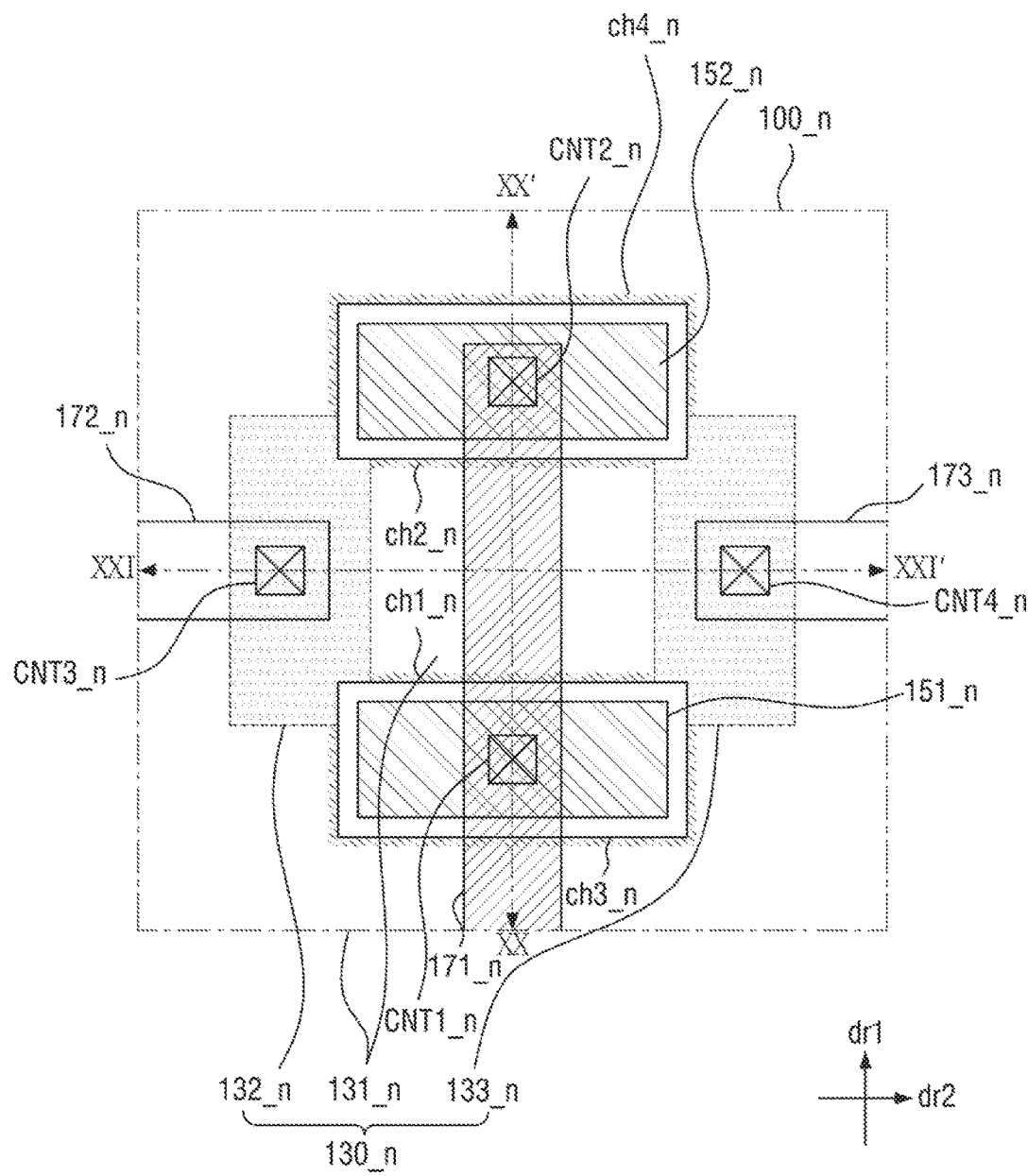
FIG. 56 is a layout view of a TFT array substrate according to an exemplary embodiment of the present disclosure.
Figure 57:
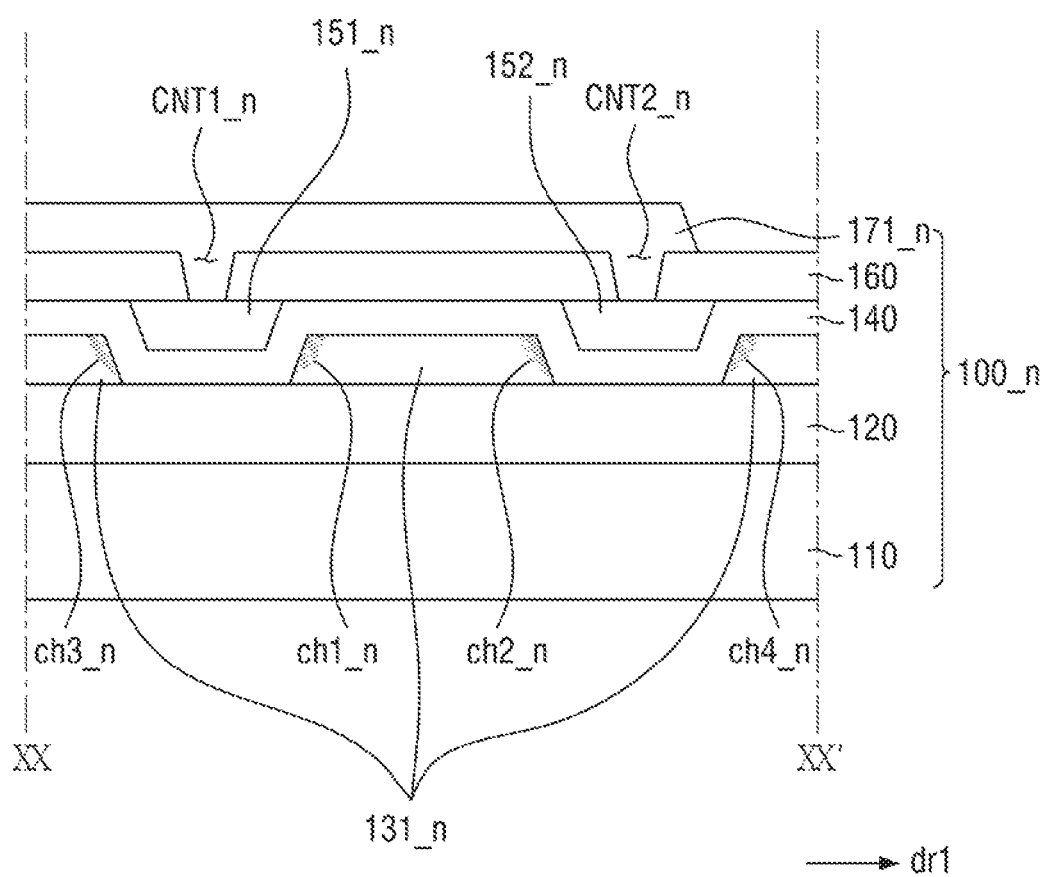
FIG. 57 is a cross-sectional view taken along line XX-XX' of FIG. 51.

FIG. 56 is a layout view of a TFT array substrate according to an exemplary embodiment of the present disclosure. Specifically, FIG. 56 shows the layout of part of at least one TFT included in each pixel of the display unit of FIG. 1. FIG. 57 is a cross-sectional view taken along line XX-XX' of FIG. 56 and FIG. 58 is a cross-sectional view taken along line XXI-XXI' of FIG. 56.

In FIGS. 4 through 6 and 56 through 58, like reference numerals indicate like elements, and thus, detailed descriptions thereof will be omitted.

Referring to FIGS. 56 through 58, a TFT array substrate 100_$n$ includes a base substrate 110, a buffer layer 120, a semiconductor layer 130_$n$, a first insulating layer 140, a first gate electrode 151_$n$, a second gate electrode 152_$n$, a second insulating layer 160, a control electrode 171_$n$, a first source/drain electrode 172_$n$, and a second source/drain electrode 173_$n$.

The base substrate 110 is a substrate on which a TFT array is disposed.

The buffer layer 120 is disposed on the base substrate 110.

The semiconductor layer 130_$n$ is disposed on the buffer layer 120. The semiconductor layer 130_$n$ may be formed on the entire surface of the base substrate 110 except for regions where the first and second gate electrodes 151_$n$ and 152_$n$ are disposed. The semiconductor layer 130_$n$ may include first and second source/drain regions 132_$n$ and 133_$n$, which are doped with a high concentration of n- or p-type impurities, and a first channel region 131_$n$, which is provided between the first and second source/drain regions 132_$n$ and 133_$n$.

The first insulating layer 140 is disposed on the semiconductor layer 130_$n$.

The first and second gate electrodes 151_$n$ and 152_$n$ are disposed on the first insulating layer 140. The first and second gate electrodes 151_$n$ and 152_$n$ are disposed to correspond with regions where the semiconductor layer 130_$n$ is not provided. In the exemplary embodiment of FIGS. 56 through 58, unlike in the previous exemplary embodiments, the first and second gate electrodes 151_$n$ and 152_$n$ may not be patterned. Specifically, the first and second gate electrodes 151_$n$ and 152_$n$ may be formed by depositing a gate material layer on the semiconductor layer 130_$n$, which is patterned, with the first insulating layer 140 interposed therebetween, and polishing the gate material layer through CMP until the first insulating layer 140 is exposed. As a result, the first and second gate electrodes 151_$n$ and 152_$n$ may be formed in a reverse pattern of the semiconductor layer 130_$n$. Since patterning is omitted from the fabrication of the first and second gate electrodes 151_$n$ and 152_$n$, the semiconductor layer 130_$n$ may be doped without using the gate insulating layer.

The first and second gate electrodes 151_$n$ and 152_$n$ may induce the formation of first, second, third, and fourth channels ch1_$n$, ch2_$n$, ch3_$n$, and ch4_$n$ along the sidewalls of the first channel region 131_$n$.

However, the effects of the present disclosure are not restricted to the one set forth herein. The above and other effects of the present disclosure will become more apparent to one of ordinary skill in the art to which the present disclosure pertains by referencing the claims.

Although illustrative embodiments of the present disclosure have been described in detail, it should be understood that the present disclosure is not intended to be limited to the specific exemplary embodiments disclosed. Based on the foregoing disclosure, those skilled in the art will be able to make various changes, substitutions and alterations without departing from the spirit and scope of the present disclosure as defined by the appended claims.

What is claimed is:

1. A thin-film transistor (TFT) array substrate, comprising:
    a base substrate;
    a semiconductor layer disposed on the base substrate;
    an insulating layer disposed on the semiconductor layer; and
    a gate electrode disposed on the insulating layer,
    wherein a top surface of a portion of the insulating layer overlapping the semiconductor layer in a plan view of the base substrate and a top surface of the gate electrode are placed on a same level,
    the insulating layer covers the semiconductor layer, and
    a side surface of the gate electrode faces a side surface of the semiconductor layer.

2. The TFT array substrate of claim 1, wherein in the plan view of the base substrate, the gate electrode and the semiconductor layer are disposed not to overlap each other.

3. The TFT array substrate of claim 1, wherein in the plan view of the base substrate, a thickness of a portion of the insulating layer overlapped by the gate electrode is greater than a thickness of the portion of the insulating layer overlapping the semiconductor layer.

4. The TFT array substrate of claim 1, wherein in the plan view of the base substrate, a top surface of a portion of the insulating layer overlapped by the gate electrode is rougher than the top surface of the portion of the insulating layer overlapping the semiconductor layer.

5. The TFT array substrate of claim 1, wherein the gate electrode includes a first gate electrode disposed adjacent to one sidewall of the semiconductor layer and a second gate electrode disposed adjacent to the other sidewall of the semiconductor layer.

6. The TFT array substrate of claim 1, wherein the top surface of the portion of the insulating layer overlapping the semiconductor layer and the top surface of the gate electrode have a same roughness.

7. The TFT array substrate of claim 1, wherein a height from a top surface of the base substrate to a highest top surface of the insulating layer is the same as a height from the top surface of the base substrate to the top surface of the portion of the insulating layer overlapping the semiconductor layer.

8. The TFT array substrate of claim 1, wherein
the gate electrode includes first and second sub-gate electrodes spaced apart from each other,
the first sub-gate electrode is disposed adjacent to one side of the semiconductor layer, and
the second sub-gate electrode is disposed adjacent to the other side of the semiconductor layer.

9. The TFT array substrate of claim 8, further comprising:
a source electrode placed in contact with the semiconductor layer via a first contact hole, which is formed to penetrate the insulating layer; and
a drain electrode placed in contact with the semiconductor layer via a second contact hole, which is formed to penetrate the insulating layer,
wherein electrical connections between the source and drain electrodes are controlled by both the first and second sub-gate electrodes.

10. The TFT array substrate of claim 1, further comprising:
a buffer layer disposed between the base substrate and the semiconductor layer,
wherein in the plan view of the base substrate, a thickness of a portion of the buffer layer overlapped by the semiconductor layer is greater than a thickness of a portion of the buffer layer not overlapped by the semiconductor layer.

11. The TFT array substrate of claim 10, wherein the buffer layer and the semiconductor layer have a same pattern.

12. The TFT array substrate of claim 10, wherein a top surface of a portion of the insulating layer not overlapped by the semiconductor layer and a bottom surface of the semiconductor layer are placed on a same level.

13. The TFT array substrate of claim 1, further comprising:
a source electrode placed in contact with the semiconductor layer via a first contact hole, which is formed to penetrate the insulating layer; and
a drain electrode placed in contact with the semiconductor layer via a second contact hole, which is formed to penetrate the insulating layer,
wherein the source electrode, the drain electrode, the semiconductor layer, and the gate electrode form a TFT.

14. The TFT array substrate of claim 13, wherein
the semiconductor layer includes a source region, a drain region, and a channel region,
the source region is a doped region connected to the source electrode,
the drain region is a doped region connected to the drain electrode, and
the channel region is a region other than the source region and the drain region.

15. The TFT array substrate of claim 13, wherein channels of the TFT are formed along sidewalls of the semiconductor layer that are adjacent to the gate electrode.

16. A display device, comprising:
a substrate; and
a plurality of pixels arranged in an array on the substrate and including at least one TFT,
wherein the TFT includes a semiconductor layer disposed on the substrate, an insulating layer disposed on the semiconductor layer, and a gate electrode disposed on the insulating layer,
a top surface of a portion of the insulating layer overlapping the semiconductor layer and a top surface of the gate electrode are placed on a same level,
the insulating layer covers the semiconductor layer, and
a side surface of the gate electrode faces a side surface of the semiconductor layer.

17. A method of manufacturing a TFT array substrate, comprising:
forming a semiconductor layer on a base substrate;
forming an insulating layer on the semiconductor layer;
forming a gate electrode on the insulating layer; and
forming a source electrode and a drain electrode on the insulating layer,
wherein the forming of the gate electrode comprises depositing a gate electrode material layer on the insulating layer, forming a gate electrode pattern layer by patterning the gate electrode material layer, and polishing the gate electrode pattern layer through chemical mechanical polishing (CMP),
the insulating layer covers the semiconductor layer, and
a side surface of the gate electrode faces a side surface of the semiconductor layer.

18. The method of claim 17, wherein the polishing of the gate electrode pattern layer comprises polishing the gate electrode pattern layer until a top surface of a portion of the insulating layer overlapping the semiconductor layer is exposed.

19. The method of claim 17, wherein the forming of the gate electrode comprises, between the forming of the gate electrode pattern layer and the polishing of the gate electrode pattern layer, doping the semiconductor layer with impurities.

20. The method of claim 17, further comprising:
forming a buffer layer having a pattern the same as that of the semiconductor layer on the base substrate before the forming of the semiconductor layer.

21. A thin-film transistor (TFT) array substrate, comprising:
a base substrate;
a semiconductor layer disposed on the base substrate;
an insulating layer disposed on the semiconductor layer; and
a gate electrode disposed on the insulating layer, wherein the gate electrode and the semiconductor layer are disposed not to overlap each other in a plan view of the base substrate, and the gate electrode is disposed adjacent to the semiconductor layer and overlaps the semiconductor layer in a direction parallel to a top surface of the base substrate.

22. The TFT array substrate of claim 21, wherein a top surface of a portion of the insulating layer overlapping the semiconductor layer in the plan view of the base substrate and a top surface of the gate electrode are placed on the same level.

23. The TFT array substrate of claim 21, wherein a bottom surface of the gate electrode and a bottom surface of the semiconductor layer are placed on the same level.

* * * * *